(12) United States Patent
Arditti Ilitzky

(10) Patent No.: US 10,333,764 B1
(45) Date of Patent: Jun. 25, 2019

(54) ENVELOPE DETECTOR-BASED FEEDBACK FOR RADIO FREQUENCY (RF) TRANSMITTERS

(71) Applicant: Intel Corporation, Santa Clara, CA (US)

(72) Inventor: David Arditti Ilitzky, Jalisco (MX)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/018,731

(22) Filed: Jun. 26, 2018

(51) Int. Cl.
| | |
|---|---|
| H04L 27/36 | (2006.01) |
| H04B 10/54 | (2013.01) |
| H04B 10/556 | (2013.01) |
| H03C 3/40 | (2006.01) |

(52) U.S. Cl.
CPC .......... *H04L 27/364* (2013.01); *H03C 3/403* (2013.01); *H04B 10/541* (2013.01); *H04B 10/5561* (2013.01); *H03C 2200/0058* (2013.01)

(58) Field of Classification Search
CPC . H04L 27/364; H04B 10/5561; H04B 10/541; H03C 2200/0058; H03C 3/403
See application file for complete search history.

(56) References Cited

U.S. PATENT DOCUMENTS

| | | | | |
|---|---|---|---|---|
| 9,831,899 B1 * | 11/2017 | Boghrat | ............... | H04B 1/0475 |
| 2005/0075815 A1 * | 4/2005 | Webster | ................. | H03C 3/406 |
| | | | | 702/106 |
| 2005/0116775 A1 * | 6/2005 | McBeath | ............... | H03F 1/3241 |
| | | | | 330/149 |
| 2008/0144539 A1 * | 6/2008 | Sperlich | ................ | H04L 5/1469 |
| | | | | 370/278 |
| 2009/0256630 A1 * | 10/2009 | Brobston | ............... | H03F 1/3247 |
| | | | | 330/2 |
| 2014/0118066 A1 * | 5/2014 | Lee | ........................... | H03F 3/24 |
| | | | | 330/149 |

OTHER PUBLICATIONS

X. Cheng and Z. Luo, "Compensation of Transmitter I/Q Imbalance in Millimeter-Wave SCFDE Systems," in IEEE Transactions on Vehicular Technology, vol. 66, No. 5, pp. 4472-4476, May 2017.

(Continued)

*Primary Examiner* — Jean B Corrielus
(74) *Attorney, Agent, or Firm* — Schiff Hardin LLP

(57) ABSTRACT

A transmitter is provided to address transmitter non-idealities. The transmitter uses a series of envelope detectors to detect imbalances between an I branch and a Q branch of an I/Q modulator that is implemented as part of the transmitter's front end, and these detected imbalances may be compensated by pre-distorting digital baseband signals fed to the I branch and the Q branch. The transmitter may also use a series of envelope detectors to detect nonlinearities in one or more of the transmitter's amplification stages, and these detected nonlinearities may be compensated by modifying the baseband signals via a digital linearization pre-compensator. The transmitter may also support both implementations in either a time-switched or simultaneous manner, allowing for I/Q imbalances and nonlinearities to be addressed using a single transmitter design.

22 Claims, 19 Drawing Sheets

(56) References Cited

OTHER PUBLICATIONS

Y. Yoshida, K. Hayashi, H. Sakai and W. Bocquet, "Analysis and Compensation of Transmitter IQ Imbalances in OFDMA and SC-FDMA Systems," in IEEE Transactions on Signal Processing, vol. 57, No. 8, pp. 3119-3129, Aug. 2009.
Changming Zhang, et-al, "Three-Stage Treatment of TX/RX IQ Imbalance and Channel with CFO for SC-FDE Systems", in IEEE Communications Letters, vol. 18, No. 2, Feb. 2014.
Tim Schenk, "RF Imperfection on High-rate Wireless Systems", Ed 1, Springer, 2008, ISBN 978-1-4020-6902-4, Chapter 5 and Chapter 6.
A. Nassery and S. Ozev, "An analytical technique for characterization of transceiver IQ imbalances in the loop-back mode," 2012 Design, Automation & Test in Europe Conference & Exhibition (DATE), Dresden, 2012, pp. 1084-1089.
C. H. Liu, "Joint Tx and Rx IQ Imbalance Compensation of OFDM Transceiver in Mesh Network," IEEE GLOBECOM 2008—2008 IEEE Global Telecommunications Conference, New Orleans, LO, 2008, pp. 1-5.
A. Nassery, S. Byregowda, S. Ozev, M. Verhelst and M. Slamani, "Built-in-Self Test of transmitter I/Q mismatch using self-mixing envelope detector," 2012 IEEE 30th VLSI Test Symposium (VTS), Hyatt Maui, HI, 2012, pp. 56-61.
S. Sen, S. K. Devarakond and A. Chatterjee, "DSP assisted low cost IQ mismatch measurement and compensation using built in power detector," 2010 IEEE MTT-S International Microwave Symposium, Anaheim, CA, 2010, pp. 336-339.
C. H. Peng, P. Liang, C. Chien, B. Narasimhan and H. C. Hwang, "Joint TX/RX IQ Mismatch Compensation Based on a Low-IF Internal Feedback Architecture," 2012 IEEE Vehicular Technology Conference (VTC Fall), Quebec City, QC, 2012, pp. 1-5.
D. Cox, "Linear amplification by sampling techniques: A new application for delta coders", IEEE Transactions on Communications, vol. 23, No. 8, pp. 793-798, 1975.
J. L. Dawson and T. H. Lee, "Cartesian feedback for RF power amplifier linearization," Proceedings of the 2004 American Control Conference, Boston, MA, USA, 2004, pp. 361-366 vol. 1.
Nicolas Delaunay. Linearization of a Transmitter using an IC Digital/Analog Cartesian Feedback in CMOS 65nm for Advanced Communication Standards. Electronics. Université Sciences et Technologies—Bordeaux I, 2012. English.
Small Bachir, Claude Duvanaud. "New Identification Procedure for Continuoustime Radio Frequency Power Amplifier Model". Journal of Circuits, Systems, and Computers, World Scientific Publishing, 2010, 19 (06), pp. 1259-1274.
K. Waheed and S. N. Ba, "Adaptive digital linearization of a DRP based edge transmitter for cellular handsets," 2007 50th Midwest Symposium on Circuits and Systems, Montreal, Que., 2007, pp. 706-709.
Raviv Raich. Nonlinear System Identification and Analysis with Applications to Power Amplifier Modeling and Power Amplifier Predistortion. School of Electrical and Computer Engineering. Georgia Institute of Technology. 2004.
Mahmoud Alizadeh, Daniel Rönnow, "A two-tone test for characterizing nonlinear dynamic effects of radio frequency amplifiers in different amplitude regions", Measurement, vol. 89, 2016, pp. 273-279.
A. Halder, S. Bhattacharya and A. Chatterjee, "System-Level Specification Testing of Wireless Transceivers," in IEEE Transactions on Very Large Scale Integration (VLSI) Systems, vol. 16, No. 3, pp. 263-276, Mar. 2008.
Mohammadi A., Ghannouchi F.M. (2012) RF Power Amplifier and Linearization Techniques. In: RF Transceiver Design for MIMO Wireless Communications. Lecture Notes in Electrical Engineering, vol. 145. Springer, Berlin, Heidelberg—Chapter 5.
J. J. Dabrowski and R. M. Ramzan, "Built-in Loopback Test for IC RF Transceivers," in IEEE, Transactions on Very Large Scale Integration (VLSI) Systems, vol. 18, No. 6, pp. 933-946, Jun. 2010.
J. So, S. Choi, S. H. Ahn, E. R. Jeong and Y. H. Lee, "Digital predistortion based on envelope feedback," 2012 IEEE International Conference on Acoustics, Speech and Signal Processing (ICASSP), Kyoto, 2012, pp. 3169-3172.
Ernst Aschbacher. Digital Pre-distortion of Microwave Power Amplifiers. Mar. 2004.
H. Paaso and A. Mammela, "Comparison of direct learning and indirect learning predistortion architectures," 2008 IEEE International Symposium on Wireless Communication Systems, Reykjavik, 2008, pp. 309-313.
J. J. de Witt and G. J. van Rooyen, "Novel IQ imbalance and offset compensation techniques for quadrature mixing radio transceivers," in Southern African Telecom-communication Networks Applications Conference (SATNAC), 2006.
Roland Minihold, Rainer Waner, "Measuring the Nonlinearities of RF-Amplifiers using Signal Generators and a Spectrum Analyzer", Rohde & Schwarz, Application Note 1MA71-2e, Mar. 2006.

\* cited by examiner

ENVELOPE DETECTOR-BASED FEEDBACK FOR RADIO FREQUENCY (RF) TRANSMITTERS

TECHNICAL FIELD

Aspects described herein generally relate to RF transmitters and, more particularly, to transmitter designs implementing closed-loop envelope feedback to identify non-idealities, compensate for non-idealities, and generate a baseband signal reference of the transmitter output.

BACKGROUND

Virtually all RF transmitters with quadrature topologies (e.g. not polar, EER, etc.) contain various non-idealities. These non-idealities may include imbalances between the quadrature branches (e.g., I/Q (or, alternatively, IQ) imbalances between the I and Q branches of the I/Q modulator). These I/Q imbalances mainly depend on the transmitter circuit design and manufacturing process variations, and may distort transmitted signals and degrade the quality of the transmitter. Moreover, once the device implementing the transmitter is in the "field," (i.e., during ordinary use), these imbalances will further vary over time. Thus, these I/Q imbalance variations depend in the short-term on the supply voltage variations, silicon temperature variations, operating frequency, etc., and in the long term on silicon aging. Therefore, compensating for I/Q imbalances is an arduous task.

Non-idealities may also include non-linear characteristics of one or more amplifier stages implemented as part of the transmitter design. For instance, it is common for transmit analog/RF front-ends (TX-AFE) with low power consumption constraints to present nonlinear behavior, or be designed to operate in nonlinear regions (e.g. to optimize power efficiency). The nonlinear behavior can become even more complex when RF memory effects come into play (generating so-called AM-PM, PM-PM and PM-AM type distortions). And, like the I/Q imbalances, TX-AFE nonlinearities are also subject to variations throughout time (e.g. depending in the short-term on temperature, supply voltage, and operating frequency variations, and on the long-term on silicon aging). Therefore, compensating for such nonlinearities is likewise a complex task.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

Figure 1:
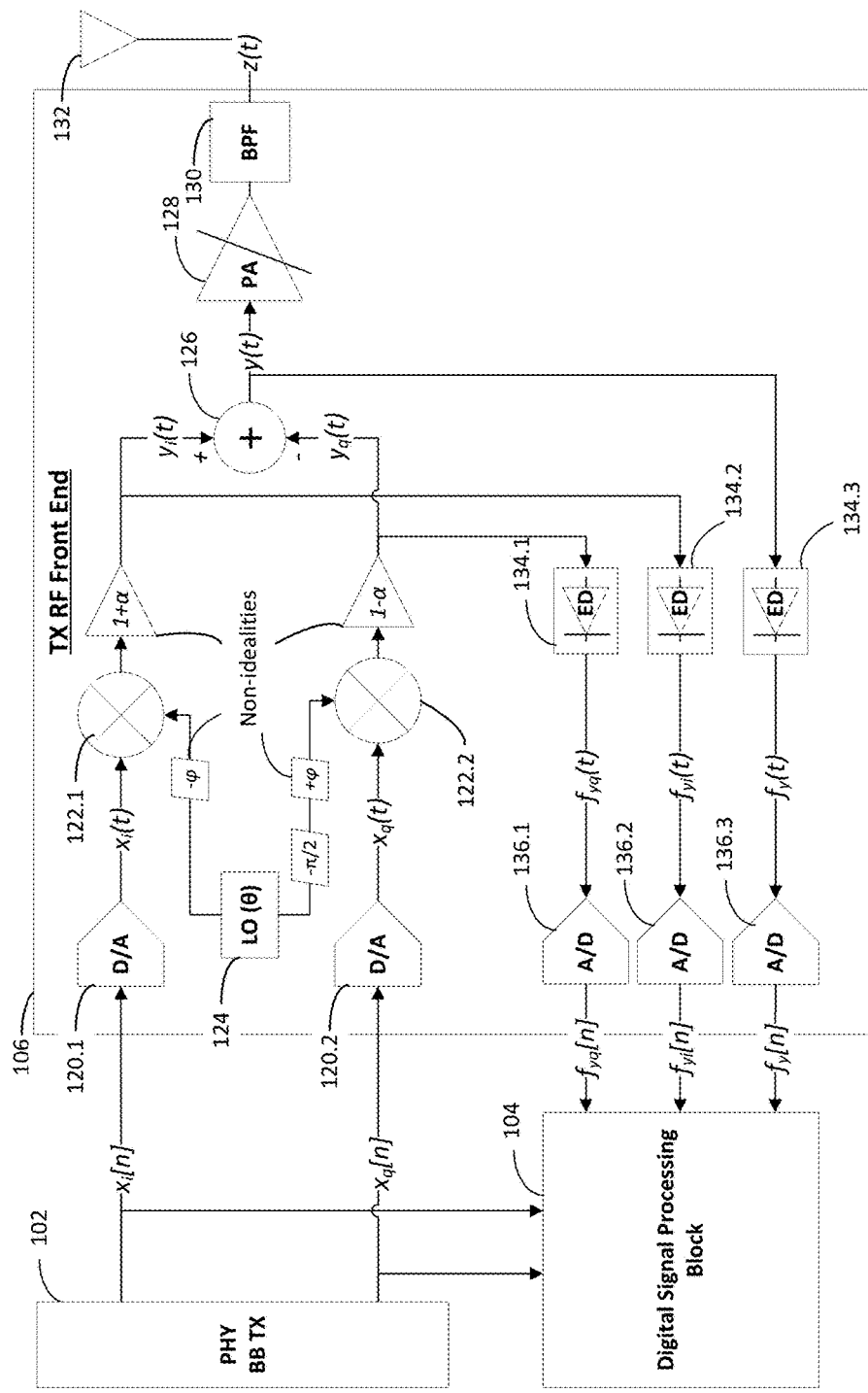
FIG. 1 illustrates a block diagram of an example transmitter design implementing online closed-loop identification of I/Q modulator stage non-idealities in accordance with an aspect of the disclosure.

The exemplary aspects of the present disclosure will be described with reference to the accompanying drawings.

The drawing in which an element first appears is typically indicated by the leftmost digit(s) in the corresponding reference number.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Again, RF transmitters may include various non-idealities. This disclosure is generally directed to compensating for two categories of such non-idealities, which are classified herein as I/Q modulator stage non-idealities and amplifier stage non-idealities. Moreover, the disclosure is generally related to the generation of a reference signal, as a complex lowpass equivalent representation, of the transmitter output signal (which has been distorted by the non-idealities in the amplifier stage).

As discussed further herein, I/Q modulator stage non-idealities may include I/Q imbalances associated with portions of the transmitter's I/Q modulator such as gain ($\alpha$) and phase ($\varphi$) imbalance between the I and Q branches, as well as other parameters that may need to be compensated for such as common loopback gain. The amplifier stage non-idealities may be directed to non-linearities present in one or more of the transmitter's amplifier stages, which are typically coupled between the I/Q modulator and the transmitter's antenna. For clarity, conventional solutions that have been implemented to compensate for each of these general categories of non-idealities, and their respective drawbacks, are presented separately below.

I/O Modulator Stage Non-Idealities

To maximize RF transmitter performance (e.g. EVM), quality, and to guarantee conformance with protocol specifications, I/Q imbalances need to be identified and correctly calibrated/compensated. Moreover, because of the I/Q imbalance variations that may be present in the field and vary over time, the calibration of I/Q imbalances is more complex to solve, e.g., due to the dependence on supply voltage and temperature variations. The previous solution to address I/Q imbalances can be classified into four main categories: open-loop offline, open loop online, closed-loop offline, and closed-loop online.

Open-loop offline methods are typically used during high volume manufacturing of each device. Each transmitter device is stressed with specifically crafted test stimuli, and the response is captured by RF automated test equipment (with a highly calibrated, or "ideal," receiver), and finally post-processed offline to estimate TX I/Q imbalance and the ideal calibration values. To address on-the-field operation (i.e. temperature variations, voltage variations, etc.), this calibration needs to be executed several times with different setups to generate a "calibration table" for a sample (subset) of all foreseeable scenarios. Once in the field, this calibration table is indexed (based, for example, on temperature and voltage sensors) to select the best calibration within the existing options (or to somehow interpolate between them).

The current open-loop offline techniques thus require all usage scenarios to be foreseen at the time of design, and the calibration values must be determined for such scenarios at production time. Obtaining calibration values for some of the desired variations (e.g. silicon aging) is not trivial, and instrumenting sensors to determine the current value for such variables also increases design complexity and cost. Therefore, this process usually increases production/test time and cost per unit. Furthermore, if the generated calibration table is too shallow (i.e., only includes a small subset of scenarios), the actual calibration performance on the field is likely to be far from optimal (i.e., performance loss due to the lack of scenario granularity).

The current open-loop online techniques require that the transmitting end add specific (known a priori) training sequences to the transmitted frame, which enable the receiving end to estimate the TX I/Q imbalance and to post-compensate for it on the receiver end. If the estimated imbalance is communicated back to the transmitting end (the loop closes OTA), the TX end could attempt self-calibration. Many of these methods assume an ideal receiving end without RX I/Q imbalances, while other methods assume that the receiving end may have an independent RX I/Q imbalance. These methods thus enable on-the-field tracking of I/Q imbalances because, with each new transmitted frame, the receiving end is able to estimate and post-compensate its current effect.

However, current open-loop online methods assign all the burden of the TX I/Q imbalance post-compensation to the peer receiving end. As a result, these methods require a protocol specification to mandate that the receiver add the capability of identifying and post-compensating the TX I/Q imbalances. Moreover, these methods tend to reduce the spectral efficiency of the communication protocol by requiring extra training signals specifically crafted for this purpose, and thus this method is not feasible.

Current closed-loop offline techniques include the TX presenting some internal means to close the loop, or to "loopback" the transmitted signal to the digital baseband to estimate and calibrate I/Q imbalances via digital signal processing (DSP). These being offline methods, they require specific (known a priori) training signals to stimulate the TX, and to enable I/Q imbalance estimation and compensation from the looped-back reference. These training signals have to be used while the transmitter is not required for a communication link. The looped-back reference is typically generated either by an internal quadrature down-converter (which may itself present its own I/Q imbalance), or via RF envelope detectors. These methods can enable on-the-field tracking of I/Q imbalances by executing the closed-loop identification/calibration process recurrently (when the transmitter is not required for a communication link).

Again, closed-loop offline methods require the operation of the TX and the loopback instrumentation when these are not required by the communication link. This implies increased power consumption (dependent on the periodicity of execution of the loopback method). Moreover, continuous I/Q imbalance tracking is difficult or impossible depending on the protocol specifics (like datagram sizes, and how often a device is expected to transmit), as there may be cases when the transmitter is used by the communication link for long periods, thus preventing the identification/calibration method to be executed. In the extreme, if the communication link is half-duplex FDD, this method might not be usable on the AP or BS side (the transmitter is continuously required by the link).

In typical closed-loop online methods, the TX presents some internal means to close the loop, or loopback the transmitted signal back to the digital baseband to estimate and calibrate I/Q imbalance via some DSP process. As this is an online method, it cannot use specific (pre-defined) training signals, and thus such solutions need to estimate and compensate for I/Q imbalances during normal communication link operation of the TX.

The known techniques in this category thus require the use of an internal quadrature down-converter to generate the loopback reference signal, which may itself present an additional RX I/Q imbalance non-idealities. As a result, this method requires strictly distinct local oscillator (LO) frequencies for the up-conversion (TX path) and the down conversion (loopback reference path) to decouple the two I/Q imbalances from one another. Moreover, this method requires a feedback I/Q down-converter that simultaneously operates in conjunction with the transmitter using a distinct LO frequency, which has various implications. For example, this increases the power consumption for the TX operation, may include independent RX I/Q imbalances (which increases the complexity and convergence time of the identification/calibration algorithms), will include an extra amount of independent phase noise, and may be further impaired by carrier frequency offset errors (when the actual difference in LO frequencies for TX and RX loopback reference is not exactly the expected one). Furthermore, if the communication link is not a half-duplex TDD, then the normal receiver cannot be reused for the purpose of I/Q imbalance identification/calibration, and a separate feedback quadrature downconverter will be required (thus increasing the required semiconductor area).

Therefore, there is a need for appropriate I/Q imbalance detection and compensation that overcomes the aforementioned disadvantages. The aspects described herein address these issues by implementing online identification and calibration of RF transmitter I/Q imbalances without requiring specific training signals to do so. And because these aspects do not require any specific training signals, the aspects may be implemented in the field and during normal operation of the device in which the transmitter is used to continuously track I/Q imbalance variations using low-power analog mixed-signal instrumentation.

Amplifier Stage Non-Idealities

The aforementioned TX nonlinearities need to be correctly characterized and calibrated/compensated to ensure that the RF TX device will comply with the normative specifications (e.g. EVM, spectral masks, etc.) of the target RF communications protocols. And because of the short-term and long-term variations that these nonlinearities suffer on the field, the calibration problem becomes much more complex to solve.

Virtually all TX non-linearity calibration methods require a reference signal of the TX output, which includes the nonlinear distortions of the TX input signal. Other important applications in RF communications, such as self-interference cancellation, also require a reference signal of the TX output. Therefore, providing an accurate reference of the TX output signal in the digital baseband domain, i.e., the digitized complex-lowpass equivalent (CLE) representation of the TX output, is an important task in RF transmitter design.

One typical solution to obtain a reference signal of the RF transmitter output includes using feedback receivers, i.e. frequency down-converters coupled to the TX output with or without explicit attenuators. The feedback receiver can be, under certain circumstances, substituted by a loopback to the nominal RF receiver path. However, assuming that the feedback receiver is designed to operate in linear region, one disadvantage of this technique is that the feedback receiver must be carefully designed to avoid adding new distortions to the probed signal, as it is very complex to decouple these new distortions from the TX distortion. For instance, using such feedback receivers can present distortions such as additional I/Q imbalances, LO-pulling, DC offset, increased phase noise, and phase misalignment (LO phase offset between the TX up-conversion and the feedback downconversion).

Another disadvantage with regards to the use of feedback receivers is increased power consumption and physical area required by the feedback receiver (e.g. to enable decoupling some RX non-idealities from TX non-idealities, the feedback receiver needs to have an offset frequency or IF, therefore potentially requiring a separate LO). Moreover, using the nominal RX path in the transceiver is, in some cases, impossible (half-duplex FDD links), and potentially not optimal given the distinct optimization criteria between a feedback receiver and the nominal RX path.

Another solution to calculate the transmitter reference signal includes using two envelope detectors to reconstruct the TX output reference CLE in polar representation. This method only works, however, under specific limitations for the nonlinearity in question, and thus is not a general enough solution to be applied to a wide variety of transmitters. In other words, this method is theoretically possible only under strict restrictions for the TX topology and dynamic behavior. In particular, the transmitter must be a quadrature topology, it cannot present TX I/Q imbalances, and it must respect the so-called "phase sign condition." Moreover, dispersion in the AM-PM response caused by TX nonlinear memory effects increase the likelihood of violating the phase sign condition, thus this method is unfit for TX devices with nonlinear memory effects. Because of these limitations, this approach is unfeasible for general use. Conventional solutions to identify and compensate for RF transmitter nonlinearities fall into three main categories: open-loop offline, closed-loop offline, and closed-loop online.

Open-loop offline methods are the conventional methods used during high volume manufacturing device characterization (production time testing). A TX device is stressed with specifically crafted test-stimuli, and the response is captured by an RF automated test equipment (with a highly calibrated receiver), and finally post-processed offline to identify the nonlinearity. A common open-loop calibration that is tuned offline is digital pre-distortion (DPD). But to compensate for on-the-field operation (i.e. compensating for temperature variations, voltage variations, etc.), calibration methods of this type need to be executed several times with different setups to generate a "calibration table" for a sample (subset) of all the foreseeable scenarios. Once on the field, this calibration table is indexed (based, for example, on temperature and voltage sensors) to select the best calibration within the existing options (or somehow interpolate between them).

Open-loop offline methods have several disadvantages. In particular, these methods assume an ideal receiver is available to capture the TX response, all the usage scenarios need to be foreseen at design time, and the calibration values must be determined for such scenarios at production time. Again, obtaining calibration values for some of the desired variations (e.g. silicon aging) is not trivial, and instrumenting the sensors to determine the current value for such variables may also increase complexity. This process therefore increases production/test time and cost per unit. Furthermore, if the generated calibration table is shallow (i.e., includes a small subset of scenarios), the actual calibration performance on the field is likely to be far from optimal (performance loss due to the lack of scenario granularity).

For closed-loop offline methods, the TX presents some internal means to close the loop, or loopback the transmitted signal to the digital baseband to identify or compensate (linearize) the nonlinearities, e.g. via feedback receivers. However, these methods require predefined training signals to stimulate the TX (while TX is not required by the communication link) to enable fast identification and compensation of nonlinearities from the looped-back reference. Moreover, for closed-loop offline calibration to be enabled, the loopback must not add distortions to the signal, i.e. the looped-back signal must be relatively "clean."

Such closed-loop offline methods can thus only enable on-the-field tracking of nonlinearities by executing the closed-loop identification/linearization process recurrently (i.e., only when the transmitter is not required for a communication link). Furthermore, closed-loop offline techniques require an ideal feedback receiver or complex instrumentation to decouple TX and feedback receiver impairments (e.g. offset frequency between TX and RX). And, again, closed-loop offline methods can only operate when the TX is not required by the communication link, requiring an increased power consumption (dependent on the periodicity of execution of the loopback method). Continuous TX linearization will therefore be difficult or impossible depending on the protocol specifics (like datagram sizes, and how often a device is expected to transmit). In the extreme, if the communication link is half-duplex FDD, this method might not be usable on the AP or BS side (e.g., when the transmitter is continuously required by the link).

In closed-loop online methods, the TX presents some internal means to close the loop, or loopback the transmitted signal back and linearize the TX either via analog method or via some DSP process. These methods execute during normal communication link operation of the TX, and thus should be able to perform reasonably well with whatever waveform is required by the communication protocol. Analog/RF feedback methods are intrinsically adaptive, and are thus able to keep track of variations on the field. All digital methods rely on the existence of a loopback to close the loop and adapt the parameters of a DPD, which should not add extra distortion to the signal, assuming an "ideal" feedback receiver.

However, typical closed-loop online analog linearization methods are usually more complex to design, and are themselves vulnerable to process, voltage, and temperature (PVT) variations. Traditional analog feedback linearization methods also suffer from instability issues due to several causes (e.g. TX/RX phase misalignment), and usually present narrow bandwidth support. Other conventional analog linearization methods can present wider bandwidth support, but do so at the cost of lower power efficiency and more complex design. Furthermore, typical closed-loop online digital linearization methods require an ideal feedback receiver or complex instrumentation to decouple TX and feedback receiver impairments (e.g. offset frequency between TX and RX), which increases the power consumption for the TX operation and increases the overall phase noise. Moreover, typical digital linearization methods using two envelope detectors are only useful for TX devices complying with the aforementioned restrictions.

To remedy the aforementioned issues with these typical solutions, the aspects described herein are directed to a transmitter architecture and accompanying processing techniques for online generation of a TX output reference signal in digital baseband (which is not a model-based prediction) without requiring any specific training signals. These aspects, which are further discussed below, utilize the generated reference for online closed-loop TX nonlinearity identification and pre-distortion (linearization), thus enabling on the field continuous tracking of the nonlinear behavior temporal fluctuations. Moreover, the aspects described herein directly utilize the generated reference for other applications requiring a reference of the transmitted signal at the TX output, such as self-interference cancellation.

Figure 11:
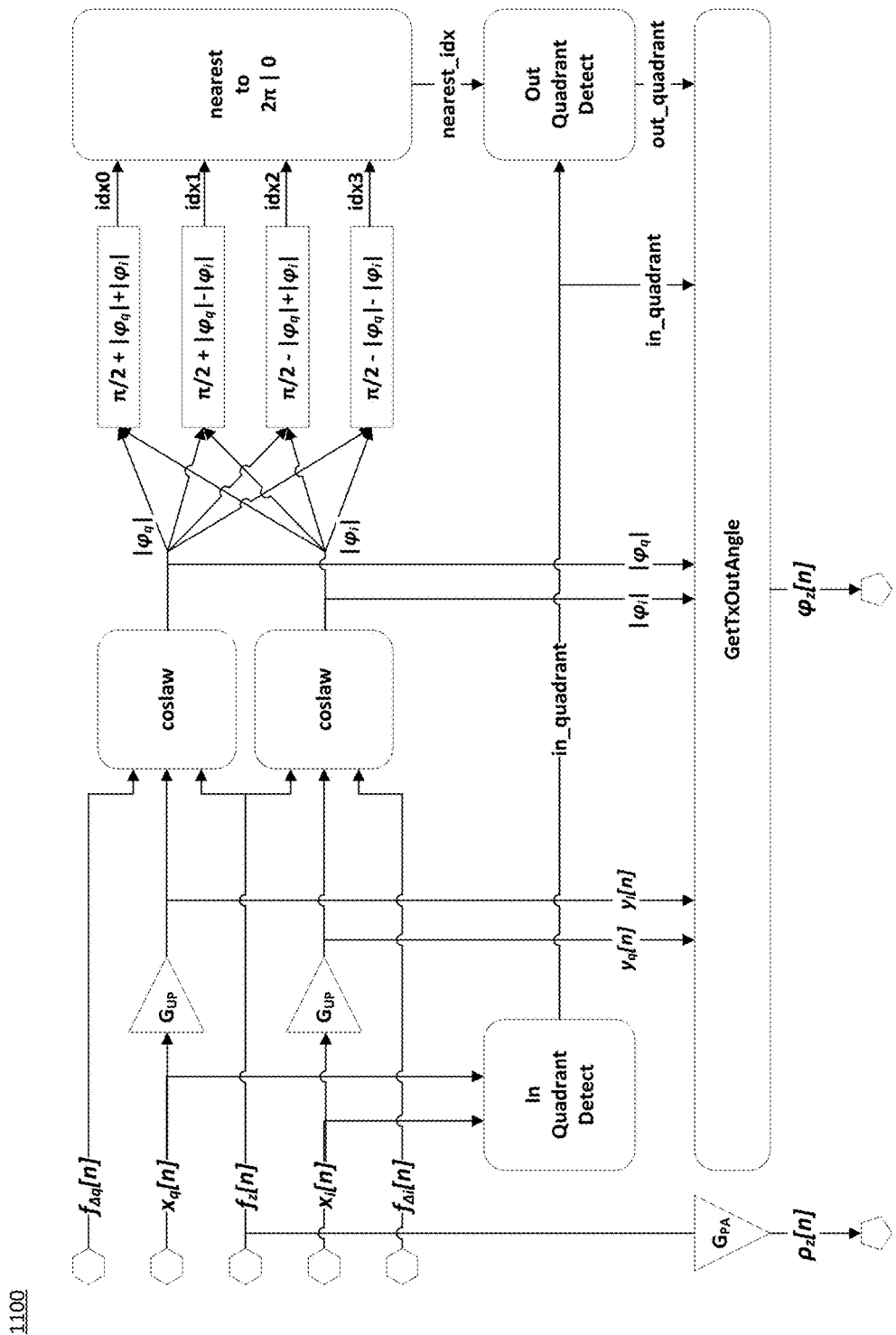
FIG. 11 illustrates an algorithm flow for transmitter output CLE estimation in the complex polar domain in accordance with an aspect of the disclosure.
Figure 12:
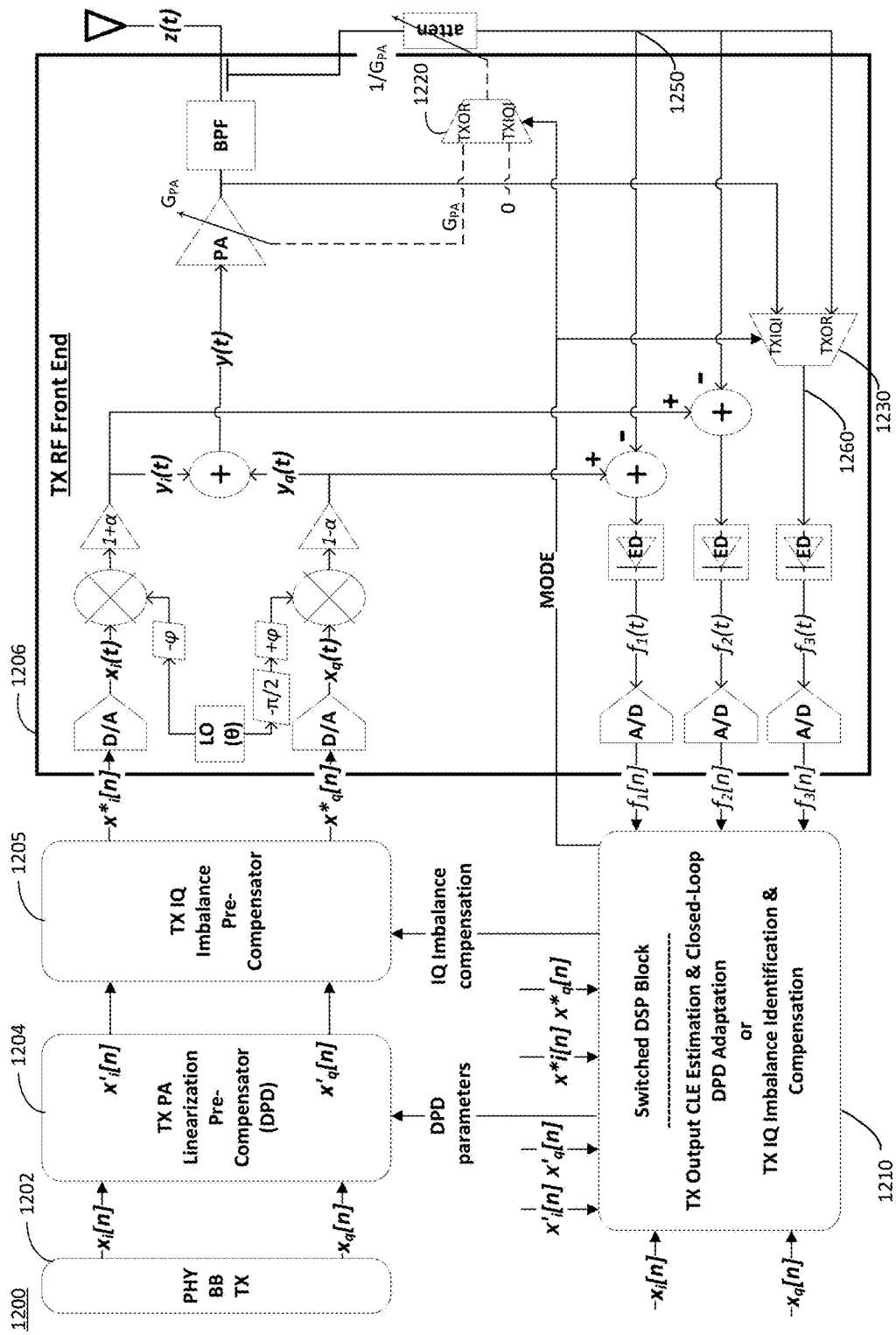
FIG. 12 illustrates a block diagram of an example transmitter design that performs time-switched compensation of online closed-loop compensation of I/Q modulator stage non-idealities and online closed-loop compensation of amplifier stage non-idealities in accordance with an aspect of the disclosure.

The aspects described herein are directed to different solutions regarding the identification and compensation of various transmitter non-idealities. As further discussed below, FIGS. 1-5 are provided with reference to addressing I/Q modulator non-idealities, whereas FIGS. 6-11 are provided with reference to addressing amplifier stage non-idealities. Moreover, FIG. 12 is provided with reference to a transmitter architecture that combines features to address both I/Q modulator non-idealities and amplifier stage non-idealities in a single design in a time-switched manner. In each case, the transmitter architecture exploits a triple-envelope detector (ED) feedback system to identify and compensate for the non-idealities.

I/Q Modulator Stage Non-Idealities

FIG. 1 illustrates a block diagram of an example transmitter design implementing online closed-loop identification of I/Q modulator stage non-idealities in accordance with an aspect of the disclosure. The transmitter design 100 as shown in FIG. 1 and the additional figures referenced herein may be considered a portion of a transmitter that may be implemented as part of any suitable device for which wireless signal transmissions are utilized (e.g., as part of a mobile device). Therefore, the transmitter design 100 as shown in FIG. 1 and the additional figures referenced herein may include additional, alternate, or less components to facilitate proper operations.

As shown in FIG. 1, the transmitter design 100 may include a baseband processor 102, a DSP block 104, and a transmitter (TX) RF front end 106. The baseband processor 102 may be implemented as any suitable number and/or type of computer-based processors configured to perform typical baseband processing functions and/or to control various functions of the transmitter and/or a device in which transmitter design 100 is implemented. For example, the baseband processor 102 may be configured to generate the digitized representation of the baseband signal to be up-converted and transmitted wirelessly via the antenna 132, which may be represented in FIG. 1 as digital baseband in-phase component (real, I) samples $x_i[n]$ and digital baseband quadrature component (imaginary, Q) samples $x_q[n]$.

The TX RF front end 106 may include an I branch and a Q branch, with each of these branches converting the digital baseband signals $x_i[n]$, $x_q[n]$ to analog signals, and up-converting the analog baseband signals, in quadrature, to a different frequency for transmission. In particular, the I branch may include the D/A converter 120.1, which converts the digital baseband real (I) component samples $x_i[n]$ to analog baseband real component samples $x_i(t)$, which are then mixed with a LO signal provided by LO 124 via mixer 122.1 to generate an up-converted signal $y_i(t)$ (i.e., the in-phase component). Furthermore, the Q branch may include the D/A converter 120.2, which converts the digital baseband imaginary (Q) component samples $x_q[n]$ to analog baseband imaginary component samples $x_q(t)$, which are then mixed with the LO signal (shifted by 90 degrees)

provided by the LO 124 via mixer 122.2 to generate an up-converted signal $y_q(t)$ (i.e., the quadrature component).

An I/Q combiner 126 then combines the in-phase signal component $y_i(t)$ and the quadrature signal component $y_q(t)$ to provide a combined I/Q signal y(t). The I/Q signal y(t) may then be amplified via one or more amplifier stages. The transmitter design 100 as shown in FIG. 1 includes a single variable gain amplification stage including power amplifier (PA) 128, although aspects include any suitable number of amplifier stages to provide a suitable level of gain for the combined I/Q signal y(t). The amplified combined I/Q signal y(t) is then passed through one or more filters to provide an output signal z(t), which is transmitted via the antenna 132. The transmitter design 100 as shown in FIG. 1 also includes a single filter stage including bandpass filter (BPF) 130, although aspects include transmitter design 100 implementing any suitable number of filter stages and/or filter types to appropriately condition the amplified I/Q signal for y(t) transmission.

The I/Q modulator of the transmitter design 100 introduces non-idealities as part of the I-branch and Q-branch architecture. These non-idealities are illustrated in FIG. 1 as phase imbalances −φ and +φ, and gain imbalances 1+α and 1−α. These non-idealities are shown in FIG. 1 for clarity, and represent parameters in accordance with a standard "symmetric" I/Q imbalance model, which can correctly model any I/Q imbalance case. Thus, this model splits the imbalances equally between the two quadrature branches, using the α-parameter for gain imbalance and the φ-parameter for phase imbalance. The local oscillator 124 is also depicted with an unknown initial carrier phase, indicated by the parameter θ. It should be noted that the blocks shown in FIG. 1 that are associated with the modeled α-parameter and φ-parameter are not actual physical components associated with the transmitter design 100. Instead, these blocks are depicted in FIG. 1 for ease of explanation, in that the parameters are associated with components within the I/Q modulator that reflect their respective metrics.

To identify and compensate for these imbalances, aspects include the transmitter design 100 implementing feedback paths that probe the in-phase signal component $y_i(t)$ provided by the I branch, the quadrature signal component $y_q(t)$ provided by the Q branch, and the combined I/Q signal y(t). To do so, aspects include the transmitter design implementing three envelope detectors (ED) 134.1, 134.2, 134.3, each being coupled to a respective analog-to-digital converter (A/D) 136.1, 136.2, 136.3, which provide digital data samples to the DSP block 104. In particular, the ED 134.1 functions to produce a Q-branch envelope feedback signal, which is an envelope $f_{yq}(t)$ of the quadrature signal component $y_q(t)$. Furthermore, the ED 134.2 functions to produce an I-branch envelope feedback signal, which is an envelope $f_{yi}(t)$ of the in-phase signal component $y_i(t)$. The remaining ED 134.3 functions to produce an I/Q envelope feedback signal, which is an envelope $f_y(t)$ of the combined output I/Q signal y(t).

The three analog-to-digital converters 136.1, 136.2, 136.3 thus function to digitize the I-branch envelope feedback signal $f_{yi}(t)$, the Q-branch envelope feedback signal $f_{yq}(t)$, and the I/Q envelope feedback signal $f_y(t)$ to discrete-time feedback signals $f_{yi}[n]$, $f_{yq}[n]$, and $f_y[n]$, respectively, as shown in FIG. 1. The DSP block 104 is configured to receive the digitized discrete-time feedback signals $f_{yi}[n]$, $f_{yq}[n]$, and $f_y[n]$, as well as the digital baseband real and imaginary component samples $x_i[n]$, $x_q[n]$ generated by the baseband processor 102. In this way, the DSP block 104 may implement various algorithms, logic, executable instructions, etc., to identify and/or compensate for the aforementioned I/Q non-idealities in an online and closed-loop manner without the use of training signals.

To do so, the DSP block 104 may be implemented as any suitable number and/or type of computer processors. For example, the DSP block 104 may be implemented as fixed-function digital logic, firmware executing in a DSP, firmware running on an Application Specific Instruction Processor, etc. In various aspects, the functionality provided by the DSP block 104 may be implemented in hardware separate from the baseband processor 102 or integrated as part of the baseband processor 102.

The aspects described herein advantageously utilize envelope detectors to provide feedback to the DSP block 104 that may be useful to identify I/Q imbalance and/or other types of non-idealities. In particular, because each of the variable gain stages in the TX RF front end 104 follow the up-conversion stage as shown in FIG. 1, with the only variable gain in the PA 128, the dynamic range expected on each input node coupled to the EDs 134.1, 134.2, 134.3 does not change, advantageously allowing for the EDs to operate in a linear manner. Moreover, because these probed nodes are expected to have high quality (i.e., low spurious signals or interferences), the EDs 134.1, 134.2, 134.3 can advantageously be designed to have a moderate noise figure and still present a high signal-to-noise ratio (SNR) at their respective outputs. Thus, aspects include the use of the EDs 134.1, 134.2, 134.3 to ensure a higher certainty in the TX I/Q imbalance identification and calibration process. In a further aspect, one or more of the EDs 134.1, 134.2, 134.3 can optionally include attenuators between each respective ED input and each probed node (i.e., an attenuator placed in series with an ED input and the probed node of the I-branch, Q-branch, and/or I/Q combiner output). In accordance with such aspects, such attenuators would help ensure that the EDs 134.1, 134.2, 134.3 operate in a linear region.

In an aspect, the transmitter design 100 as shown in FIG. 1 may identify non-idealities in a closed loop manner. For example, the transmitter design 100 as shown in FIG. 1 may implement the DSP block 104 to estimate the I/Q imbalance model parameters (α-parameter and φ-parameter), or to directly estimate the gain-imbalance and phase-imbalance. Additionally or alternatively, the DSP block 104 may also estimate the loopback common gain $G_L$, which is not depicted in FIG. 1 but is a composition of the up-conversion common linear gain and the envelope feedback common linear gain. Thus, the loopback common gain $G_L$ may be considered an I/Q modulator non-ideality, which can likewise be compensated for in accordance with the aspects described herein.

To estimate the phase imbalance, the gain imbalance, and/or the loopback common gain, the DSP block 104 may include and/or access a memory location containing executable code. For example, the DSP block 104 may include (or access another external memory that includes) a non-transitory computer-readable memory that stores data and/or instructions such that, when the instructions are executed by processor circuitry associated with the DSP block 104, the DSP block 104 performs the various functions described herein. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM).

In any event, aspects include the DSP block 104 being configured to execute such instructions and/or one or more appropriate algorithms to analyze the digital baseband real and imaginary component samples $x_i[n]$ and $x_q[n]$ in conjunction with the discrete-time feedback signals $f_{yi}[n],f_{yq}[n]$, and $f_y[n]$. In doing so, the DSP block 104 can estimate non-idealities such as, for example, phase imbalance, gain imbalance, and/or loopback common gain, which can then be compensated as part of a separate process. An example of the processor steps associated with such an I/Q modulator stage non-ideality identification algorithm are provided below.

Example Algorithm to Identify Transmitter I/Q Modulator Stage Non-Idealities

As an initial matter regarding the example algorithm, a mathematical complex low-pass equivalent (CLE) representation for the sampled RF signals (i.e., $y_i(t)$, $y_q(t)$, and $y(t)$) and their corresponding feedback envelope signals (i.e., $f_{yi}(t)$, $f_{yq}(t)$, and $f_y(t)$) is presented as follows, with the CLE representation of an RF signal being indicated with a tilde accent:

$$\tilde{y}_i(t) = G_L(1+\alpha)x_i(t)e^{(j(\theta-\varphi))} \quad \text{Eqn. 1A:}$$

$$\tilde{y}_q(t) = G_L(1-\alpha)x_q(t)e^{(j(\theta+\varphi))} \quad \text{Eqn. 2A:}$$

$$\tilde{y}(t) = \tilde{y}_i(t) + j\tilde{y}_q(t) \quad \text{Eqn. 3A:}$$

$$f_{yi}(t) = |\tilde{y}_i(t)| = |G_L(1+\alpha)x_i(t)| \quad \text{Eqn. 4A:}$$

$$f_{yq}(t) = |\tilde{y}_q(t)| = |G_L(1+\alpha)x_q(t)| \quad \text{Eqn. 5A:}$$

$$f_y(t) = |\tilde{y}(t)| = G_L[(1+\alpha)^2 x_i^2 + (1-\alpha)^2 x_q^2 - 2(1+\alpha)(1-\alpha)x_i(t)x_q(t)\sin(2\varphi)]^{1/2} \quad \text{Eqn. 6A:}$$

As the above-terms are defined, the example algorithm assumes that the transmitter TX digital quadrature baseband inputs (i.e., $x_i[n]$ and $x_q[n]$) and the digitized envelopes feedbacks (i.e., $f_{yi}[n],f_{yq}[n]$, and $f_y[n]$) are digitally time-aligned. Therefore, loopback delays are characterized up-front to enable digital domain alignment. The example algorithm thus estimates the symmetric I/Q imbalance model parameters, namely: $\hat{\alpha}$, $\hat{\varphi}$, $\hat{G}_L$. Again, the following algorithm is but one example of an algorithm that may be used to identify the aforementioned non-idealities. Aspects include alternate or additional steps, or other modifications to the algorithm to utilize the envelope feedback signals in accordance with the transmitter envelope architecture described herein. For example, aspects may include alternate algorithms that attempt to simultaneously track the loopback delays, and thus the pre-characterization of the loopback delays may not be required in accordance with such aspects.

Assuming time-alignment (of digitized signals), the algorithm may be executed based on the transmitter design architecture described above with reference to FIG. 1 (e.g., by the DSP block 104), using the following equations for the identification algorithm:

$$\frac{f_{yi}^2(t)}{x_i(t)^2} = \quad \text{Eqn. 7A}$$

$$G_L^2(1+\alpha)^2 = G_L^2(1+2\alpha+\alpha^2) \to G_L^2\alpha^2 = \frac{f_{yi}^2(t)}{x_i(t)^2} - G_L^2(1+2\alpha)$$

$$\frac{f_{yq}^2(t)}{x_q(t)^2} = \quad \text{Eqn. 8A}$$

$$G_L^2(1-\alpha)^2 = G_L^2(1-2\alpha+\alpha^2) \to G_L^2\alpha^2 = \frac{f_{yq}^2(t)}{x_q(t)^2} - G_L^2(1-2\alpha)$$

$$\frac{f_{yi}(t)f_{yq}(t)}{|x_i(t)| \cdot |x_q(t)|} = G_L^2(1-\alpha^2) \quad \text{Eqn. 9A}$$

$$\frac{f_{yi}^2(t)}{x_i(t)^2} - \frac{f_{yq}^2(t)}{x_q(t)^2} = 4G_L^2\alpha \quad \text{Eqn. 10A}$$

It should be noted that the signals provided above in Equations 1A-10A are with reference to a continuous time representation of RF signals. The equations 1A-10A, as well as the example algorithm discussed herein, are presented in this format for ease of understanding with regards to the CLE representation of an RF signal (e.g., as shown in Eqns. 1A-6A). It will be understood that aspects include the DSP block 104 utilizing digitized versions of the RF signals as defined herein. Taking this into consideration, the example I/Q imbalance identification algorithm may thus be executed in accordance with the following steps:

$$P_1 = \frac{f_{yi}(t) \cdot f_{yq}(t)}{|x_i(t)| \cdot |x_q(t)|} \quad (1)$$

$$P_2 = \frac{\frac{f_{yi}^2(t)}{x_i(t)^2} - \frac{f_{yq}^2(t)}{x_q(t)^2}}{2} \quad (2)$$

$$P_3 = P_1 + \frac{f_{yi}^2(t)}{x_i(t)^2} - P_2 \quad (3)$$

$$P_4 = \frac{f_{yi}^2(t) + f_{yq}^2(t) - f_y^2(t)}{2 \cdot P_1 \cdot x_i(t) \cdot x_q(t)} \quad (4)$$

$$\hat{G}_L = \frac{P_3}{2} \quad (5)$$

$$\hat{\alpha} = \frac{P_2}{P_3} \quad (6)$$

$$\hat{\varphi} = \sin^{-1}\frac{P_4}{2} \quad (7)$$

Note that temporal moving averages can be calculated for P1, P2, P3, and P4 for the purpose of error averaging (i.e. either noise or errors introduced by model inaccuracies, like frequency selective responses not modeled), and calculate the final estimates based on these temporal averages. This algorithm is not statistically optimal, and yet its results are satisfactory.

Based on the above presented CLE representation of the feedback envelope signals (i.e., $f_{yi}(t)$, $f_{yq}(t)$, and $f_y(t)$), two distinct conditions may be derived as criteria that facilitate the indirect measurement of residual I/Q imbalance for a particular TX-AFE. Whenever these criteria are met, it serves as an indication that I/Q imbalance has been substantially compensated or calibrated, i.e., that the residual I/Q imbalance is negligible.

$$f_y^2(t) \stackrel{?}{\Leftrightarrow} G_L^2[x_i(t)^2 + x_q(t)^2 - 2x_i(t)x_q(t)] \quad \text{Condition 1}$$

$$\frac{f_{yi}(t)}{|x_i(t)|} \stackrel{?}{\Leftrightarrow} \frac{f_{yq}(t)}{|x_q(t)|} \quad \text{Condition 2}$$

Thus, the above conditions allow the creation of online closed-loop calibration algorithms in accordance with well-known optimization methods, which use these conditions as the optimization cost function (i.e. objective function) to facilitate the minimization of the I/Q imbalance by attempting to equalize each side of the equation for conditions (1) and (2).

Discontinuous Closed-Loop I/Q Imbalance Calibration

Figure 2:
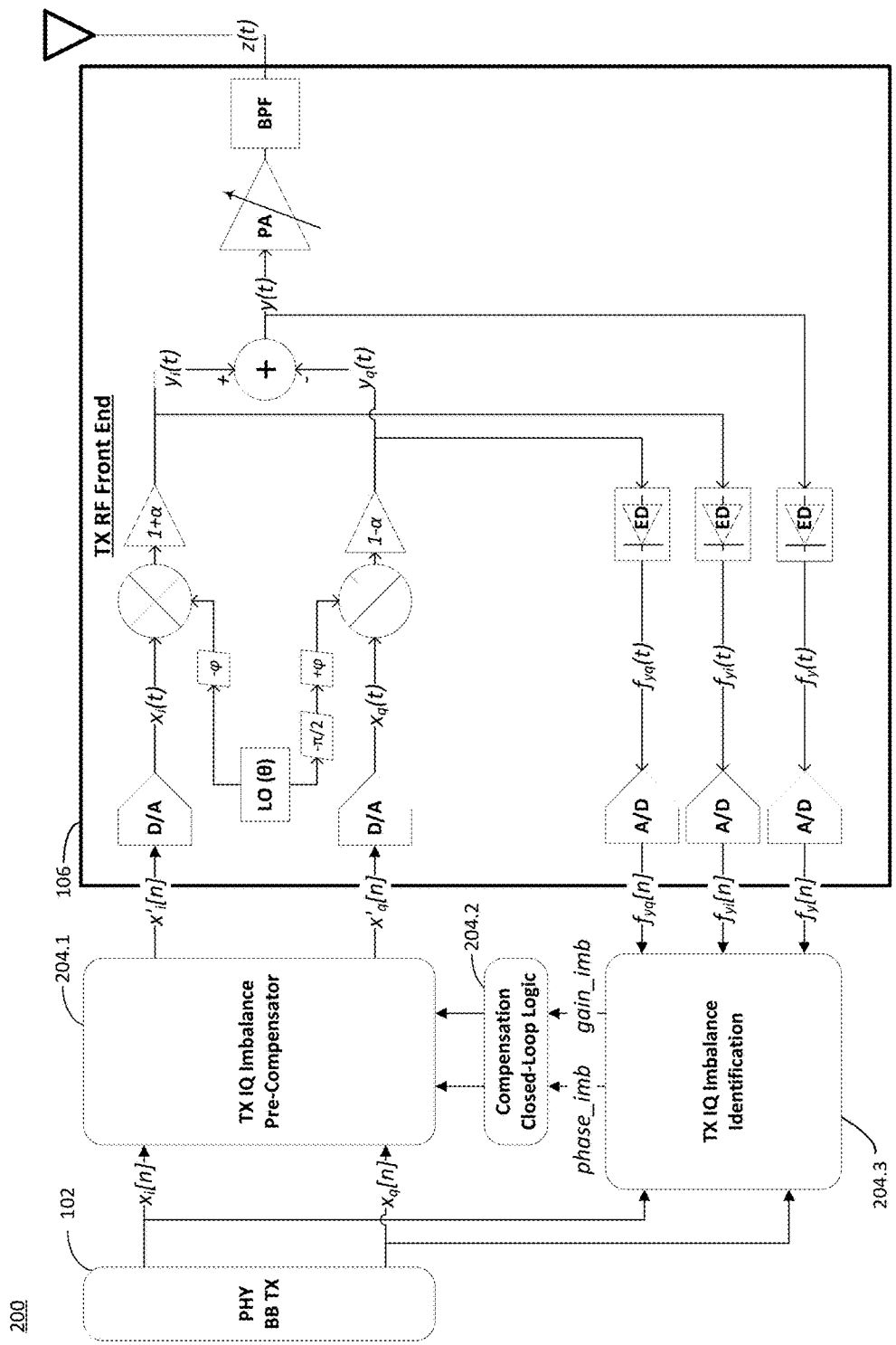
FIG. 2 illustrates a block diagram of an example transmitter design implementing online discontinuous closed-loop calibration of identified I/Q modulator stage non-idealities in accordance with an aspect of the disclosure.

FIG. 2 illustrates a block diagram of an example transmitter design implementing online discontinuous closed-loop calibration of identified I/Q modulator stage non-idealities in accordance with an aspect of the disclosure. The example transmitter design 200 shown in FIG. 2 includes a similar architecture as the example transmitter design 100, as shown in FIG. 1. In particular, both transmitter designs 100 and 200 include a baseband processor 102, a TX RF front end 106, and a feedback loop system including envelope detectors. Additional common components of transmitter designs 100 and 200 are not labeled in FIG. 2 for purposes of brevity.

However, as compared to transmitter design 100, the transmitter design 200 also includes a transmitter I/Q imbalance pre-compensator block 204.1, a compensation closed-loop logic block 204.2, and a transmitter I/Q imbalance identification block 204.3. In some aspects, the transmitter I/Q imbalance pre-compensator block 204.1, compensation closed-loop logic block 204.2, and transmitter I/Q imbalance identification block 204.3 may be identified with the DSP block 104, as shown and discussed with reference to FIG. 1. In other aspects, the transmitter I/Q imbalance pre-compensator block 204.1, compensation closed-loop logic block 204.2, and transmitter I/Q imbalance identification block 204.3 may be implemented with one or more processor components that may be distinct from the baseband processor 102 and the DSP block 104. In yet additional aspects, the transmitter I/Q imbalance pre-compensator block 204.1, compensation closed-loop logic block 204.2, and transmitter I/Q imbalance identification block 204.3 may be implemented as part of the baseband processor 102.

In any event, aspects include the transmitter design 200 implementing discontinuous closed-loop calibration of I/Q imbalances such as phase imbalance, gain imbalance, and/or common loop gain, as discussed herein. To do so, the transmitter I/Q imbalance pre-compensator block 204.1 is coupled between the baseband processor 102 and the TX RF analog front end 106. Aspects include the transmitter I/Q imbalance pre-compensator block 204.1 pre-distorting the signals generated by the baseband processor 102 (i.e., $x_i[n]$ and $x_q[n]$) prior to these signals being delivered to the TX RF analog front end 106. In other words, the transmitter I/Q imbalance pre-compensator 204.1 pre-distorts the digital baseband signals $x_i[n]$ and $x_q[n]$ to compensate for detected I/Q imbalances by generating pre-distorted real and imaginary component signals $x'_i[n]$ and $x'_q[n]$.

In an aspect, the pre-distorted real and imaginary component signals $x'_i[n]$ and $x'_q[n]$ may be generated in a discontinuous and closed-loop online manner using the algorithms discussed above with regards to the identification of I/Q imbalances. In accordance with such aspects, the identification algorithm and the transmitter I/Q imbalance pre-compensator block 204.1 may be based upon the same I/Q imbalance theoretical model (i.e., the same model as defined and discussed above with regards to Eqns. 1A-10A). Therefore, the control inputs utilized by the transmitter I/Q imbalance pre-compensator block 204.1 may be the I/Q imbalance parameters (gain-imbalance, phase-imbalance) themselves or, alternatively, their respective related model parameters ($\alpha$-parameter and $\varphi$-parameter).

The model upon which the identification and compensation algorithms discussed herein are based is provided by way of example and not limitation. Additionally or alternatively, aspects include utilizing a different model than that discussed herein with regards to Eqns. 1A-10A. In other words, the RF signals may be defined in terms of any suitable type of theoretical model that appropriately defines any suitable number and/or type of parameters (in addition to or instead of $\alpha$ and $\varphi$). Thus, the aspects as described herein may be extended to utilizing the feedback envelope signals (i.e., $f_{yi}(t)$, $f_{yq}(t)$, and $f_y(t)$) to compensate for any suitable type of non-idealities that may be appropriately modeled.

Figure 3:
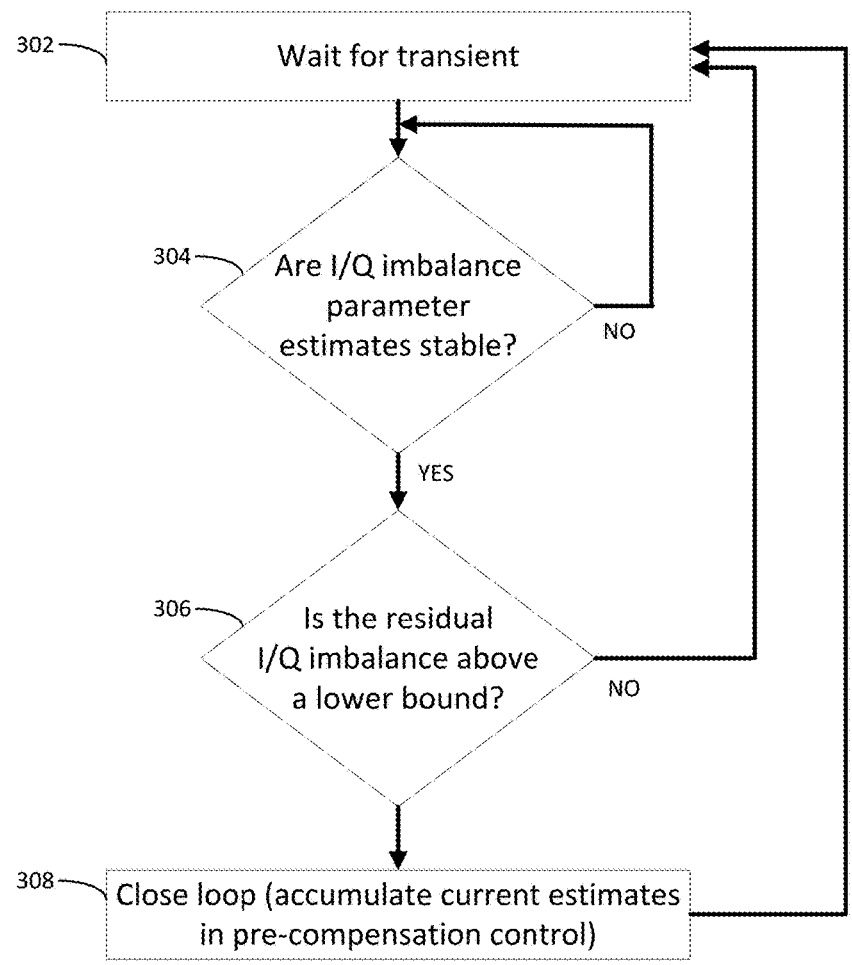
FIG. 3 illustrates an example flow for implementing online discontinuous closed-loop calibration of I/Q modulator stage non-idealities in accordance with an aspect of the disclosure.

In an aspect, a technique implemented by the transmitter I/Q imbalance pre-compensator block 204.1, the compensation closed-loop logic block 204.2, and the transmitter I/Q imbalance identification block 204.3 to accomplish digital pre-compensation of the I/Q imbalances is shown in FIG. 3 as flow 300. In particular, such aspects include the TX/I/Q imbalance identification block 204.3 continuously estimating the I/Q imbalance parameters, with the feedback loop being selectively closed via the compensation closed-loop logic block 204.2 as shown in FIG. 3.

In other words, the flow 300 begins with the passage of a transient period of time (block 302). This transient period may be, for example, a predetermined threshold time period or based upon the values of previously-estimated I/Q imbalance parameters, as discussed below. The flow 300 may continue once the transient period has elapsed, with compensation closed-loop logic block 204.2 assessing the stability of the estimated I/Q imbalance parameters (block 304). The compensation closed-loop logic block 204.2 may continue to wait until the I/Q imbalance estimates are stabilized (block 304). Once the estimated I/Q imbalance parameters have stabilized (e.g., are no longer fluctuating in excess of a predefined threshold measurement value), flow 300 may continue with compensation closed-loop logic 204.2 further determining whether the residual I/Q imbalance is above a lower bound, e.g., a predetermined threshold value (block 306). Upon the residual I/Q imbalance being above a lower bound (e.g., in accordance with the algorithm discussed above with respect to FIG. 1), aspects include the compensation closed-loop logic block 204.2 accumulating the estimated I/Q imbalance parameters into the transmitter I/Q imbalance pre-compensator block 204.1 as control input parameters (i.e., the loop is closed momentarily) (block 308). Aspects include repeating this process, each time accumulating a lower residual I/Q imbalance value.

Continuous Closed-Loop I/Q Imbalance Calibration

Figure 4:
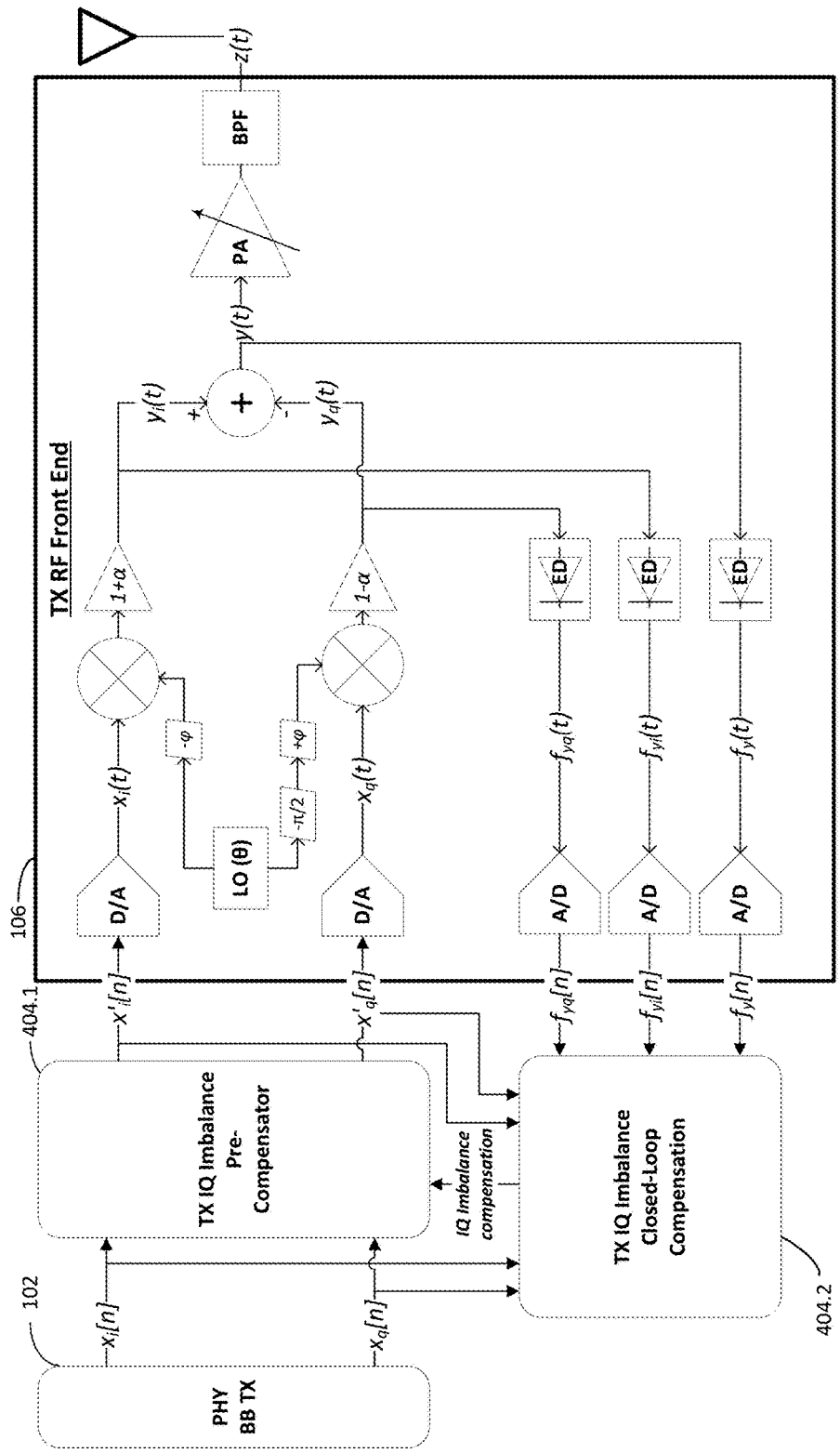
FIG. 4 illustrates a block diagram of an example transmitter design implementing online continuous closed-loop calibration of I/Q modulator stage non-idealities in accordance with an aspect of the disclosure.

FIG. 4 illustrates a block diagram of an example transmitter design implementing online continuous closed-loop calibration of I/Q modulator stage non-idealities in accordance with an aspect of the disclosure. The example transmitter design 400 shown in FIG. 4 includes a similar architecture as the example transmitter designs 100, 200, as shown in FIGS. 1 and 2, respectively. In particular, each transmitter designs 100, 200, 400 include a baseband processor 102, a TX RF front end 106, and a feedback loop system including envelope detectors. Additional common components of transmitter designs 100, 200, 400 are not labeled in FIG. 4 for purposes of brevity.

Like the transmitter design 200, the transmitter design 400 also includes a transmitter I/Q imbalance pre-compensator block 404.1 coupled between the baseband processor 102 and the TX RF analog front end 106. Aspects include the transmitter I/Q imbalance pre-compensator block 404.1 pre-distorting the signals generated by the baseband processor 102 (i.e., $x_i[n]$ and $x_q[n]$) prior to these signals being delivered to the TX RF analog front end 106 as pre-distorted real and imaginary component signals x'$_i$[n] and x'$_q$[n].

However, because the transmitter design 400 performs continuous I/Q imbalance calibration in closed-loop, the transmitter design 400 does not require any explicit I/Q imbalance estimation block (e.g. block 204.3, as shown in FIG. 2). Instead, the transmitter I/Q imbalance closed-loop compensation block 404.2 functions to directly tune the transmitter I/Q imbalance pre-compensator block 404.1. To do so, the transmitter I/Q imbalance pre-compensator block 404.1 and the transmitter I/Q imbalance closed-loop compensation block 404.2 may be implemented with one or more processor components. These components may be distinct from the baseband processor 102 and the DSP block 104, or may be implemented as part of the baseband processor 102 and/or the DSP block 104, as discussed with reference to FIG. 1.

In any event, in contrast to the discontinuous closed-loop calibration method implemented by the transmitter design 200, the transmitter I/Q imbalance pre-compensator block 404.1 does not utilize the estimated I/Q imbalance parameters as control inputs. Instead, the transmitter design 400 implements closed-loop control (or closed loop parameter adaptation) algorithms to directly tune the transmitter I/Q imbalance pre-compensator block 404.1. In an aspect of the disclosure, this may be performed without directly measuring the I/Q imbalances but by executing one or more algorithms that indirectly measure an amount of residual I/Q imbalance. This may be executed, for instance, in accordance with optimization criteria, or a cost function that is specified in accordance with specified criteria that attempts to minimize residual I/Q imbalances. For example, the criteria that may be utilized in accordance with such aspects include the conditions (1) and (2) discussed above with regards to the example algorithm to identify I/Q modulator stage non-idealities for Eqns. 1A-10A and (1)-(7). These conditions are repeated immediately below for the reader's convenience.

$$f_y^2(t) \stackrel{?}{\Leftrightarrow} G_L^2[x_i(t)^2 + x_q(t)^2 - 2x_i(t)x_q(t)] \quad \text{Condition 1}$$

$$\frac{f_{yi}(t)}{|x_i(t)|} \stackrel{?}{\Leftrightarrow} \frac{f_{yq}(t)}{|x_q(t)|} \quad \text{Condition 2}$$

Offline Synchronization and Compensation of Envelope Detector Gain Imbalances

Figure 5:
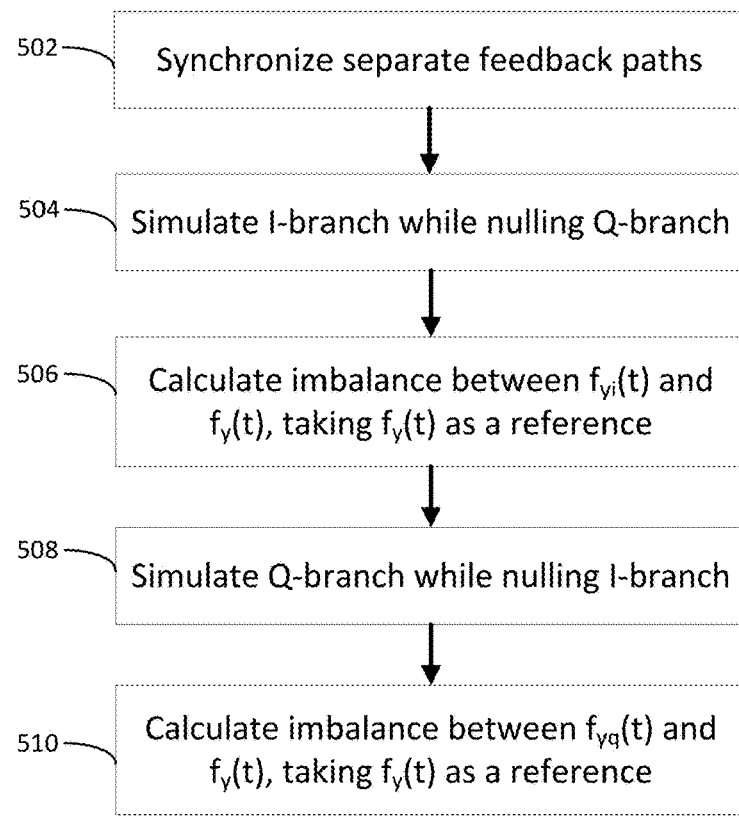
FIG. 5 illustrates an example flow for offline synchronization and compensation of envelope detector (ED) imbalances in accordance with an aspect of the disclosure.

FIG. 5 illustrates an example flow for offline synchronization and compensation of envelope detector (ED) imbalances. The transmitter designs 100, 200, 400 discussed above can be affected by gain-imbalances between the three EDs 136.1, 136.2, 136.3 on the three feedback loops. Additionally, time misalignments between each of the three ED feedback loops may influence the operation of I/Q detection and calibration. Therefore, to correct this potential issue, aspects include any of the transmitter designs 100, 200, and 400 further implementing an offline method in which special-crafted training patterns may be used to calibrate the EDs, thus compensating for these issues. In various aspects, these training patterns may include any suitable number and/or type of sequences to facilitate ED calibration and synchronization, such as Golay complementary sequences, Barker sequences, etc.

One such technique to do so is shown in FIG. 5 as an example flow 500. Flow 500 begins with the synchronization of the separate feedback paths (block 502). For instance, the time delays between each feedback path may be compensated for by digitally time-aligning the feedback signals f$_{yi}$[n], f$_{yq}$[n], and f$_y$[n]. Once the feedback signals are time-aligned, flow 500 may include the I-branch being stimulated while the Q-branch is nulled (block 504). For instance, this could include the transmitter I/Q imbalance pre-compensator block 204.1 (as shown in FIG. 2) providing, as the pre-distorted real component signal x'$_i$[n], a predefined training pattern. While doing so, the transmitter I/Q imbalance pre-compensator 204.1 may provide, as the digital baseband imaginary component signal x'$_q$[n], a nulling signal or a signal that accomplishes a similar effect (e.g., a stream of "zero" valued samples).

In this configuration, flow 500 may include calculating and synchronizing for imbalances between the I-branch envelope feedback signal f$_{yi}$(t) and the I/Q envelope feedback signal f$_y$(t), taking the I/Q envelope feedback signal f$_y$(t) as a reference while doing so (block 506). The calculation and synchronization may be performed, for example, via DSP block 104 (as shown in FIG. 1), the TX I/Q imbalance identification block 204.3 (as shown in FIG. 2), the transmitter I/Q imbalance closed-loop compensation block 404.2 (as shown in FIG. 4), etc., depending upon the particular transmitter design that is implemented.

Flow 500 may continue after the imbalances between the I-branch envelope feedback signal f$_{yi}$(t) and the I/Q envelope feedback signal f$_{yi}$(t) have been calculated and synchronized (block 506) with the Q-branch being stimulated while the I-branch is nulled (block 508) in a similar manner as explained above at block 504. Flow 500 may include calculating and synchronizing for imbalances between the Q-branch envelope feedback signal f$_{yq}$(t) and the I/Q envelope feedback signal f$_y$(t), taking the I/Q envelope feedback signal f$_y$(t) as a reference while doing so (block 510). In this way, the flow 500 allows for imbalances between the envelope detectors to be calibrated offline, prior to the execution of the online closed loop I/Q imbalance calibrations discussed above.

Amplifier Stage Non-Idealities

Figure 6:
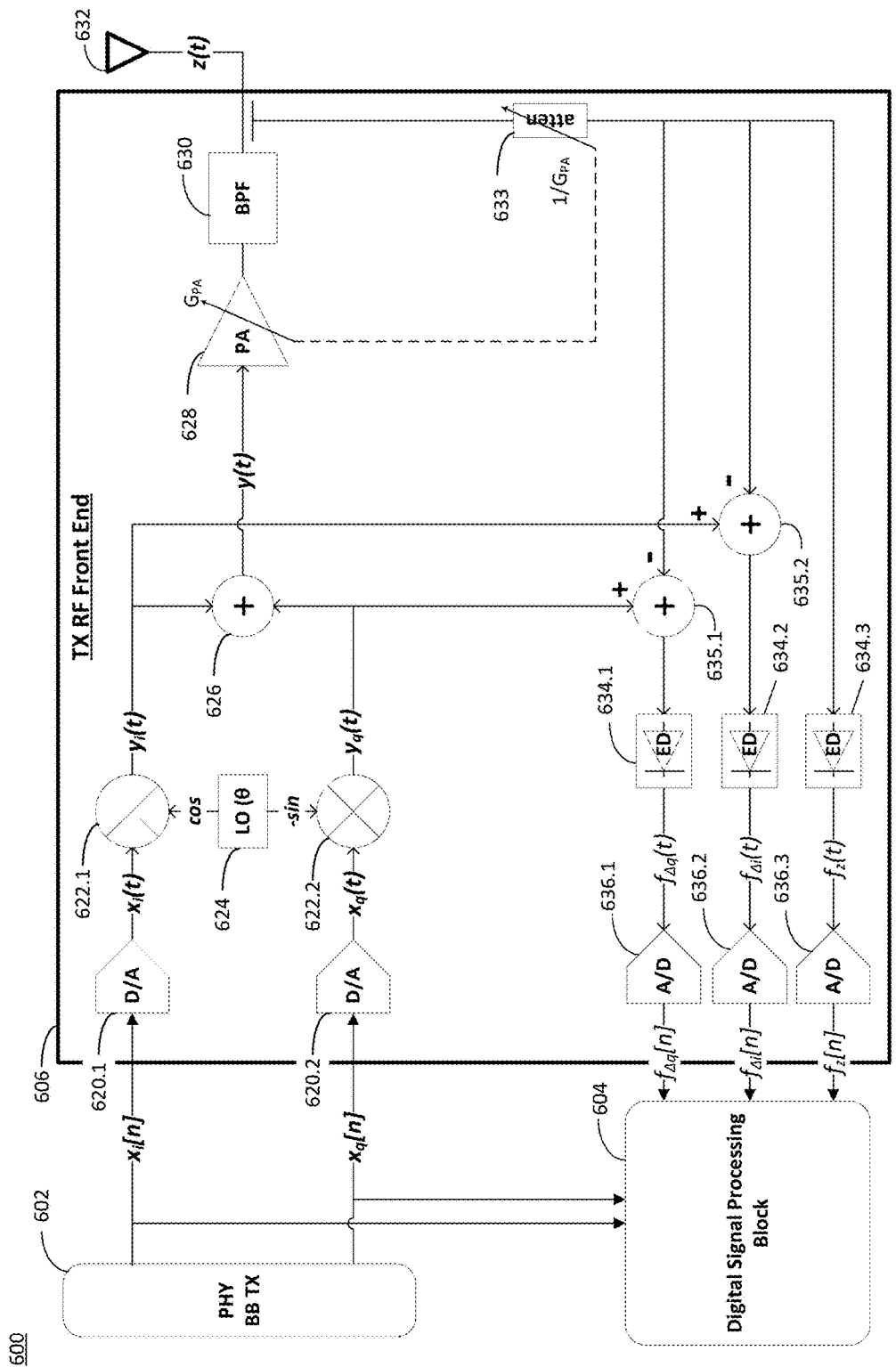
FIG. 6 illustrates a block diagram of an example transmitter design implementing online closed-loop identification of amplifier stage non-idealities in accordance with an aspect of the disclosure.

FIG. 6 illustrates a block diagram of an example transmitter design implementing online closed-loop identification of amplifier stage non-idealities in accordance with an aspect of the disclosure.

The transmitter design 600 shares several components and an overall architecture similar to the transmitter designs 100, 200, 400 as shown in FIGS. 1, 2, and 4, respectively. However, and as will be further discussed below, the transmitter design 600 is directed to aspects in which amplifier stage non-idealities are identified and corrected as opposed to the I/Q modulator stage non-idealities as discussed above with reference to FIGS. 1-5.

As shown in FIG. 6, the transmitter design 600 may include a baseband processor 602, a DSP block 604, and a TX RF front end 606. The baseband processor 602 may be implemented as any suitable number and/or type of computer-based processor configured to perform typical baseband processing functions and/or to control various functions of the transmitter and/or a device in which transmitter design 600 is implemented. For example, the baseband processor 602 may be configured to generate the digitized representation of the baseband signal to be up-converted and transmitted wirelessly via the antenna 632, which may be represented in FIG. 6 as digital baseband real (i) component samples x$_i$[n] and digital baseband imaginary (q) component samples x$_q$[n].

The TX RF front end 606 may include an i branch and a q branch, with each of these branches converting the digital baseband signals to analog signals, and up-converting the analog baseband signals, in quadrature, to a different frequency for transmission. In particular, the I branch may include the D/A converter 620.1, which converts the digital baseband real (I) component samples $x_i[n]$ to analog baseband real component samples $x_i(t)$, which are then mixed with a LO signal provided by LO 624 via mixer 622.1 to generate an up-converted signal $y_i(t)$ (i.e., the in-phase component). Furthermore, the Q branch may include the D/A converter 620.2, which converts the digital baseband imaginary (Q) component samples $x_q[n]$ to analog baseband imaginary component samples $x_q(t)$, which are then mixed with the LO signal (shifted by 90 degrees) provided by the LO 624 vi mixer 622.2 to generate an up-converted signal $y_q(t)$ (i.e., the quadrature component).

An I/Q combiner 626 then combines the in-phase component $y_i(t)$ and the quadrature component $y_q(t)$ to provide a combined I/Q signal y(t). The combined I/Q signal y(t) may then be amplified via one or more amplifier stages. The transmitter design 600 as shown in FIG. 6 includes a single variable gain amplification stage including power amplifier (PA) 628, although aspects include any suitable number of amplifier stages to provide a suitable level of gain for the combined I/Q signal y(t). The amplified combined I/Q signal y(t) is then passed through one or more filters to provide an output signal z(t), which is transmitted via the antenna 632. The transmitter design 600 as shown in FIG. 6 also includes a single filter stage including bandpass filter (BPF) 630, although aspects include transmitter design 600 implementing any suitable number of filter stages and/or filter types to appropriately condition the amplified I/Q signal y(t) for transmission.

The PA 628 introduces non-idealities into the transmitter design 600 in the form of nonlinear memory distortions, which are depicted in FIG. 6 lumped into the PA 628. In other words, FIG. 6 is shown in accordance with a model that condenses all memory nonlinearities in a single PA 628. However, aspects include the techniques described herein being applied to multiple RF gain stages, such as variable gain amplifiers (VGAs), for example. No specific mathematical model has been assigned to the nonlinear memory, however, and different models (with distinct parameters) may be better suited for different scenarios (e.g. the Wiener model, the Hammerstein model, the truncated Volterra series model, etc.).

To compensate for the memory nonlinearities, aspects include the transmitter design 600 implementing feedback paths that probe the in-phase signal component $y_i(t)$ provided by the I branch, the quadrature signal component $y_q(t)$ provided by the Q branch, and the TX output signal z(t). The probed TX output signal z(t) is further attenuated by a variable RF attenuator 633, configured to attenuate the inverse of the variable gain applied by the gain stage 628, to provide the probed output signal $$\frac{z(t)}{G_{PA}}$$

to each or the ED feedback branches. In various aspects, the TX output signal z(t) may be probed using any suitable type of coupling device (e.g., a directional coupler).

Moreover, the transmitter design 600 implements three envelope detectors (ED) 634.1, 634.2, 634.3, each being coupled to a respective analog-to-digital converter (A/D) 636.1, 636.2, 636.3, which provide digital data samples to the DSP block 604. In particular, the ED 634.1 functions to produce a Q-branch envelope feedback signal $f_{\Delta q}(t)$, which represents the envelope of the difference between the quadrature signal component $y_q(t)$ and the probed output signal $$\frac{z(t)}{G_{PA}}.$$

Furthermore, the ED 634.2 functions to produce an I-branch envelope feedback signal $f_{\Delta i}(t)$, which represents the envelope of the difference between the in-phase signal component $y_i(t)$ and the probed output signal $$\frac{z(t)}{G_{PA}}.$$

The remaining ED 634.3 functions to produce a transmitter output envelope feedback signal $f_z(t)$, which represents the envelope of the probed output signal $$\frac{z(t)}{G_{PA}}.$$

The three analog-to-digital converters 636.1, 636.2, 636.3 thus function to digitize the I-branch envelope feedback signal $f_{\Delta i}(t)$, the Q-branch envelope feedback signal $f_{\Delta q}(t)$, and the transmitter output envelope feedback signal $f_z(t)$ to discrete-time feedback signals $f_{\Delta i}[n], f_{\Delta q}[n]$, and $f_z[n]$, as shown in FIG. 6. The DSP block 604 is configured to receive the digitized discrete-time feedback signals $f_{\Delta i}[n]$, $f_{\Delta q}[n]$, and $f_z[n]$ as well as the digital baseband real and imaginary component samples $x_i[n]$, $x_q[n]$ generated by the baseband processor 602. In this way, the DSP block 604 may implement various algorithms, logic, executable instructions, etc., to identify and/or compensate for the aforementioned non-linearities in an online and closed-loop manner without the use of training signals.

To avoid nonlinearity issues on the EDs, aspects include sufficiently attenuating the transmitted output signal z(t) (e.g., to within a linear range of operation of the EDs). This attenuation is captured in two places, the first being a parasitic coupling at the probing node itself, and the second being in the form of the variable attenuator 633, which is controlled (e.g., via the DSP block 604 or the baseband processor 602) to be inversely proportional to the transmitter gain $G_{PA}$. Thus, the dynamic range expected on the instrumented nodes (i.e., the inputs to each ED 634.1, 634.2, 634.3) does not change, and enables designing the EDs 634.1, 634.2, 634.3 to operate in a linear manner.

The DSP block 604 may be tailored for implementing distinct methods using the same transmitter architecture. To do so, the DSP block 604 may be implemented as any suitable number and/or type of computer processors. For example, the DSP block 604 may be implemented as fixed-function digital logic, firmware executing in a DSP, firmware running on an Application Specific Instruction Processor, etc. In various aspects, the functionality provided by the DSP block 604 may be implemented in hardware separate from the baseband processor 602 or integrated as part of the baseband processor 602.

In an aspect, the transmitter design 600 may be implemented to estimate the complex low-pass equivalent (CLE) representation of the transmitted signal in an online manner. To do so, the DSP block 604 may estimate the CLE representation of the transmitted output signal z(t) (considering the nonlinear memory distortions) as $z_{ref}[n]$. In other words, using the digitized discrete-time envelope feedback signals $f_{\Delta i}[n]$, $f_{\Delta q}[n]$, and $f_z[n]$, $z_{ref}[n]$ may be reconstructed as the digitized CLE representation of z(t). In various aspects, as further discussed below, the reconstructed $z_{ref}[n]$ may be used as a reference signal to perform various distinct objectives, such as online identification, online calibration, online self-interference cancellation, etc., with a limited cost in power consumption and instrumentation complexity.

To estimate the reference signal $z_{ref}[n]$ in this way, aspects include the DSP block 604 including and/or accessing a memory location containing executable code. For example, the DSP block 604 may include (or access another external memory that includes) a non-transitory computer-readable memory that stores data and/or instructions such that, when the instructions are executed by processor circuitry associated with the DSP block 604, the DSP block 604 performs the various functions described herein. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM).

In any event, the DSP block 604 may be configured to execute such instructions and/or an appropriate algorithm that analyzes the digital baseband real and imaginary component samples $x_i[n]$ and $x_q[n]$ in conjunction with the digitized discrete-time envelope feedback signals $f_{\Delta i}[n]$, $f_{\Delta q}[n]$, and $f_z[n]$ to estimate the CLE representation $z_{ref}[n]$ of the transmitted output signal z(t) and/or nonlinearities in one or more amplifier stages. In various aspects, the DSP block 604 may execute a closed-loop transmitter output CLE estimation, which may be produced in either complex-polar representation or in complex-quadrature representation. An example of the processor steps associated with an algorithm for each representation is provided below.

Example Algorithms to Estimate the CLE Representation of the Transmitted Output Signal Two example algorithms are provided to estimate the CLE representation of the transmitted output signal in accordance with aspects of the present disclosure. The first of these two algorithms estimates the CLE representation of the transmitted output signal in complex-quadrature domain, while the second algorithm estimates the CLE representation of the transmitted output signal in the complex-polar domain. In both cases, the algorithms assume that the up-conversion common gain $G_{UP}$ (the composition of the up-conversion common linear gain and the envelope feedback common linear gain, not depicted in the Figures) is known (i.e., $G_{UP}$ has been pre-characterized for the example algorithms for purposes of brevity). Note that, in some aspects, the algorithms may be modified to include alternate or additional steps, e.g., to attempt to simultaneously estimate the up-conversion common gain $G_{UP}$, and thus this pre-characterization may not be required.

It will be understood that the algorithms used to identify the CLE representation of the transmitted output signal may include additional, alternate, or fewer steps. Moreover, it is assumed for these example algorithms that the transmitter digital quadrature baseband inputs (i.e., $x_i[n]$ and $x_q[n]$) and the digitized envelope feedbacks (i.e., $f_{\Delta i}[n]$, $f_{\Delta q}[n]$, and $f_z[n]$) are digitally time-aligned. Loopback delays should thus be characterized up-front to enable digital domain alignment. Note that, in some aspects, the algorithms may be modified to include alternate or additional steps, e.g., to attempt to simultaneously track the loopback delays, and thus this pre-characterization may not be required.

As an initial matter regarding the example algorithms, a mathematical complex low-pass equivalent (CLE) representation for the sampled signals (i.e., $y_i(t)$, $y_q(t)$, and z(t)), and the feedback envelope signals (i.e., $f_{\Delta i}(t)$, $f_{\Delta q}(t)$, and $f_z(t)$) is presented as follows, with the CLE representation of an RF signal being indicated with a tilde accent and, in particular $\tilde{z}(t)$ is the CLE representation of $$\frac{z(t)}{G_{PA}},$$

i.e. the CLE representation of the attenuator 633 output:

$$\tilde{y}_i(t) = G_{UP} x_i(t) \qquad \text{Eqn. 1B:}$$

$$\tilde{y}_q(t) = G_{UP} x_q(t) \qquad \text{Eqn. 2B:}$$

$$\tilde{y}(t) = \tilde{y}_i(t) + j\tilde{y}_q(t) \qquad \text{Eqn. 3B:}$$

$$f_{\Delta i}(t) = |\tilde{y}_i(t) - \tilde{z}(t)| = |G_{UP} x_i(t) - \tilde{z}(t)| \qquad \text{Eqn. 4B:}$$

$$f_{\Delta q}(t) = |\tilde{y}_q(t) - \tilde{z}(t)| = |jG_{UP} x_i(t) - \tilde{z}(t)| \qquad \text{Eqn. 5B:}$$

$$f_z(t) = \tilde{z}(t) \qquad \text{Eqn. 6B:}$$

Figure 10:
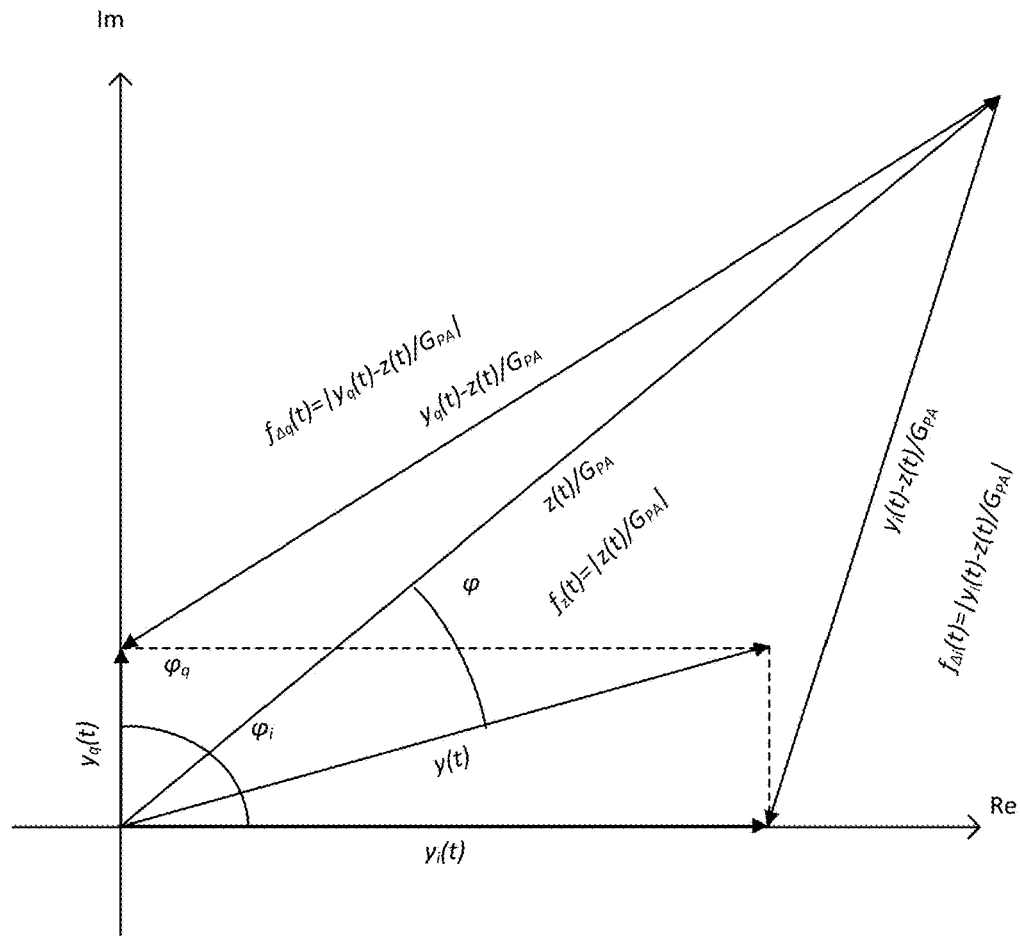
FIG. 10 illustrates a quadrature view of envelope feedback signals in accordance with an aspect of the disclosure.

The following algorithm is performed in the complex quadrature domain, which is illustrated in FIG. 10 with a quadrature view of the envelope feedback signals in accordance with an aspect of the disclosure. It should be noted that the complex quadrature domain illustration 1000 shown in FIG. 10 is not to scale. Moreover, the following algorithm assumes time-alignment (of digitized signals), and may be executed in the complex quadrature domain based on the transmitter design 600 described above with reference to FIG. 6 (e.g., by the DSP block 604). In accordance with such aspects, the following equations may be utilized to execute an algorithm to estimate the signed quadrature components of the transmitter output CLE representation, i.e., $\hat{\tilde{z}}_i$ and $\hat{\tilde{z}}_q$:

$$f_{\Delta i}^2(t) = G_{UP}^2 x_i(t)^2 - 2G_{UP} x_i(t) \tilde{z}_i(t) + \tilde{z}_i(t)^2 + \tilde{z}_q(t)^2 \qquad \text{Eqn. 7B:}$$

$$f_{\Delta q}^2(t) = G_{UP}^2 x_q(t)^2 - 2G_{UP} x_q(t) \tilde{z}_q(t) + \tilde{z}_i(t)^2 + \tilde{z}_q(t)^2 \qquad \text{Eqn. 8B:}$$

$$2f_{\Delta i}^2(t) - 2f_z^2(t) = 2G_{UP}^2 x_i(t)^2 - 4G_{UP} x_i(t) \tilde{z}_i(t) \qquad \text{Eqn. 9B:}$$

$$2f_{\Delta q}^2(t) - 2f_z^2(t) = 2G_{UP}^2 x_q(t)^2 - 4G_{UP} x_q(t) \tilde{z}_q(t) \qquad \text{Eqn. 10B:}$$

The example transmitter output CLE estimation algorithm may thus be executed in accordance with the following steps:

$$\hat{y}_i(t) = G_{UP} x_i(t) \qquad (1)$$

$$\hat{y}_q(t) = G_{UP} x_q(t) \qquad (2)$$

$$P_i(t) = 2f_{\Delta i}^2(t) - 2f_z(t) \qquad (3)$$

$$P_q(t) = 2f_{\Delta q}^2(t) - 2f_z(t) \qquad (4)$$

$$\hat{\tilde{z}}_i = \frac{2G_{UP}^2 x_i(t)^2 - P_i}{4G_{UP} x_i(t)} \qquad (5)$$

-continued $$\hat{\tilde{z}}_q = \frac{2G_{UP}^2 x_q(t)^2 - P_q}{4G_{UP} x_q(t)} \quad (6)$$

The next algorithm is performed in the complex polar domain to take advantage of the already-measured downscaled envelope, i.e., $f_z(t)$, thus requiring only to correct the scale of the magnitude and estimate the angle, i.e. producing $\hat{p}_z$ and $\hat{\varphi}_z$. In the following aspect, the algorithm uses the law of cosines to estimate absolute value of the angles $\varphi_i$ and $\varphi_q$, as shown in FIG. 10. In the following, the law of cosines will be represented by the following operator:

$$coslaw[y_c, f_z, f_{\Delta c}] := \cos^{-1}\left\{\frac{(|y_c|^2 + f_z^2 - f_{\Delta c}^2)}{2 \cdot |y_c| \cdot f_z}\right\}, \quad \text{Eqn. 11B}$$

where $y_c$ represents one of the upconverted branches (components), i.e. $\hat{y}_i(t)$ or $\hat{y}_q(t)$, and $f_{\Delta c}$ represents the corresponding envelope feedback, i.e. $f_{\Delta i}(t)$ or $f_{\Delta q}(t)$. Other functions utilized by this algorithm are presented as mappings in Table 1 and Table 2 below. The concept behind the algorithm is estimating $\varphi_z$ from $|\varphi_i|$ and $|\varphi_q|$, while the relationship between them is dependent on the input quadrant (for $\tilde{y}(t)$) and the output quadrant (for $\tilde{z}(t)$).

Table 1 below represents OQ=OutQuadrantDetect(I/Q, NI): Input Quadrant (I/Q and Nearest Index (NI) Mapping to Output Quadrant (OQ).

TABLE 1

|  | NI 1 | NI 1 | NI 2 | NI 3 |
|---|---|---|---|---|
| I/Q 1 | OQ3 | OQ2 | OQ4 | OQ1 |
| I/Q 2 | OQ4 | OQ1 | OQ3 | OQ2 |
| I/Q 3 | OQ1 | OQ4 | OQ2 | OQ3 |
| I/Q 4 | OQ2 | OQ3 | OQ1 | OQ4 |

Table 2 below represents OA=GetTxOutAngle(I/Q, OQ): Input Quadrant (I/Q) and Output Quadrant (OQ) Mapping to Output Angle (OA).

TABLE 2

|  | OQ 1 | OQ 2 | OQ 3 | OQ 4 |
|---|---|---|---|---|
| I/Q 1 | $|(\varphi_i(t)| - \varphi_x(t)$ | $+|\varphi_i(t)|$ | $-|\varphi_i(t)|$ | $-|\varphi_i(t)|$ |
| I/Q 2 | $\pi - |\varphi_i(t)|$ | $|\varphi_q(t)| - (\varphi_x(t)\frac{\pi}{2})$ | $|\varphi_i(t)| - \pi$ | $|\varphi_i(t)| - \pi$ |
| I/Q 3 | $\pi - |\varphi_i(t)|$ | $\pi - |\varphi_i(t)|$ | $-|\varphi_q(t)| - \varphi_x(t) + \frac{\pi}{2}$ | $|\varphi_i(t)| - \pi$ |
| I/Q 4 | $+|\varphi_i(t)|$ | $+|\varphi_i(t)|$ | $-|\varphi_i(t)|$ | $-|\varphi_i(t)| - \varphi_x(t)$ |

With continued reference to FIG. 11, the TX output CLE estimation algorithm may thus be executed as follows:

in_quadrant := input quadrant based on signs for $x_i(t)$ and $x_q(t)$ (1)

$\hat{y}_i(t) = G_{UP} x_i(t)$ (2)

$\hat{y}_q(t) = G_{UP} x_q(t)$ (3)

$\varphi_x(t) = \tan^{-1}\left(\frac{x_q(t)}{x_i(t)}\right)$ (4)

$|\varphi_q(t)| = coslaw[\hat{y}_q(t), f_z(t), f_{\Delta q}(t)]$ (5)

$|\varphi_i(t)| = coslaw[\hat{y}_i(t), f_z(t), f_{\Delta i}(t)]$ (6)

$idx[0] = \frac{\pi}{2} + |\varphi_i(t)| + |\varphi_q(t)|$ (7)

$idx[1] = \frac{\pi}{2} + |\varphi_i(t)| - |\varphi_q(t)|$ (8)

$idx[2] = \frac{\pi}{2} - |\varphi_i(t)| + |\varphi_q(t)|$ (9)

$idx[3] = \frac{\pi}{2} - |\varphi_i(t)| - |\varphi_q(t)|$ (10)

nearest_idx := (11)
 idx[ ] array index holding the value nearest to a multiple of $2\pi$ out_quadrant = OutQuadrantDetect(in_quadrant, nearest_idx) (12)

$\hat{\varphi}_z = GetTxOutAngle$(in_quadrant, out_quadrant) (13)

$\hat{p}_z = G_{UP} f_z(t)$ (14)

Note that the two algorithms presented above may be sensitive to I/Q imbalances, i.e., the existence of I/Q imbalances will disrupt the capability to effectively reconstruct the reference signal. However, while other more complex algorithms may be tolerant to I/Q imbalances, the algorithms shown above assume that the I/Q imbalance has already been corrected. As discussed above with reference to FIGS. 1-5, the transmitter designs 100, 200, 400 may utilize a similar architecture exploiting the same envelope detectors in a slightly different configuration to achieve closed-loop online I/Q imbalance compensation. Thus, this assumption is reasonable in that the above-referenced I/Q imbalance compensation techniques may be applied to the transmitter design 600, thus providing a simplified overall solution. The implementation of a single transmitter design that provides both I/Q imbalance compensation and nonlinearity compensation is further discussed below with reference to FIG. 12.

Figure 7:
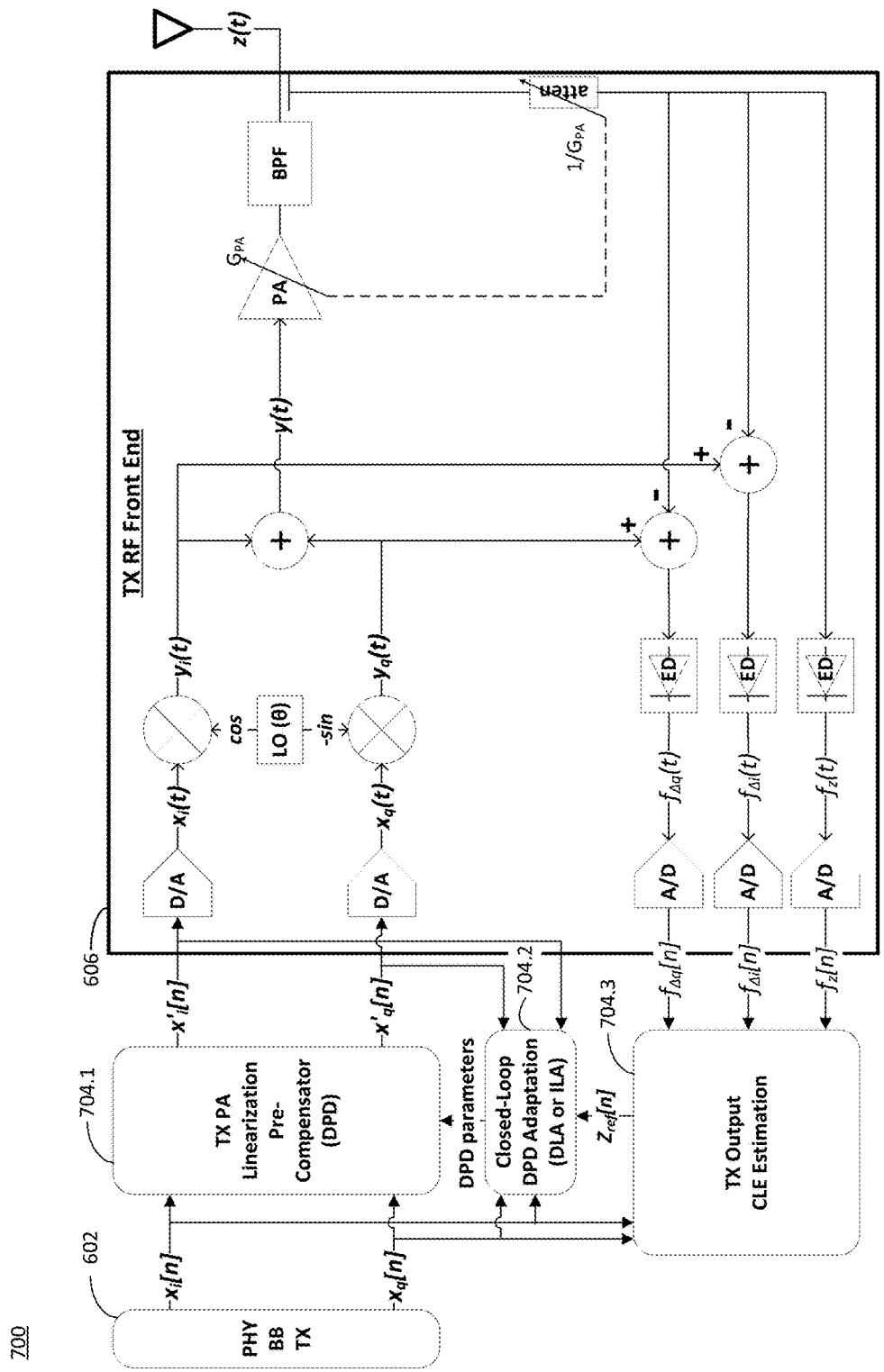
FIG. 7 illustrates a block diagram of an example transmitter design implementing closed-loop online digital pre-distortion adaptation using a calculated transmitter output complex-lowpass equivalent (CLE) reference reconstruction in accordance with an aspect of the disclosure.

Closed-Loop Online Digital Pre-Distortion (DPD) Adaptation Based on the Transmitter Output CLE Reference FIG. 7 illustrates a block diagram of an example transmitter design implementing closed-loop online digital pre-distortion adaptation using a calculated transmitter output complex-lowpass equivalent (CLE) reference reconstruction in accordance with an aspect of the disclosure. The example transmitter design 700 shown in FIG. 7 includes a similar architecture as the example transmitter design 600. In particular, both transmitter designs 600 and 700 include a baseband processor 602, a TX RF front end 606, and a feedback loop system including envelope detectors. Additional common components of transmitter designs 600 and 700 are not labeled in FIG. 7 for purposes of brevity.

However, as compared to transmitter design 600, the transmitter design 700 alternately includes a transmitter PA linearization pre-compensator block 704.1, a closed-loop DPD adaptation block 704.2, and a transmitter output CLE estimation block 704.3. In some aspects, the transmitter PA linearization pre-compensator 704.1, closed-loop DPD adaptation block 704.2, and transmitter output CLE estimation block 704.3 may be identified with the DSP block 604, as shown and discussed with reference to FIG. 6. In other aspects, the transmitter PA linearization pre-compensator block 704.1, closed-loop DPD adaptation block 704.2, and transmitter output CLE estimation block 704.3 may be implemented with one or more processor components that may be distinct from the baseband processor 602 and the DSP block 604. In yet additional aspects, the transmitter PA linearization pre-compensator 704.1, closed-loop DPD adaptation block 704.2, and transmitter output CLE estimation block 704.3 may be implemented as part of the baseband processor 602.

In any event, aspects include the transmitter design 700 implementing closed-loop online digital pre-distortion adaptation based on the transmitter output CLE reference in the digital baseband. To do so, the transmitter PA linearization pre-compensator block 704.1 is coupled between the baseband processor 602 and the TX RF analog front end 606. Aspects include the transmitter PA linearization pre-compensator block 704.1 pre-distorting the signals generated by the baseband processor 602 (i.e., $x_i[n]$ and $x_q[n]$) prior to these signals being delivered to the TX RF analog front end 606. In other words, the transmitter PA linearization pre-compensator block 704.1 pre-distorts the digital baseband signals $x_i[n]$ and $x_q[n]$ in accordance with specific DPD parameters to compensate for nonlinearities in the TX RF analog front end 606. In doing so, the transmitter PA linearization pre-compensator block 704.1 generates pre-distorted real and imaginary component signals $x'_i[n]$ and $x'_q[n]$.

DPD is typically performed in an open-loop procedure (i.e., DPD is trained offline and used in open-loop online). However, aspects include using the TX output CLE reference $z_{ref}[n]$ obtained from the envelope feedback signals $f_{\Delta i}[n], f_{\Delta q}[n]$, and $f_z[n]$ in a manner presented above with reference to FIG. 6, for example. In doing so, the transmitter design 600 may implement any suitable type of closed-loop training methods for DPD in an online manner to provide adaptation to on-the-field variations, with a limited cost in power consumption. Therefore, in an aspect, closed-loop DPD adaptation block 704.2 and the transmitter output CLE estimation block 704.3 may execute a closed loop DPD adaptation algorithm of any suitable type (e.g., in accordance with known DPD training methods) to achieve DPD adaption. In accordance with various aspects, the online closed-loop DPD training methods can be either direct learning (DLA) or indirect learning (ILA) types.

Again, in accordance with an aspect of the present disclosure, the pre-distorted real and imaginary component signals $x'_i[n]$ and $x'_q[n]$ may be generated repeatedly in an online and closed-loop manner via the transmitter PA linearization pre-compensator block 704.1 using the DPD parameters as control inputs. Furthermore, the closed-loop DPD adaptation block 704.2 may receive, as inputs, the signals generated by the baseband processor 602 (i.e., $x_i[n]$ and $x_q[n]$), the generated pre-distorted real and imaginary component signals $x'_i[n]$ and $x'_q[n]$, and the TX output CLE reference $z_{ref}[n]$. Aspects include the closed-loop DPD adaptation block 704.2 monitoring these inputs and dynamically adjusting the DPD parameters provided to the transmitter PA linearization pre-compensator block 704.1, causing the transmitter PA linearization pre-compensator block 704.1 to dynamically update the pre-distorted real and imaginary component signals $x'_i[n]$ and $x'_q[n]$.

Closed-Loop Online Digital Pre-Distortion (DPD) Adaptation Based on Triple Envelope Feedbacks.

Figure 8:
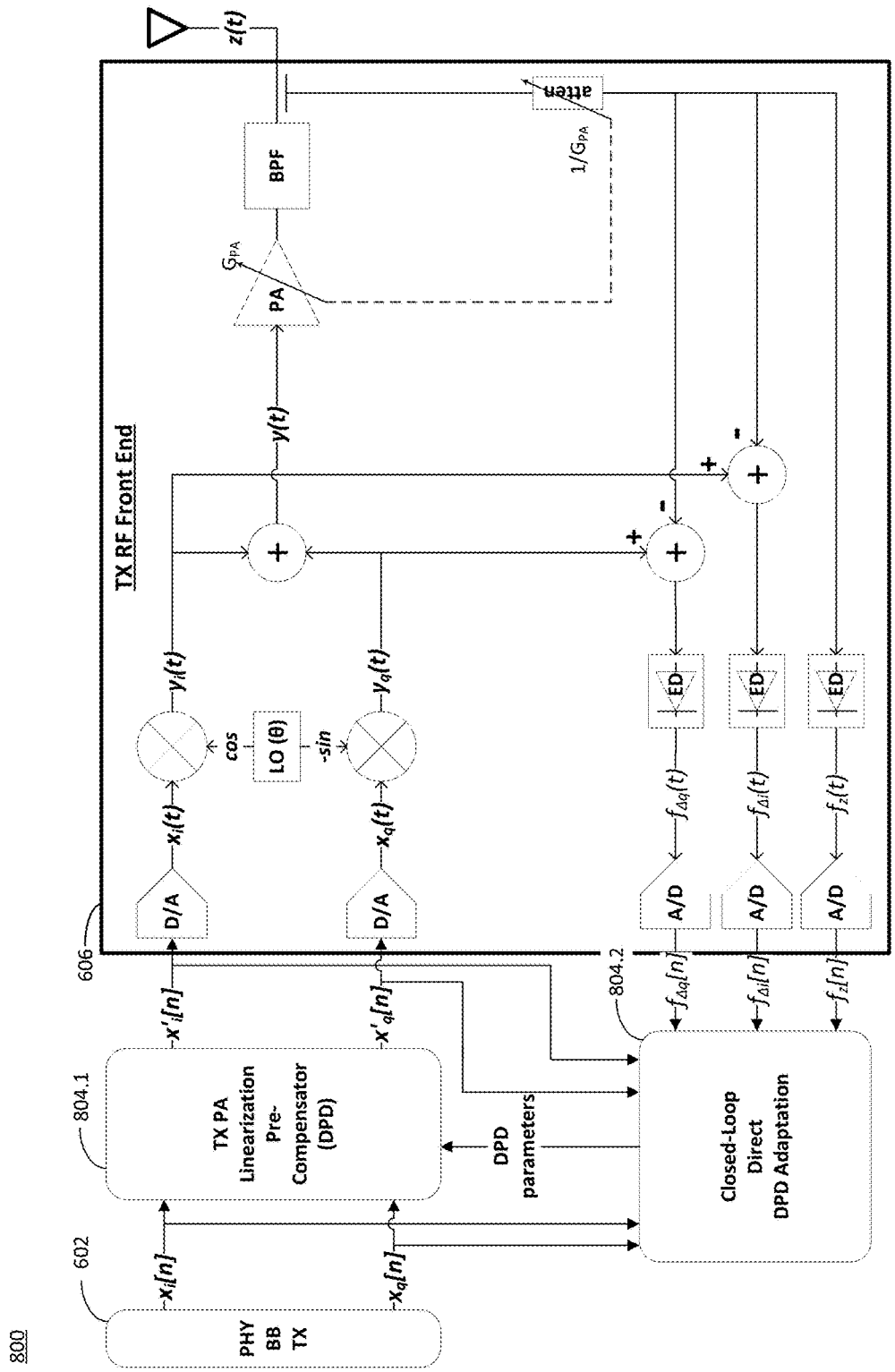
FIG. 8 illustrates a block diagram of an example transmitter design implementing online closed-loop digital pre-distortion adaptation in accordance with an aspect of the disclosure.

FIG. 8 illustrates a block diagram of an example transmitter design implementing online closed-loop digital pre-distortion adaptation in accordance with an aspect of the disclosure. The example transmitter design 800 shown in FIG. 8 includes a similar architecture as the example transmitter designs 600, 700, as shown in FIGS. 6 and 7, respectively. In particular, each of transmitter designs 600, 700, 800 includes a baseband processor 602, a TX RF front end 606, and a feedback loop system including envelope detectors. Additional common components of transmitter design 600, 700, and 800 are not labeled in FIG. 8 for purposes of brevity.

Like the transmitter design 700, the transmitter design 800 also includes a transmitter PA linearization pre-compensator block 804.1 coupled between the baseband processor 602 and the TX RF analog front end 606. Aspects include the transmitter PA linearization pre-compensator block 804.1 pre-distorting the signals generated by the baseband processor 602 (i.e., $x_i[n]$ and $x_q[n]$) prior to these signals being delivered to the TX RF analog front end 606 as pre-distorted real and imaginary component signals $x'_i[n]$ and $x'_q[n]$.

However, in contrast to the closed-loop calibration method implemented by the transmitter design 700, the transmitter PA linearization pre-compensator block 804.1 does not calculate the TX output CLE reference $z_{ref}[n]$. Therefore, the transmitter design 800 alternatively implements a closed-loop direct DPD adaptation block 804.2, and the closed loop DPD adaptation block used by the transmitter design 700 is not needed. Again, the transmitter PA linearization pre-compensator block 804.1 and/or the closed-loop direct DPD adaptation block 804.2 may be identified with the DSP block 604, as shown in FIG. 6, as separate processor components, integrated with the baseband processor 602, etc.

Furthermore, because the TX output CLE reference $z_{ref}[n]$ is not calculated, the adaptation of the DPD parameters may be derived directly from the envelope feedbacks $f_{\Delta i}[n]$, $f_{\Delta q}[n]$, and $f_z[n]$, the digital baseband signals $x_i[n]$ and $x_q[n]$, and the DPD outputs, i.e., the pre-distorted real and imaginary component signals $x'_i[n]$ and $x'_q[n]$. Therefore, in accordance with the present aspects, the closed-loop direct DPD adaptation block 804.2 implements a closed-loop self-tuning controller (or closed loop parameter adaptation) algorithms to directly tune the DPD parameters without directly estimating the TX output CLE reference $z_{ref}[n]$. For example, such algorithms may follow an optimization criteria or cost function, i.e., a function that indirectly measures the amount of residual nonlinearity of the transmitter RF front end 606.

In various aspects, the aforementioned identification of the TX output CLE reference $z_{ref}[n]$ (e.g., as discussed with reference to FIG. 6) and the calculation of DPD parameters (e.g., as discussed with reference to FIGS. 7 and 8) may be combined as part of a single transmitter design. For instance, one or more of the transmitter PA linearization pre-compensator block 704.1, the closed-loop DPD adaptation block 704.2, the transmitter output CLE estimation block 704.3, the transmitter PA linearization pre-compensator block 804.1, and the closed-loop direct DPD adaptation block 804.2 may be implemented as part of the DSP block 604 and in accordance with the architecture of transmitter design 600, as shown in FIG. 6.

In other words, aspects include a single transmitter design architecture supporting closed-loop online DPD adaptation based either directly on the envelope feedbacks $f_{\Delta i}[n]$, $f_{\Delta q}[n]$, and $f_z[n]$, or on the estimated TX output CLE reference $z_{ref}[n]$. In accordance with such aspects, providing the TX output CLE reference $z_{ref}[n]$ as an output enables other processes to use such a reference signal in parallel with the self-calibration of the TX nonlinear memory distortions.

One example of such usage would be self-interference cancellation, in which a reference of the signal sent to the propagation channel is required as part of the echo channel estimation problem.

Another example is the closed-loop online TX nonlinear memory identification in digital baseband. In this method, after estimating the TX output CLE reference $z_{ref}[n]$, the signal can be used in a closed-loop to extract the parameters of a behavioral model. After detecting convergence of such parameters, the results may be presented to an external entity. This implementation may be particularly useful, for example, for self-testing in production lines.

Offline Synchronization and Compensation of Envelope Detector Gain Imbalances

Figure 9:
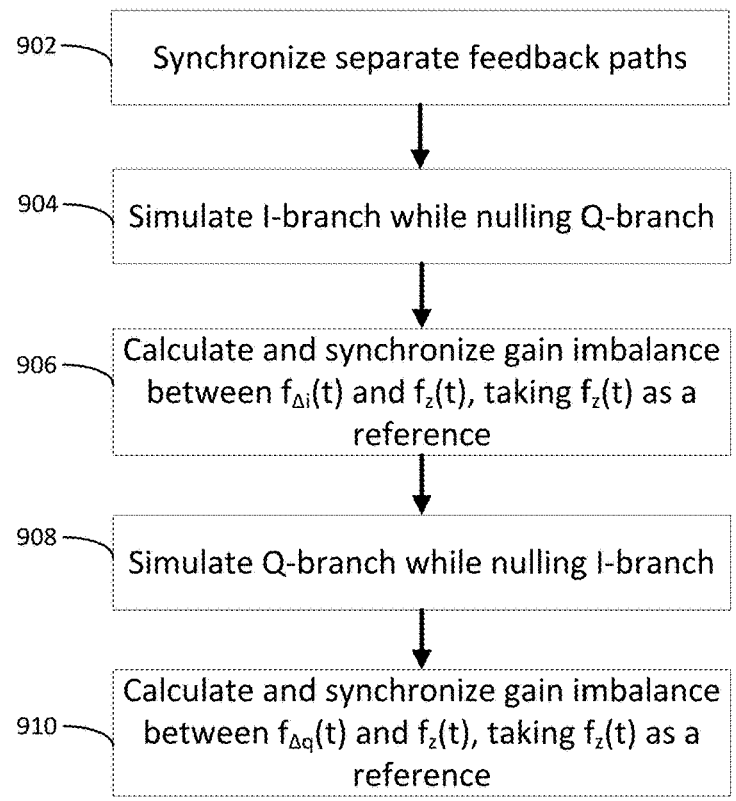
FIG. 9 illustrates an example flow for offline feedback loop synchronization and gain compensation in accordance with an aspect of the disclosure.

FIG. 9 illustrates an example flow for offline feedback loop synchronization and gain compensation. As discussed above with reference to FIG. 1-5, the techniques described herein can be affected by gain-imbalances between the three EDs (i.e., 634.1, 634.2, 634.3) on the three feedback loops, as well as time misalignments between them. Therefore, aspects include correcting this potential issue for the transmitter designs 600, 700, 800 by further implementing an offline method in which specially-crafted training patterns may be implemented to calibrate the EDs 634.1, 634.2, 634.3, thus compensating for these issues. In various aspects, these training patterns may include any suitable number and/or type of sequences to facilitate ED calibration and synchronization, such as Golay complementary sequences, Barker sequences, etc. One such technique to do so is shown in FIG. 9 as an example flow 900. Aspects also include using a similar procedure as the one shown in FIG. 9 for closed-loop offline up-conversion common gain estimation $G_{UP}$, as discussed above with reference to FIGS. 6-8.

One such technique to do so is shown in FIG. 5 as an example flow 900. Flow 900 begins with the synchronization of the separate feedback paths (block 902). For instance, the time delays between each feedback path may be compensated for by digitally time-aligning the envelope feedbacks $f_{Ai}[n]$, $f_{Aq}[n]$, and $f_z[n]$. Once the feedback signals are time-aligned, flow 900 may include the I-branch being stimulated while the Q-branch is nulled (block 904). For instance, this could include the transmitter PA linearization pre-compensator 704.1, as shown in FIG. 7, providing, as the pre-distorted real component signal $x'_i[n]$, a predefined training pattern. While doing so, the transmitter PA linearization pre-compensator 704.1 may provide, as the digital baseband imaginary component signal $x'_q[n]$, a nulling signal or a signal that accomplishes a similar effect (e.g., a stream of "zero" valued data samples).

In this configuration, flow 900 may include calculating and synchronizing for imbalances between the I-branch envelope feedback signal $f_{Ai}(t)$ and the transmitter output feedback signal $f_z(t)$, taking the transmitter output envelope feedback signal $f_z(t)$ as a reference while doing so (block 906). The calculation and synchronization may be performed, for example, via the DSP block 604, the closed-loop DPD adaptation block 704.2, the transmitter output CLE estimation block 704.3, the closed-loop direct DPD adaptation block 804.2, etc., depending on the particular transmitter design that is implemented.

Flow 900 may continue after the imbalances between I-branch envelope feedback signal $f_{Ai}(t)$ and the transmitter output envelope feedback signal $f_z(t)$ have been calculated and synchronized (block 906), with the Q-branch being stimulated while the I-branch is nulled (block 908) in a similar manner as explained above at block 904. Flow 900 may include calculating and synchronizing for imbalances between the Q-branch envelope feedback signal $f_{Aq}(t)$ and the transmitter output envelope feedback signal $f_z(t)$, taking transmitter output envelope feedback signal $f_z(t)$ as a reference while doing so (block 910). In this way, the flow 900 allows for gain imbalances between the envelope detectors to be calibrated offline, prior to the execution of the online closed-loop calibrations as discussed above with reference to FIGS. 6-8.

Time-Switched Online Closed-Loop Identification and Calibration of I/Q Modulator Stage and Amplifier Stage Non-Idealities The aspects discussed herein with reference to FIGS. 1-5 are directed to solutions for closed-loop online transmitter I/Q modulator stage non-idealities, such as gain imbalances, phase imbalance, and common loopback gain. On the other hand, the aspects discussed with reference to FIGS. 6-11 are directed to solutions for transmitter output reference regeneration, which enables closed-loop online TX linearization. Aspects include transmitter designs separately implementing either of these solutions or, as discussed further below with reference to FIG. 12, to concurrently support both solutions.

FIG. 12 illustrates a block diagram of an example transmitter design that performs time-switched compensation of online closed-loop compensation of I/Q modulator stage non-idealities and online closed-loop compensation of amplifier stage non-idealities in accordance with an aspect of the disclosure. The example transmitter design 1200 shown in FIG. 12 includes a similar architecture as the previous example transmitter designs 400, 800, as shown in FIGS. 4 and 8, respectively. In particular, each of transmitter designs 400, 800, 1200 includes a baseband processor 102, 602, 1202, a TX RF front end 106, 606, 1206, and a feedback loop system including envelope detectors. Additional common components of transmitter designs 400, 800, 1200 are not labeled in FIG. 12 for purposes of brevity.

The transmitter design 1200 also implements some common features from the previous transmitter designs. For example, the transmitter design 1200 implements a transmitter PA linearization pre-compensator block 1204, which may be identified with the transmitter PA linearization pre-compensator block 804.1 as shown in FIG. 8. The transmitter PA linearization pre-compensator 1204 is configured to receive the digital baseband real component samples $x_i[n]$ and digital baseband imaginary component samples $x_q[n]$ generated by the baseband processor 1202, and to generate pre-distorted real and imaginary component signals $x'_i[n]$ and $x'_q[n]$ based upon DPD parameters received from the switching DSP block 1210.

Furthermore, the transmitter design 1200 implements a transmitter I/Q imbalance pre-compensator block 1205, which may be identified with the transmitter I/Q imbalance pre-compensator block 404.1, as shown in FIG. 4. The transmitter I/Q imbalance pre-compensator block 1205 is configured to receive the pre-distorted real and imaginary component signals $x'_i[n]$ and $x'_q[n]$ from the transmitter PA linearization pre-compensator block 1204 and to generate pre-distorted real and imaginary component signals $x^*_i[n]$ and $x^*_q[n]$ based upon tuning control signals received from the switching DSP block 1210.

In various aspects, the switched DSP block 1210 may be associated with each of DSP blocks 104, 604 as shown in FIGS. 1 and 6, respectively. Therefore, in an aspect, the DSP block 1210 may be identified with the compensation closed-loop logic block 204.2 and the transmitter imbalance identification block 204.3, as shown in FIG. 2, as well as the closed-loop DPD adaptation block 704.2 and the transmitter output CLE estimation block 704.3, as shown in FIG. 7. In other words, aspects include the transmitter PA linearization pre-compensator block 1204, the transmitter I/Q imbalance pre-compensator block 1205, and the switched DSP block 1210 being implemented as one or more processor components (e.g., a single DSP) that may selectively perform any of the aforementioned functions as discussed above with regards to the transmitter designs referenced in FIGS. 1-11.

To do so, the transmitter design 1200 may be configured to operate in two different modes in a time-switched manner. In the first of these two modes, the transmitter design 1200 may operate in a transmitter I/Q imbalance (TXIQ) mode to compensate for I/Q modulator non-idealities, as discussed above with reference to the transmitter designs 100, 200, 400 of FIGS. 1, 2, and 4, respectively. In the second of the two modes, the transmitter design 1200 may operate in a transmitter output reference and adaptive digital pre-distortion (TXOR-ADPD) mode to compensate for amplifier stage non-idealities, as discussed above with reference to the transmitter designs 600, 700, 800 of FIGS. 6, 7, and 8, respectively.

To facilitate time-switching operations between the TXIQ and the TXOR-ADPD modes, transmitter design 1200 implements switches 1220, 1230, which are controlled by a mode selection line coupled to each switch and to the switched DSP block 1210. Each of these switches 1220, 1230 may be implemented as any suitable type of switch to effectively couple signals in accordance with the aspects described herein. For example, the switches 1220, 1230 may be implemented as RF switches, transistors, signal switches such as demultiplexers, etc.

Regardless of the implementation of switches 1220, 1230, each of the switches 1220, 1230 may be configured to feed the appropriate signals into the envelope feedback loop based upon the current mode of operation of the transmitter design 1200. For example, the switch 1220 may be configured to provide the attenuator with one of a gain setting $G_{PA}$ associated with the power amplifier or a '0' gain setting that effectively results in the attenuator applying full attenuation to the coupled transmitted output signal z(t).

As a result, when in the TXIQ mode, the switching DSP block 1210 may send a control signal to the switch 1220 to select the '0' line, resulting in the transmitted output signal z(t) to be fully attenuated, essentially no signal to be probed from the transmitted output signal z(t), and thus coupling no signal onto the node 1250. Furthermore, when in the TXOR-ADPD mode, the switching DSP 1210 may send a control signal to the switch 1220 to set the attenuator setting to $$\frac{1}{G_{PA}},$$

thus coupling the probed transmitted output signal $$\frac{z(t)}{G_{PA}}$$

onto the node 1250.

Furthermore, when in the TXIQ mode, the switching DSP block 1210 may send a control signal to the switch 1230 to select the combined I/Q signal y(t) after passing through the PA, causing the signal y(t) to be coupled onto the node 1260. And when in the TXOR-ADPD mode, the switching DSP 1210 may send a control signal to the switch 1230 causing the probed output signal z(t), attenuated by the attenuator 633, which is selected via the switch 1220 in the same mode, to be coupled onto node 1260. In other words, the transmitter design 1200 allows for the switching DSP 1210 to receive different types of envelope feedback signals depending upon the current selected mode of operation.

For example, in the TXIQ mode, the digitized signal $f_1[n]$ represents a digitized version of $f_1(t)$ which, in this mode, represents the Q-branch envelope feedback signal $f_{yq}(t)$, as the transmitted output signal z(t) is fully attenuated and thus not sampled based upon the selection made via switch 1220. Similarly, in the TXIQ mode, the digitized signal $f_2[n]$ represents a digitized version of $f_2(t)$ which, in this mode, represents the I-branch envelope feedback signal $f_{yi}(t)$. Finally, in the TXIQ mode, the digitized signal $f_3[n]$ represents a digitized version of $f_3(t)$ which, in this mode, represents the combined I/Q envelope feedback signal $f_y(t)$, as the switch 1230 couples node 1260 to the output of the PA in this mode.

As another example, in the TXOR-ADPD mode, the digitized signal $f_1[n]$ represents a digitized version of $f_1(t)$ which, in this mode, represents the Q-branch envelope feedback signal $f_{Aq}(t)$, or the envelope of the difference between the imaginary signal component $y_q(t)$ and the sampled output signal $$\frac{z(t)}{G_{PA}}.$$

Similarly, in the TXOR-ADPD mode, the digitized signal $f_2[n]$ represents a digitized version of $f_2(t)$ which, in this mode, represents I-branch envelope feedback signal $f_{Ai}(t)$, or the envelope of the difference between real signal component $y_i(t)$ and the sampled output signal $$\frac{z(t)}{G_{PA}}.$$

Finally, in the TXOR-ADPD mode, the digitized signal $f_z[n]$ represents a digitized version of $f_3(t)$ which, in this mode, represents the transmitter output envelope feedback signal $f_z(t)$, as the switch 1230 couples node 1260 to node 1250 in this mode.

Thus, the transmitter design 1200 advantageously addresses I/Q imbalances within part of the same design that addresses transmitter nonlinearities. As a result, the transmitter design 1200 allows the transmitter nonlinearities to be addressed in a system that also has I/Q imbalances present, as these can be compensated for as discussed herein.

Moreover, aspects include each of the TXIQ mode and the TXOR-ADPD mode being operated in a mutually exclusive manner. For instance, in the TXOR-ADPD mode, the transmitter front end output CLE representation may be calculated and used as a reference of the transmitter output signal z(t) in the complex digital baseband, which can be immediately used for any suitable purpose. Furthermore, in the TXOR-ADPD mode, closed-loop adaptation of the digital pre-distorter (DPD) model parameters may be performed (either with direct learning or indirect learning) using the transmitter output reference, or by directly processing the envelope feedbacks and the digital baseband signal. And in the TXIQ mode, the envelope feedbacks and the digital baseband signal may be processed to perform closed-loop pre-compensation of I/Q imbalances by tuning the parameters of transmitter I/Q imbalance pre-compensator block 1205.

Thus, aspects include the switching DSP block 1210 using any suitable distinct algorithms, which may be mutually exclusive from one another, to generate the transmitter output reference, to identify or linearize the transmitter front end 1206, or to identify or compensate for transmitter I/Q imbalances. For example, the algorithms may be those previously discussed herein with reference to the transmitter designs 100, 200, 400, 600, 700, 800 of FIGS. 1, 2, 4, 6, 7, and 8, respectively. Moreover, aspects include the switching DSP block 1210 executing distinct classes of algorithms, such as model-based adaptive or statistical signal processing algorithms, data trained regressions (or other supervised learning models), etc.

The transmitter design 1200 offers several advantages over traditional transmitter designs. In particular, in aspects, the transmitter design 1200 may jointly enable online pre-compensation of the I/Q imbalance, online reconstruction of transmitter front end output CLE equivalent representation as a reference signal and, based on the reference signal, perform closed-loop online identification and linearization of the transmitter front end 1206. As a result, transmitter design 1200 (and others disclosed herein) is independent of the communication protocol in which the transmitter design is used to transmit data. Moreover, the transmitter design 1200 enables continuous tracking/compensation of non-idealities in the field (while the transmitter front-end is being used by the communications link) making the transmitter device robust to on-the-field variations.

And, compared with quadrature down-converter based feedback methods, the transmitter design 1200 presents a low complexity and low power consumption solution. Furthermore, while the transmitter front end 1206 is being continuously linearized on the field, the reconstructed transmitter output reference can be simultaneously used for other purposes, like self-interference cancellation. Additionally, the transmitter design 1200 may facilitate offline identification and calibration based on pre-defined training stimuli (e.g. during power-up sequences, or communications link idle times).

Again, the switching DSP block 1210 is configured to selectively switch modes of operation within the transmitter design 1200. The timing for which mode is selected at a particular time may be determined in accordance with different techniques, according to various aspects.

For example, it is preferable for transmitter output reference reconstruction methods to utilize a transmitter front end in which I/Q imbalances have already been pre-compensated. Therefore, aspects include the time-switching sequence of the switching DSP block 1210 starting in the TXIQ mode. Another advantage in starting with the TXIQ mode is to estimate the loopback common gain $G_L$ (i.e., the up-conversion gain scaled by loopback gain), which may be done using the transmitter I/Q imbalance identification techniques discussed herein. It is desirable for the closed-loop adaptive DPD techniques described herein to initially identify this parameter.

The switching logic implemented by the switching DSP block 1210 may be performed in any suitable manner based upon the particular transmitter design. For example, aspects include the switching DSP block 1210 implementing packet-based switching, which may be particularly useful for rapidly varying transmitter front ends used for communication protocols associated with relatively short packet sizes. Such aspects include disabling the output stages of the transmitter RF front end 1206 (e.g., the PA) to prevent emissions into the propagation channel. Thus, such aspects include, before the packet transmission time is reached, that the transmitter RF front end 1206 is set to operate in accordance with the TXIQ mode, and a closed-loop offline I/Q imbalance compensation technique is performed with the transmitter RF front end 1206 output stage disabled (to get I/Q imbalance in a compensated state before packet transmission starts). Afterwards, the transmitter RF front end 1206 is set to the TXOR-ADPD mode, with a closed-loop online adaptive DPD technique being performed while packets are being transferred.

To provide another example, aspects include the switching DSP block 1210 implementing continuous monitoring switching. Such aspects mat be particularly useful, for instance, for slowly varying transmitter front ends used for communication protocols associated used with long packet size protocols or continuous frame protocols. In accordance with such aspects, after the initial calibration of the transmitter design 1200, the control loop is opened, and the switching DSP block 1210 remains in a monitoring mode. While in the monitoring mode, whenever any of the monitored non-idealities starts varying from its steady state, the transmitter RF front end 1206 is set to the corresponding mode (either TXIQ or TXOR-ADPD), and the corresponding closed-loop online calibration method is performed (i.e., adaptive DPD for nonlinearities, and I/Q imbalance compensation for I/Q imbalance).

Additional Aspects

As further discussed below, FIGS. 13-19 are provided with respect to additional aspects of transmitter designs to address I/Q modulator non-idealities, amplifier stage non-idealities, or both, with a single transmitter design. In each case, the transmitter architecture exploits an envelope detector (ED) feedback system to identify and compensate for the non-idealities.

FIGS. 13-19 are directed to transmitter design aspects that include additional modifications to the transmitter design concepts described herein with reference to FIGS. 1-12. In particular, FIGS. 13-16 are directed to additional aspects that further modify the transmitter design examples as shown and described above with reference to FIGS. 1-5 to address I/Q modulator non-idealities. These additional modifications include, for instance, the use of two feedback paths and EDs versus the three feedback paths and EDs utilized in the transmitter designs as shown in FIGS. 1, 2, and 4. Thus, the transmitter designs discussed below with reference to FIGS. 13-16 allow for I/Q modulator non-idealities to be compensated using less components (e.g., 2 envelope detectors and 2 A/D components, or 1 interleaved A/D component with a 2× rate). This may be particularly useful to further reduce the complexity, footprint, and power requirements compared to the transmitter design aspects as discussed herein with respect to FIGS. 1-5.

Figure 17:
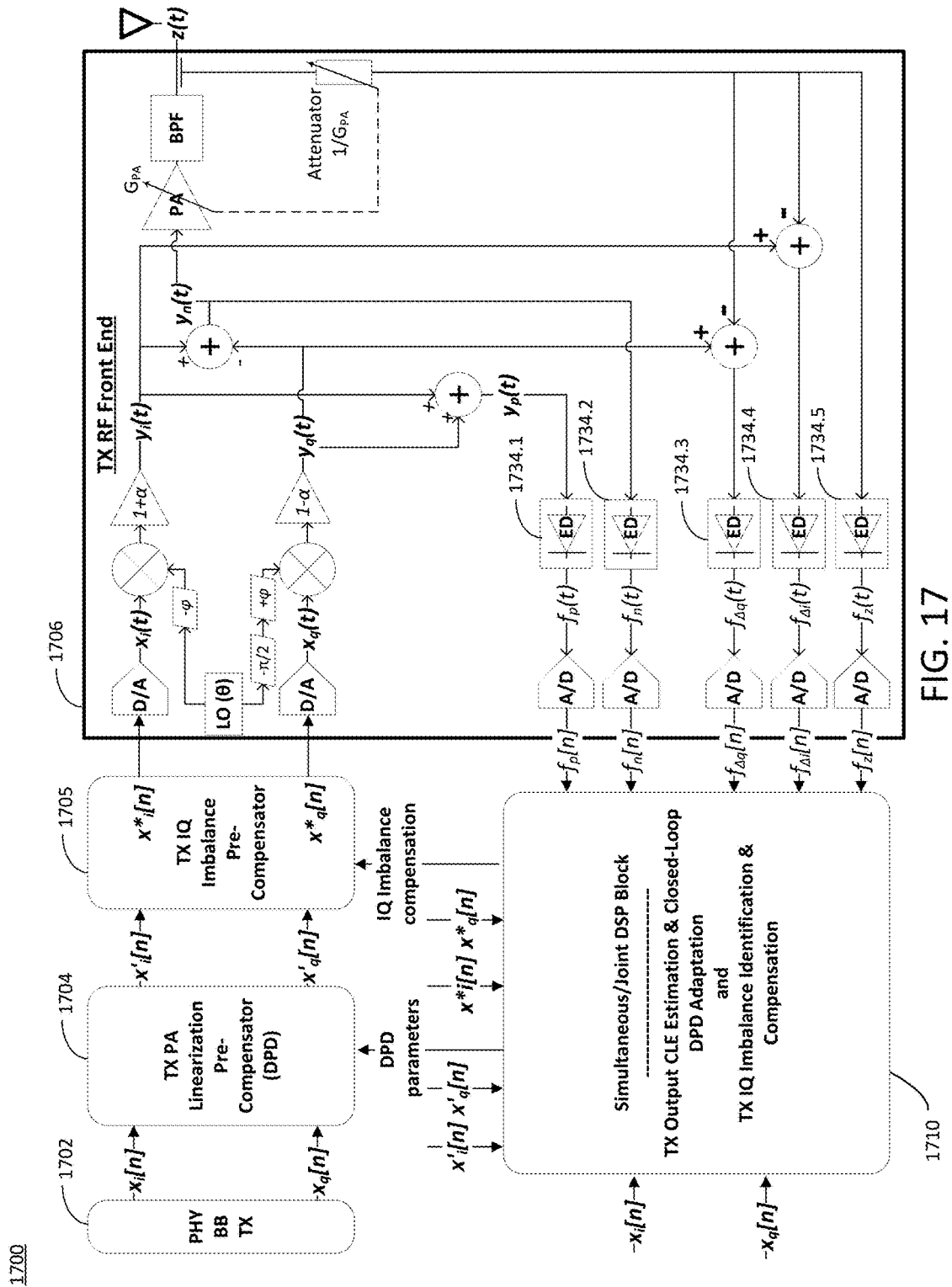
FIG. 17 illustrates a block diagram of an example transmitter design that performs concurrent compensation of online closed-loop compensation of I/Q modulator stage non-idealities and online closed-loop compensation of amplifier stage non-idealities in accordance with an aspect of the disclosure.
Figure 18:
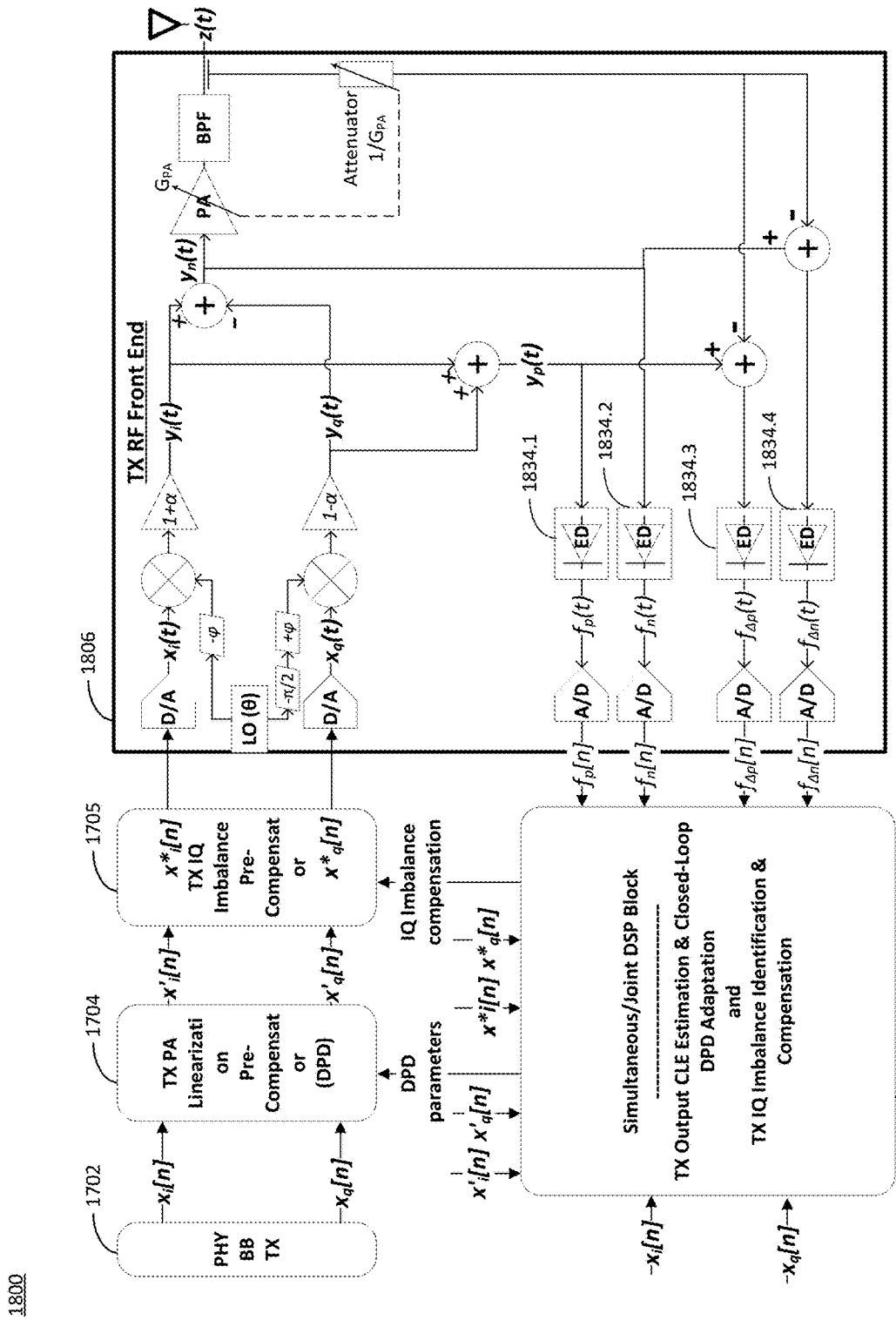
FIG. 18 illustrates a block diagram of another example transmitter design that performs concurrent compensation of online closed-loop compensation of I/Q modulator stage non-idealities and online closed-loop compensation of amplifier stage non-idealities in accordance with an aspect of the disclosure.
Figure 19:
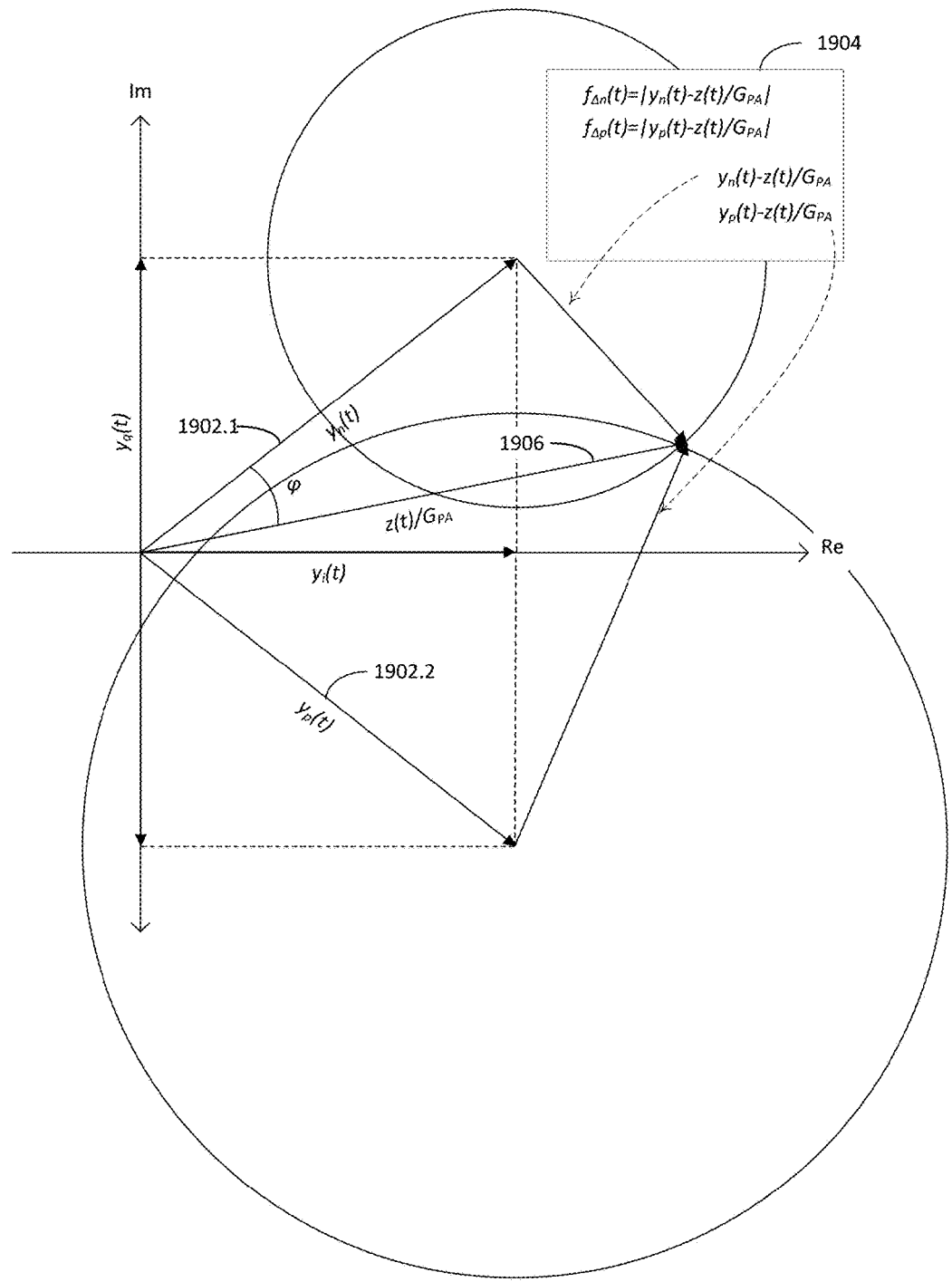
FIG. 19 illustrates a geometric view of an algorithm for TX output reference regeneration in CLE representation in accordance with an aspect of the disclosure.

Moreover, FIGS. 17-19 provide additional modifications to the transmitter design concepts described herein with reference to FIG. 12, which addresses I/Q modulator non-idealities, amplifier stage non-idealities, the generation of a CLE representation of the transmitted output signal in a single design. In both transmitter designs shown in FIGS. 17-18, as further discussed below, the transmitters are configured to simultaneously compensate for both I/Q modulator non-idealities and amplifier stage non-idealities and to continuously generate the CLE representation of the transmitted output signal, as opposed to the time-switched operation of the transmitter design as shown in FIG. 12. Furthermore, the transmitter designs shown in FIGS. 17-18 provide two alternate designs, with the transmitter design shown in FIG. 17 utilizing five feedback paths (two EDs for I/Q stage non-ideality compensation and three EDs for amplifier stage non-ideality compensation), and the transmitter design shown in FIG. 18 utilizing four feedback paths.

Figure 13:
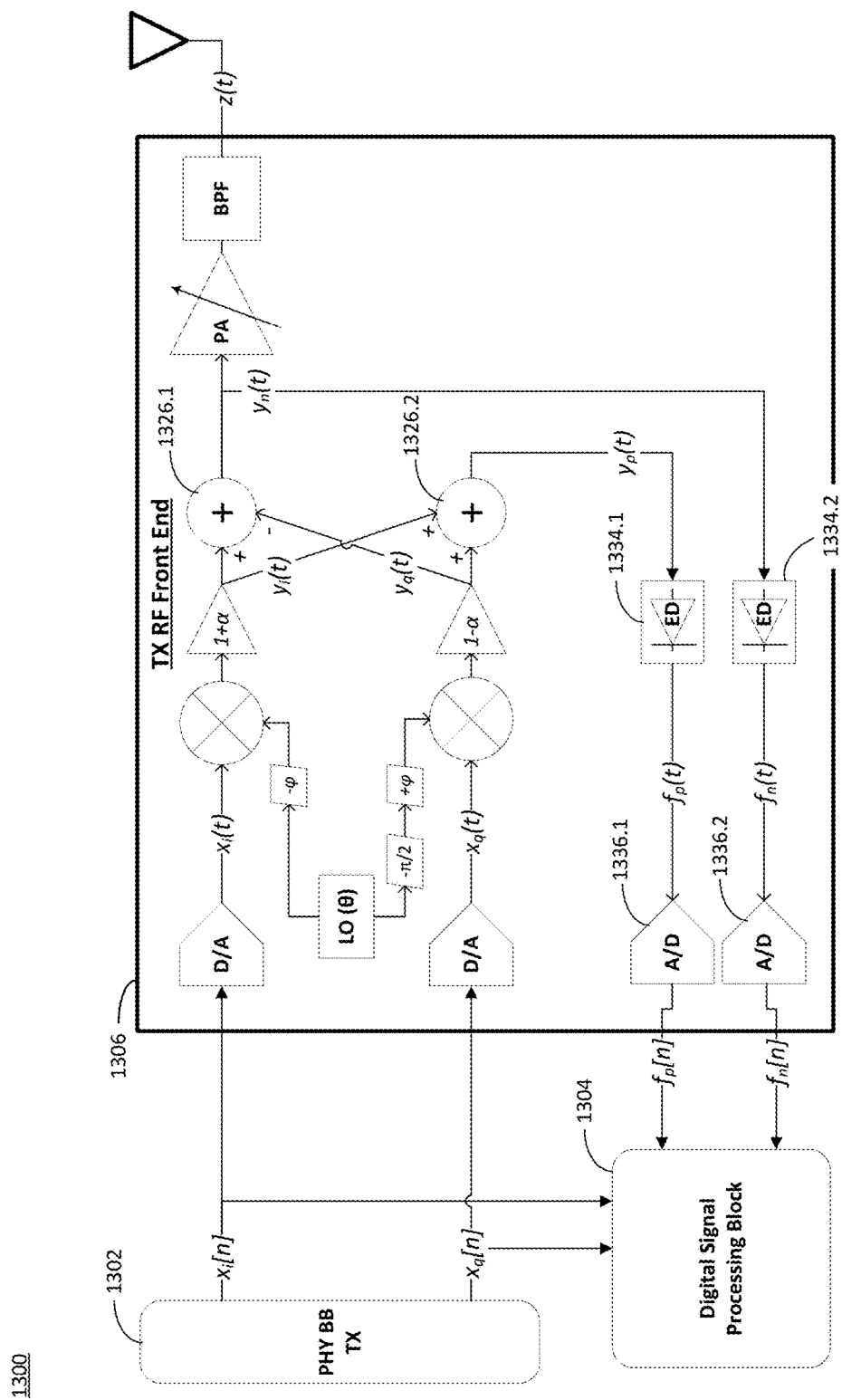
FIG. 13 illustrates a block diagram of another example transmitter design implementing online closed-loop identification of I/Q modulator stage non-idealities in accordance with an aspect of the disclosure.

Additional Transmitter Aspects Addressing I/Q Modulator Stage Non-Idealities Using Two Feedback Paths FIG. 13 illustrates a block diagram of another example transmitter design implementing online closed-loop identification of I/Q modulator stage non-idealities in accordance with an aspect of the disclosure. The example transmitter design 1300 shown in FIG. 13 includes a similar architecture as the example transmitter design 100, as shown in FIG. 1. In particular, both transmitter designs 100 and 1300 include a baseband processor 102, 1302, a front end 106, 1306, a DSP block 104, 1304, and a feedback loop system including envelope detectors. Additional common components of transmitter designs 100 and 1300 are not labeled in FIG. 13 for purposes of brevity. Moreover, the various common components of transmitter designs 100, 1300 may be considered as operating in a substantially similar manner, and therefore only differences between the transmitter designs 100 and 1300 will be further described herein.

For example, as compared to transmitter design 100, the front end 1306 of transmitter design 1300 includes two I/Q combiners 1326.1, 1326.2, two envelope detectors 1334.1, 1334.2, and two analog-to-digital converters 1336.1, 1336.2. In an aspect, the I/Q combiners 1326.1, 1326.2 provide a different respective combined I/Q signal $y_n(t)$, $y_p(t)$, to the EDs 1334.1, 1334.2. In particular, aspects include the I/Q combiner 1326.1 being configured to provide the combined I/Q signal $y_n(t)$ as a negative combination signal by subtracting the (up-converted) quadrature signal component $y_q(t)$ from the (up-converted) in-phase signal component $y_i(t)$. Furthermore, aspects include the I/Q combiner 1326.2 being configured to provide the combined I/Q signal $y_p(t)$ as a positive combination signal by adding the quadrature signal component $y_q(t)$ to the in-phase signal component $y_i(t)$. In accordance with the present aspects, the combined I/Q signal $y_n(t)$ may then be amplified via one or more amplifier stages to provide a suitable level of gain. Again, the amplified combined I/Q signal $y_n(t)$ is then passed through one or more filters to provide the output signal z(t), which is transmitted via the antenna.

As discussed above with reference to FIG. 1, the I/Q modulator of the transmitter design 1300 also introduces non-idealities as part of the I-branch and Q-branch architecture, which are illustrated in FIG. 1 as phase imbalances $-\varphi$ and $+\varphi$, and gain imbalances $1+\alpha$ and $1-\alpha$. To identify and compensate for these imbalances, aspects include the transmitter design 1300 implementing feedback paths that probe the combined I/Q signal $y_n(t)$ and the combined I/Q signal $y_p(t)$. To do so, aspects include the transmitter design 1300 implementing two feedback paths including the EDs 1334.1, 1334.2, each being coupled to a respective analog-to-digital converter (A/D) 1336.1, 1336.2, which provide digitized discrete-time feedback signals $f_p[n]$, $f_n[n]$ to the DSP block 1304. In particular, the ED 1334.1 functions to produce a first I/Q-branch envelope feedback signal, which is an envelope $f_p(t)$ of the combined (added) I/Q signal $y_p(t)$. Furthermore, the ED 1334.2 functions to produce a second I/Q-branch envelope feedback signal, which is an envelope $f_n(t)$ of the combined (subtracted) I/Q signal $y_n(t)$.

In an aspect, the DSP block 1304 is configured to receive the digitized discrete-time feedback signals $f_p[n]$, $f_n[n]$, as well as the digital baseband real and imaginary component samples $x_i[n]$, $x_q[n]$ generated by the baseband processor 1302. In this way, the DSP block 1304 may implement various algorithms, logic, executable instructions, etc., to identify and/or compensate for the aforementioned I/Q non-idealities in an online and closed-loop manner without the use of training signals. As discussed above with reference to FIG. 1, the DSP block 1304 may be implemented as any suitable number and/or type of computer processors, and the functionality provided by the DSP block 1304 may be implemented in hardware separate from the baseband processor 1302 or integrated as part of the baseband processor 1302.

In any event, aspects include the DSP block 1304 being configured to execute instructions and/or one or more appropriate algorithms to analyze the digital baseband real and imaginary component samples $x_i[n]$ and $x_q[n]$ in conjunction with the discrete-time feedback signals signals $f_p[n]$, $f_n[n]$. In doing so, the DSP block 1304 can estimate non-idealities such as, for example, phase imbalance, gain imbalance, and/or loopback common gain, which can then be compensated as part of a separate process. An example of the processor steps associated with such an I/Q modulator stage non-ideality identification algorithm are provided below.

Example Algorithm to Identify Transmitter I/Q Modulator Stage Non-Idealities Using Two Feedback Paths As an initial matter regarding the example algorithm, a mathematical complex low-pass equivalent (CLE) representation for the probed RF combined I/Q signals $y_n(t)$ and $y_p(t)$, and their corresponding feedback envelope signals (i.e., $f_n(t)$ and $f_p(t)$) is presented as follows, with the CLE representation of an RF signal being indicated with a tilde accent:

$$\tilde{y}_i(t) = G_L(1+\alpha)x_i(t)e^{j(\theta-\varphi)} \quad \text{Eqn. 1C:}$$

$$\tilde{y}_q(t) = -jG_L(1-\alpha)x_q(t)e^{j(\theta+\varphi)} \quad \text{Eqn. 2C:}$$

$$\tilde{y}_n(t) = \tilde{y}_i(t) - \tilde{y}_q(t) \quad \text{Eqn. 3C:}$$

$$\tilde{y}_p(t) = \tilde{y}_i(t) + \tilde{y}_q(t) \quad \text{Eqn. 4C:}$$

$$f_p(t) = G_L[(1+\alpha)^2 x_i^2(t) + (1-\alpha)^2 x_q^2(t) + 2(1+\alpha)(1-\alpha)x_i(t)x_q(t)\sin(2\varphi)]^{1/2} \quad \text{Eqn. 5C:}$$

$$f_n(t) = G_L[(1+\alpha)^2 x_i^2(t) + (1-\alpha)^2 x_q^2(t) - 2(1+\alpha)(1-\alpha)x_i(t)x_q(t)\sin(2\varphi)]^{1/2} \quad \text{Eqn. 6C:}$$

Note that for Eqn. 5C, $f_p(t) = |\tilde{y}_p(t)|$, and for Eqn. 6C, $f_n(t) = |\tilde{y}_n(t)|$ As the above-terms are defined, the example algorithm assumes that the transmitter digital quadrature baseband inputs (i.e., $x_i[n]$ and $x_q[n]$) and the digitized envelopes feedbacks (i.e., $f_n[n]$ and $f_p[n]$) are digitally time-aligned. Therefore, loopback delays are characterized up-front to enable digital domain alignment. Furthermore, the example algorithm provided with respect to the transmitter design 1300, as shown in FIG. 13, is provided to clarify the traceability of I/Q imbalance identification via the use of the envelope feedback signals. For ease of explanation, the example algorithm assumes that the loopback common gain is known a priori (e.g., via an offline estimation procedure).

The example algorithm thus estimates the symmetric I/Q imbalance model parameters, namely $\hat{\alpha}$ and $\hat{\varphi}$. The following algorithm is but one example of an algorithm that may be used to identify the aforementioned non-idealities. Aspects include alternate or additional steps, or other modifications to the algorithm to utilize the envelope feedback signals in accordance with the transmitter envelope architecture described herein. For example, aspects may include alternate algorithms that attempt to simultaneously track the loopback delays, and thus pre-characterization of the loopback delays may not be required in accordance with such aspects.

Assuming time-alignment (of digitized signals), the algorithm may be executed based on the transmitter design architecture described above with reference to FIG. 13 (e.g., by the DSP block 1304), using the following equations for the identification algorithm:

$$f_p^2(t)+f^2(t)=2G_L^2[(1+2\alpha+\alpha^2)x_i^2(t)+(1-2\alpha+\alpha^2)x_q^2(t)] \quad (1)$$

$$f_p^2(t)-f_n^2(t)=4G_L^2(1+\alpha)(1-\alpha)x_i(t)x_q(t)(2\varphi)=4G_L^2(1-\alpha^2)x_i(t)x_q(t)(2\varphi) \quad (2)$$

From (1) above, the quadratic equation may be applied to α, with coefficients measurable as follows:

$$0 = A_2\alpha^2 + A_1\alpha + A_0; \text{ with} \quad (3)$$

$$A_2 = x_i^2(t) + x_q^2(t) \quad (4)$$

$$A_1 = 2[x_i^2(t) - x_q^2(t)] \quad (5)$$

$$A_0 = x_i^2(t) + x_q^2(t) - \left\{ \frac{[f_p^2(t) + f_n^2(t)]}{2G_L^2} \right\} \quad (6)$$

$$\hat{\alpha} = \text{roots}(A_2, A_1, A_0) \quad (7)$$

From (2), the following may be extracted:

$$P_1 = \frac{[f_p^2(t) - f_n^2(t)]}{4G_L^2(1-\hat{\alpha}^2)} \quad (8)$$

$$\hat{\varphi} = \sin^{-1}\left(\frac{P_1}{2}\right) \quad (9)$$

In various aspects, temporal moving averages can be calculated for $A_2$, $A_1$, $A_0$, and $P_1$ for the purpose of error averaging (i.e., either noise or errors introduced by model inaccuracies, like frequency selective responses not modeled), and the final estimates based on these temporal averages may then be calculated. This algorithm is not statistically optimal, and yet its results are satisfactory.

Based on the above presented model, a condition may be derived to serve as the criteria to facilitate a determination whether I/Q imbalances have been corrected for a particular transmitter RF front end (e.g., front end 1306). For example, when the following condition is met, it serves as an indication that I/Q imbalance has been substantially compensated or calibrated, i.e., that the residual I/Q imbalance is negligible.

$$\text{Condition: } f_p(t) \overset{?}{\Leftrightarrow} f_n(t)$$

Thus, the above condition allows the creation of online closed-loop calibration algorithms in accordance with well-known optimization methods, which may use such a condition, for instance, as an optimization cost function (i.e. objective function). In doing so, aspects include DSP block 1304, for example, facilitating the minimization of any I/Q imbalances by attempting to equalize each side of the equation for the aforementioned condition.

Discontinuous Closed-Loop I/Q Imbalance Calibration Using Two Feedback Paths

Figure 14:
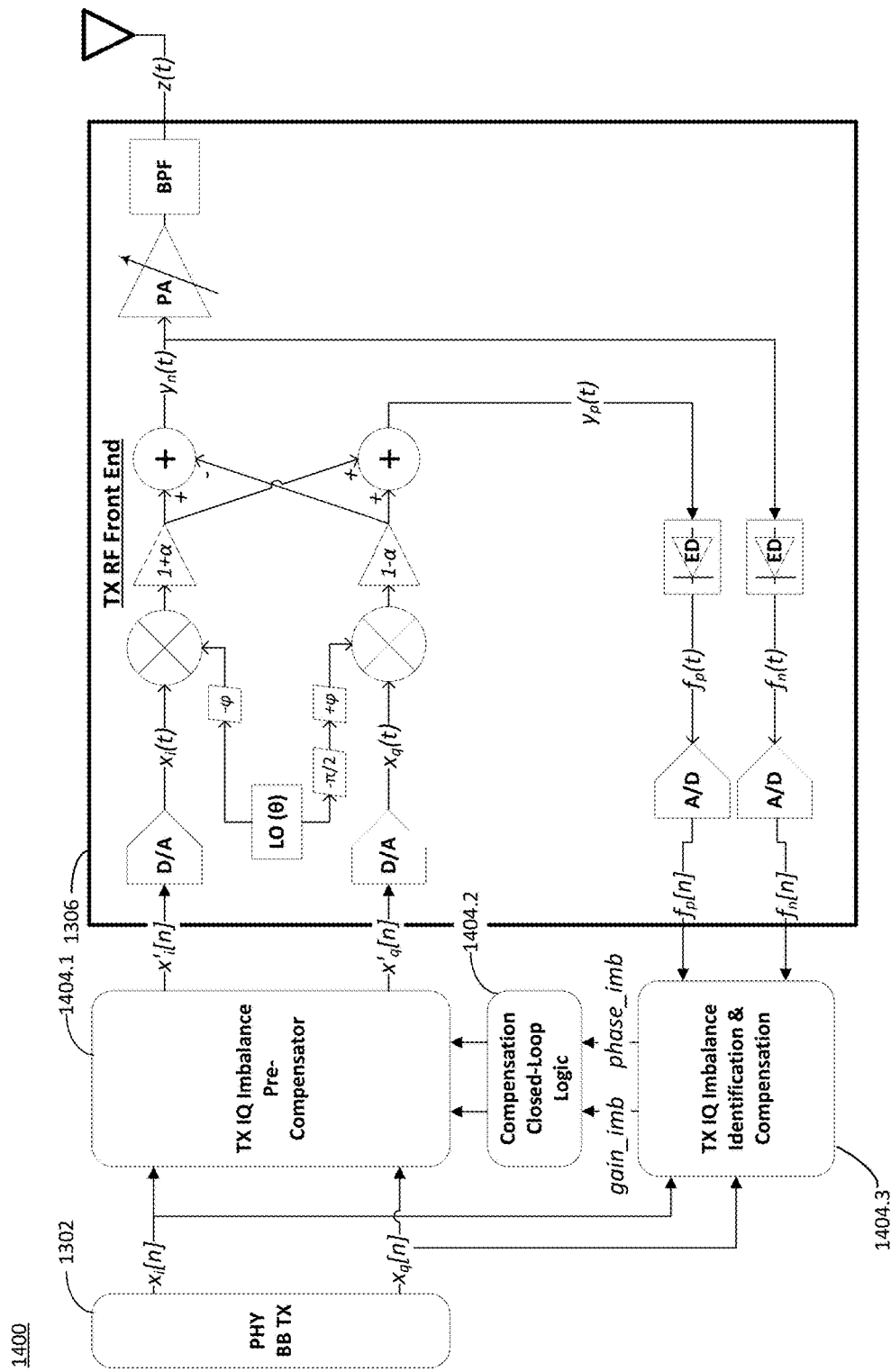
FIG. 14 illustrates a block diagram of another example transmitter design implementing online discontinuous closed-loop calibration of identified I/Q modulator stage non-idealities in accordance with an aspect of the disclosure.

FIG. 14 illustrates a block diagram of another example transmitter design implementing online discontinuous closed-loop calibration of identified I/Q modulator stage non-idealities in accordance with an aspect of the disclosure. The example transmitter design 1400 shown in FIG. 14 includes a similar architecture as the example transmitter design 1300, as shown in FIG. 13. In particular, both transmitter designs 1300 and 1400 include baseband processor 1302, a front end 1306, and a feedback loop system including EDs. Additional common components of transmitter designs 1300 and 1400 are not labeled in FIG. 14 for purposes of brevity.

Furthermore, the transmitter design 1400 shares a similar architecture with transmitter design 200, as shown in FIG. 2, which includes a transmitter I/Q imbalance pre-compensator block 204.1, a compensation closed-loop logic block 204.2, and a transmitter I/Q imbalance identification block 204.3. Similarly, as compared to transmitter design 200, the transmitter design 1400 also includes a transmitter I/Q imbalance pre-compensator block 1404.1, a compensation closed-loop logic block 1404.2, and a transmitter I/Q imbalance identification block 1404.3. Moreover, the various common components of transmitter designs 200, 1400 may be considered as operating in a substantially similar manner, and therefore only differences between the transmitter designs 200 and 1400 will be further described herein. For example, in an aspect, the front end 1306 of transmitter design 1400 includes two feedback paths instead of the three implemented via the transmitter design 200.

In an aspect, the transmitter I/Q imbalance pre-compensator block 1404.1, compensation closed-loop logic block 1404.2, and transmitter I/Q imbalance identification block 1404.3 may be identified with the DSP block 1304, as shown and discussed with reference to FIG. 13. In other aspects, the transmitter I/Q imbalance pre-compensator block 1404.1, compensation closed-loop logic block 1404.2, and transmitter I/Q imbalance identification block 1404.3 may be implemented with one or more processor components that may be distinct from the baseband processor 1302 and the DSP block 1304. In yet additional aspects, the transmitter I/Q imbalance pre-compensator block 1404.1, compensation closed-loop logic block 1404.2, and transmitter I/Q imbalance identification block 1404.3 may be implemented as part of the baseband processor 1302.

In any event, aspects include the transmitter design 1400 implementing discontinuous closed-loop calibration of I/Q imbalances such as phase imbalance, gain imbalance, and/or common loop gain, as discussed herein. To do so, the transmitter I/Q imbalance pre-compensator block 1404.1 is coupled between the baseband processor 1302 and the RF analog front end 1306. Aspects include the transmitter I/Q imbalance pre-compensator block 1404.1 pre-distorting the signals generated by the baseband processor 1302 (i.e., $x_i[n]$ and $x_q[n]$) prior to these signals being delivered to the RF analog front end 1306. In other words, the transmitter I/Q imbalance pre-compensator 1404.1 pre-distorts the digital baseband signals $x_i[n]$ and $x_q[n]$ to compensate for detected I/Q imbalances by generating pre-distorted real and imaginary component signals $x'_i[n]$ and $x'_q[n]$.

In an aspect, the pre-distorted real and imaginary component signals $x'_i[n]$ and $x'_q[n]$ may be generated in a discontinuous and closed-loop online manner using the algorithms discussed above with regards to the identification of I/Q imbalances using two feedback paths. In accordance with such aspects, the identification algorithm and the transmitter I/Q imbalance pre-compensator block 1404.1 may be based upon the same I/Q imbalance theoretical model (i.e., the same model as defined and discussed above with regards to Eqns. 1C-6C and (1)-(9)). Therefore, the control inputs utilized by the transmitter I/Q imbalance pre-compensator block 1404.1 may be the I/Q imbalance parameters (gain-imbalance, phase-imbalance) themselves or, alternatively, their respective related model parameters (α-parameter and φ-parameter).

The model upon which the identification and compensation algorithms discussed herein are based is provided by way of example and not limitation. Additionally or alternatively, aspects include utilizing a different model than that discussed herein with regards to Eqns. 1C-6C and (1)-(9). In other words, the RF signals may be defined in terms of any suitable type of theoretical model that appropriately defines any suitable number and/or type of parameters (in addition to or instead of α and φ). Thus, the aspects as described herein may be extended to utilizing the feedback envelope signals (i.e., $f_p(t)$ and $f_n(t)$) to compensate for any suitable type of non-idealities that may be appropriately modeled.

In an aspect, a technique implemented by the transmitter I/Q imbalance pre-compensator block 1404.1, the compensation closed-loop logic block 1404.2, and the transmitter I/Q imbalance identification block 1404.3 to accomplish digital pre-compensation of the I/Q imbalances may be similar or identical to that shown and discussed above with reference to FIG. 3. In particular, such aspects include the TX/I/Q imbalance identification block 1404.3 continuously estimating the I/Q imbalance parameters, with the feedback loop being selectively closed via the compensation closed-loop logic block 1404.2 as shown in FIG. 14.

For example, the compensation closed-loop logic block 1404.2 may implement the flow 300 to facilitate closed-loop logic, which may begin with the passage of a transient period of time (block 302). The flow 300 may continue once the transient period has elapsed, with compensation closed-loop logic block 1404.2 assessing the stability of the estimated I/Q imbalance parameters (block 304). The compensation closed-loop logic block 1404.2 may continue to wait until the I/Q imbalance estimates are stabilized (block 1404). Once the estimated I/Q imbalance parameters have stabilized (e.g., are no longer fluctuating in excess of a predefined threshold measurement value), flow 300 may continue with compensation closed-loop logic 1404.2 further determining whether the residual I/Q imbalance is above a lower bound, e.g., a predetermined threshold value (block 306). Upon the residual I/Q imbalance being above a lower bound (e.g., in accordance with the algorithm discussed above with respect to the condition referenced in conjunction with Eqns. 1C-6C and (1)-(9)), aspects include the compensation closed-loop logic block 1404.2 accumulating the estimated I/Q imbalance parameters into the transmitter I/Q imbalance pre-compensator block 1404.1 as control input parameters (i.e., the loop is closed momentarily) (block 308). Aspects include repeating this process, each time accumulating a lower residual I/Q imbalance value.

Continuous Closed-Loop I/Q Imbalance Calibration Using Two Feedback Paths

Figure 15:
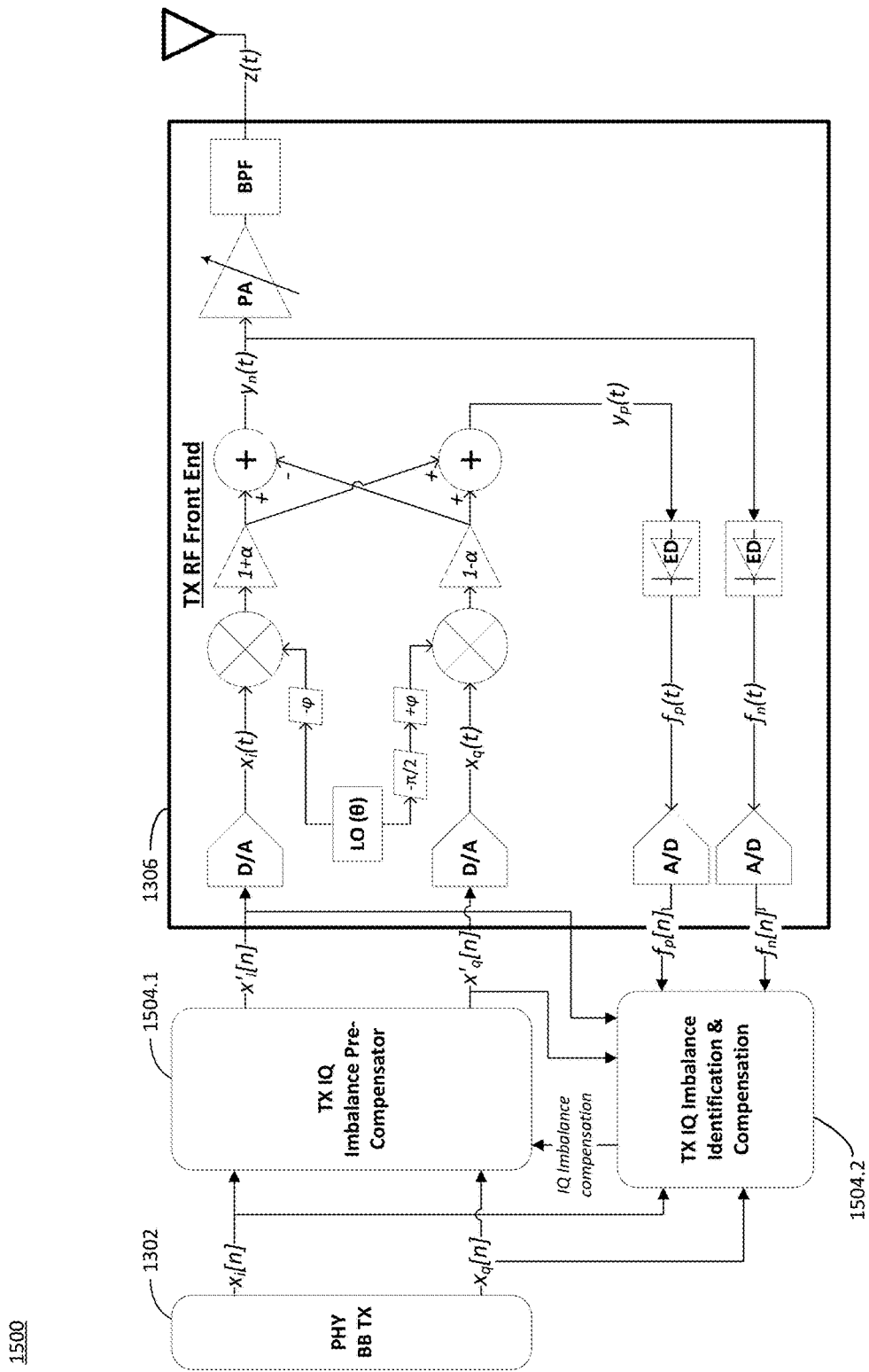
FIG. 15 illustrates a block diagram of another example transmitter design implementing online continuous closed-loop calibration of I/Q modulator stage non-idealities in accordance with an aspect of the disclosure.

FIG. 15 illustrates a block diagram of another example transmitter design implementing online continuous closed-loop calibration of I/Q modulator stage non-idealities in accordance with an aspect of the disclosure. The example transmitter design 1500 shown in FIG. 15 includes a similar architecture as the example transmitter designs 1300 and 1400, as shown in FIGS. 13 and 14, respectively. In particular, each of transmitter designs 1300, 1400, 1500 includes a baseband processor 1302, a front end 1306, and a feedback loop system including EDs. Additional common components of transmitter designs 1300, 1400, and 1500 are not labeled in FIG. 15 for purposes of brevity.

Furthermore, the transmitter design 1500 shares a similar architecture with transmitter design 400, as shown in FIG. 4, which includes a transmitter I/Q imbalance pre-compensator block 404.1 and a transmitter I/Q imbalance closed-loop compensation block 404.2. Similarly, as compared to transmitter design 400, the transmitter design 1500 includes transmitter I/Q imbalance pre-compensator block 1504.1 and a transmitter I/Q imbalance closed-loop compensation block 1504.2. Moreover, the various common components of transmitter designs 400, 1500 may be considered as operating in a substantially similar manner, and therefore only differences between the transmitter designs 400 and 1500 will be further described herein. For example, in an aspect, the front end 1306 of transmitter design 1500 includes two feedback paths instead of the three implemented via the transmitter design 400.

Aspects include the transmitter I/Q imbalance pre-compensator block 1504.1 pre-distorting the signals generated by the baseband processor 1302 (i.e., $x_i[n]$ and $x_q[n]$) prior to these signals being delivered to the front end 1306 as pre-distorted real and imaginary component signals $x'_i[n]$ and $x'_q[n]$. However, because the transmitter design 1500 performs continuous I/Q imbalance calibration in closed-loop, the transmitter design 1500 does not require any explicit I/Q imbalance estimation block (e.g. block 1404.3, as shown in FIG. 14). Instead, the transmitter I/Q imbalance closed-loop compensation block 1504.2 functions to directly tune the transmitter I/Q imbalance pre-compensator block 1504.1. To do so, the transmitter I/Q imbalance pre-compensator block 1504.1 and the transmitter I/Q imbalance closed-loop compensation block 1504.2 may be implemented with one or more processor components. These components may be distinct from the baseband processor 1302 and the DSP block 1304, or may be implemented as part of the baseband processor 1302 and/or the DSP block 1304, as discussed with reference to FIG. 13.

In any event, in contrast to the discontinuous closed-loop calibration method implemented by the transmitter design 1400, the transmitter I/Q imbalance pre-compensator block 1504.1 does not utilize the estimated I/Q imbalance parameters as control inputs. Instead, the transmitter design 1500 implements closed-loop control (or closed loop parameter adaptation) algorithms to directly tune the transmitter I/Q imbalance pre-compensator block 1504.1. In an aspect of the disclosure, this may be performed without directly measuring the I/Q imbalances but by executing one or more algorithms that indirectly measure an amount of residual I/Q imbalance. This may be executed, for instance, in accordance with optimization criteria, or a cost function that is specified in accordance with specified criteria that attempts to minimize residual I/Q imbalances. For example, the criteria that may be utilized in accordance with such aspects includes the condition discussed above with regards to the example algorithm to identify transmitter I/Q stage non-idealities with reference to Eqns. 1C-6C and (1)-(9). This condition is repeated immediately below for the reader's convenience.

$$\text{Condition: } f_p(t) \overset{?}{\Leftrightarrow} f_n(t)$$

Offline Synchronization and Compensation of Envelope Detector Gain Imbalances

Figure 16:
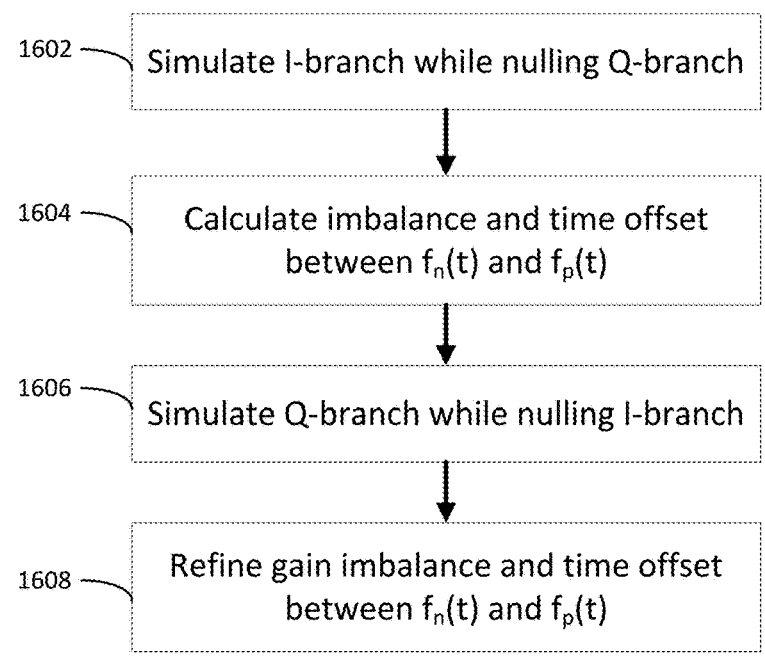
FIG. 16 illustrates an example flow for offline synchronization and compensation of envelope detector (ED) imbalances in accordance with an aspect of the disclosure.

FIG. 16 illustrates an example flow for offline synchronization and compensation of envelope detector (ED) imbalances in accordance with an aspect of the disclosure. As discussed above with reference to transmitter designs 100, 200, and 400, the transmitter designs 1300, 1400, and 1500 discussed herein can also be affected by gain-imbalances between the three EDs 1334.1 and 1334.2 on the two feedback loops. Additionally, time misalignments between each of the two ED feedback loops may influence the operation of I/Q detection and calibration. Therefore, to correct this potential issue, aspects include any of the transmitter designs 1300, 1400, 1500 further implementing an offline method in which special-crafted training patterns may be used to calibrate the EDs, thus compensating for these issues. In various aspects, these training patterns may include any suitable number and/or type of sequences to facilitate ED calibration and synchronization, such as Golay complementary sequences, Barker sequences, etc.

One such technique to do so is shown in FIG. 16 as an example flow 1600. Flow 1600 begins with the I-branch being stimulated while the Q-branch is nulled (block 1602). For instance, this could include the transmitter I/Q imbalance pre-compensator block 1404.1 (as shown in FIG. 14) providing, as the pre-distorted real component signal x'$_i$[n], a predefined training pattern. While doing so, the transmitter I/Q imbalance pre-compensator 1404.1 may provide, as the digital baseband imaginary component signal x'$_q$[n], a nulling signal or a signal that accomplishes a similar effect (e.g., a stream of "zero" valued samples).

In this configuration, flow 1600 may include calculating an imbalance and time offset between the envelope $f_p(t)$ of the combined (added) I/Q signal $y_p(t)$ and the envelope $f_n(t)$ of the combined (subtracted) I/Q signal $y_n(t)$ (block 1604). These calculations may be performed, for example, via DSP block 1304 (as shown in FIGS. 13-15), the TX I/Q imbalance identification block 1404.3 (as shown in FIG. 14), the transmitter I/Q imbalance closed-loop compensation block 1404.2 (as shown in FIG. 14), etc., depending upon the particular transmitter design that is implemented.

Flow 1600 may continue after the imbalances and time offset between the envelope feedback signal $f_p(t)$ and the envelope feedback signal $f_n(t)$ have been calculated (block 1604) with the Q-branch being stimulated while the I-branch is nulled (block 1606) in a similar manner as explained above at block 1602. Flow 1600 may include calculating a refined imbalance and time offset between the envelope feedback signal $f_p(t)$ and the envelope feedback signal $f_n(t)$ (block 1608). In this way, the flow 1600 allows for imbalances and time offsets between the envelope detectors to be calibrated offline, prior to the execution of the online closed loop I/Q imbalance calibrations discussed above.

Simultaneous Online Closed-Loop Identification and Calibration of I/Q Modulator Stage and Amplifier Stage Non-Idealities Using Five Feedback Paths As discussed above with reference to FIG. 12 and the corresponding transmitter design 1200, to address amplifier stage non-idealities and generate a transmitter front end output CLE representation, it is preferable for the transmitter front end to be free of I/Q imbalances. Thus, the transmitter design 1200 may facilitate the compensation of I/Q imbalances to enable the amplifier stage non-idealities to be compensated and the transmitter front end output CLE representation to be generated. Thus, the combined transmitter design 1200 may address all three issues related to I/Q imbalances, amplifier stage nonlinearities, and transmitter output reconstruction, but does so in a time-switched manner. As further discussed below, additional aspects include a single transmitter design that addresses each of these issues simultaneously.

FIG. 17 illustrates a block diagram of an example transmitter design that performs simultaneous compensation of online closed-loop compensation of I/Q modulator stage non-idealities and online closed-loop compensation of amplifier stage non-idealities in accordance with an aspect of the disclosure. The example transmitter design 1700 shown in FIG. 17 includes a similar architecture as the example transmitter design 1200, as shown in FIG. 12. In particular, both transmitter designs 1200 and 1700 include a baseband processor 1202, 1702, a front end 1206, 1706, a DSP block 1210, 1710, a transmitter PA linearization pre-compensator block 1204, 1704, a transmitter I/Q imbalance pre-compensator block 1205, 1705, and a feedback loop system including envelope detectors. Additional common components of transmitter designs 1200 and 1700 are not labeled in FIG. 17 for purposes of brevity. Moreover, the various common components of transmitter designs 1200, 1700 may be considered as operating in a substantially similar manner, and therefore only differences between the transmitter designs 1200 and 1700 will be further described herein.

For example, as compared to transmitter design 1200, the front end 1706 of transmitter design 1700 includes an additional I/Q combiner, two additional envelope feedback paths, and the mode switches are eliminated. In particular, the transmitter front end 1706 includes two different sets of feedback paths. The first of these two feedback paths operate in a substantially similar or identical manner as the feedback paths discussed with reference to transmitter designs 1300, 1400, and 1500, and are associated with addressing I/Q modulator stage non-idealities such as I/Q imbalances, for example. Specifically, envelope detectors 1734.1, 1734.2 provide envelope feedback signals $f_p(t)$ and $f_n(t)$ to analog-to-digital converters to facilitate the digitized envelope feedbacks $f_n[n]$ and $f_p[n]$ to be fed into the DSP block 1702. Again, the combined I/Q signal $y_p(t)$ is the result of the quadrature signal component $y_q(t)$ being added to the in-phase signal component $y_i(t)$, whereas the combined I/Q signal $y_n(t)$ is the result of the quadrature signal component $y_q(t)$ being subtracted from the in-phase signal component $y_i(t)$.

Aspects include the transmitter front end 1706 further implementing a second set of feedback paths, which are associated with addressing amplifier stage non-idealities such as amplifier stage nonlinearities and CLE representation of the transmitter output. The second set of feedback paths include three envelope detectors 1734.3, 1734.4, and 1734.5. In an aspect, the feedback paths associated with the three envelope detectors 1734.3, 1734.4, and 1734.5 operate in a similar manner as those described herein with reference to the transmitter design 1200 when operating in the second mode of operation (i.e., TXOR-ADPD).

For example, the ED 1734.3 functions to produce a Q-branch envelope feedback signal $f_{\Delta q}(t)$, which represents the envelope of the difference between the quadrature signal component $y_q(t)$ and the probed output signal $$\frac{z(t)}{G_{PA}}.$$

Furthermore, the ED 1734.4 functions to produce an I-branch envelope feedback signal $f_{\Delta i}(t)$, which represents the envelope of the difference between the in-phase signal component $y_i(t)$ and the probed output signal $$\frac{z(t)}{G_{PA}}.$$

The remaining ED 1734.5 functions to produce a transmitter output envelope feedback signal $f_z(t)$, which represents the envelope of the probed output signal $$\frac{z(t)}{G_{PA}}.$$

The three analog-to-digital converters associated with each of EDs 1734.3, 1734.4, 1734.5, respectively, function to digitize the I-branch envelope feedback signal $f_{\Delta i}(t)$, the Q-branch envelope feedback signal $f_{\Delta q}(t)$, and the transmitter output envelope feedback signal $f_z(t)$ to discrete-time feedback signals $f_{\Delta i}[n]$, $f_{\Delta q}[n]$, and $f_z[n]$, as shown in FIG. 17. The DSP block 1710 is configured to receive the digitized discrete-time feedback signals $f_{\Delta i}[n]$, $f_{\Delta q}[n]$, and $f_z[n]$ as well as the digital baseband real and imaginary component samples $x_i[n]$, $x_q[n]$ generated by the baseband processor 1702.

Aspects include the DSP block 1710 calculating DPD parameters, IQ imbalance parameters, and/or otherwise directly controlling the transmitter PA linearization pre-compensator block 1704 and/or transmitter I/Q imbalance pre-compensator block 1705 to facilitate the generation of the pre-distorted real and imaginary component signals $x'_i[n]$ and $x'_q[n]$ and the component signals $x^*_i[n]$ and $x^*_q[n]$. Moreover, aspects include the DSP block 1710 receiving the pre-distorted real and imaginary component signals $x'_i[n]$ and $x'_q[n]$ generated by the transmitter PA linearization pre-compensator block 1704 and the component signals $x^*_i[n]$ and $x^*_q[n]$ generated by the transmitter I/Q imbalance pre-compensator block 1705. In this way, the DSP block 1710 may identify and/or compensate for the aforementioned nonlinearities in an online and closed-loop manner without the use of training signals, and may simultaneously compensate for I/Q imbalances and amplifier stage nonlinearities, as well as calculate the CLE representation of the transmitter output.

In other words, the transmitter design 1700 may function in a similar manner as the transmitter design 1200, although the DSP block 1710 may continuously utilize the same inputs without switching between a shared set of feedback paths. Thus, aspects include the DSP block 1710 implementing any suitable executable logic, algorithms, and/or code (e.g., by modifying that used by DSP block 1210) to implement distinct methods using the same transmitter design 1700 to simultaneously and continuously solve each of the aforementioned issues related to compensating I/Q imbalances, amplifier stage nonlinearities, and transmitter CLE output reconstruction.

Simultaneous Online Closed-Loop Identification and Calibration of I/Q Modulator Stage and Amplifier Stage Non-Idealities Using Four Feedback Paths FIG. 18 illustrates a block diagram of another example transmitter design that performs concurrent compensation of online closed-loop compensation of I/Q modulator stage non-idealities and online closed-loop compensation of amplifier stage non-idealities in accordance with an aspect of the disclosure.

The example transmitter design 1800 shown in FIG. 18 includes a similar architecture as the example transmitter design 1700, as shown in FIG. 17. In particular, both transmitter designs 1700 and 1800 include a baseband processor 1702, a TX RF front end 1806, a DSP block 1710, a transmitter PA linearization pre-compensator block 1704, a transmitter I/Q imbalance pre-compensator block 1705, and a feedback loop system including envelope detectors. Additional common components of transmitter designs 1700 and 1800 are not labeled in FIG. 18 for purposes of brevity. Moreover, the various common components of transmitter designs 1700 and 1800 may be considered as operating in a substantially similar manner, and therefore only differences between the transmitter designs 1700 and 1800 will be further described herein.

The transmitter design 1800 presents a solution to the same problem as transmitter design 1700, although transmitter design 1800 implements one less feedback path and utilizes a different DSP algorithm, as further discussed below. In other words, the transmitter design 1800 may represent a tradeoff with 1 less envelope feedback path at the cost of increased DSP complexity. Such a design may be particularly useful, for example, if semiconductor technology continues to scale down, thus enabling such increases in DSP complexity to be cheaper and more power efficient than an extra envelope feedback path.

In an aspect, the front end 1806 includes two sets of envelope feedback paths. The first of these paths includes EDs 1834.1, 1834.2, which function in the same manner as the EDs 1734.1, 1734.2, as discussed above with reference to FIG. 17. Specifically, the first of the two sets of envelope feedback paths provides the envelope feedback signals $f_p(t)$ and $f_n(t)$ to respective analog-to-digital converters to facilitate the digitized envelope feedbacks $f_n[n]$ and $f_p[n]$ being fed into the DSP block 1710. Again, the combined I/Q signal $y_p(t)$ is a positive combination signal that is the result of the quadrature signal component $y_q(t)$ being added to the in-phase signal component $y_i(t)$, whereas the combined I/Q signal $y_n(t)$ is a negative combination signal that is the result of the quadrature signal component $y_q(t)$ being subtracted from the in-phase signal component $y_i(t)$.

In an aspect, the second of the two sets of envelope feedback paths includes EDs 1834.3 and 1834.4, which function to provide envelope signals based upon the probed transmitted output signal. In an aspect, ED 1834.3 functions to produce an envelope feedback signal $f_{\Delta p}(t)$, which represents the envelope of the difference between the positive combination I/Q signal $y_p(t)$ and the probed output signal $$\frac{z(t)}{G_{PA}}.$$

Furthermore, the ED 1834.4 functions to produce an envelope feedback signal $f_{\Delta n}(t)$, which represents the envelope of the difference between the negative combination I/Q signal $y_n(t)$ and the probed output signal $$\frac{z(t)}{G_{PA}}.$$

The EDs 1834.3 and 1834.4 also provide the envelope feedback signals $f_{\Delta p}(t)$ and $f_{\Delta n}(t)$ to respective analog-to-digital converters, which in turn facilitate the digitized envelope feedbacks $f_{\Delta p}[n]$ and $f_{\Delta n}[n]$ being fed into the DSP block 1710. Moreover, like the transmitter design 1700, the DSP block 1710 associated with the transmitter design 1800 also receives, as inputs, the digital baseband real and imaginary component samples $x_i[n]$, $x_q[n]$, the pre-distorted real and imaginary component signals $x'_i[n]$ and $x'_q[n]$, and the component signals $x^*_i[n]$ and $x^*_q[n]$.

Example Algorithm to Simultaneously Address Transmitter I/Q Modulator Stage Non-Idealities, Amplifier Stage Non-Idealities, and the Calculation of the CLE Representation of the Transmitted Output Signal Regarding the example algorithm, a mathematical complex low-pass equivalent (CLE) representation for the probed signals $y_n(t)$ and $y_p(t)$, and their corresponding feedback envelope signals (i.e., $f_n(t)$ and $f_p(t)$) is presented as follows, with the CLE representation of an RF signal being indicated with a tilde accent:

$$\tilde{y}_i(t) = G_L(1+\alpha)x_i(t)e^{(j(\theta-\varphi))} \quad \text{Eqn. 1D:}$$

$$\tilde{y}_q(t) = -jG_L(1-\alpha)x_q(t)e^{(j(\theta+\varphi))} \quad \text{Eqn. 2D:}$$

$$\tilde{y}_n(t) = \tilde{y}_i(t) - \tilde{y}_q(t) \quad \text{Eqn. 3D:}$$

$$\tilde{y}_p(t) = \tilde{y}_i(t) + \tilde{y}_q(t) \quad \text{Eqn. 4D:}$$

$$f_p(t) = G_L[(1+\alpha)^2 x_i^2(t) + (1-\alpha)^2 x_q^2(t) + 2(1+\alpha)(1-\alpha)x_i(t)x_q(t)\sin(2\varphi)]^{1/2} \quad \text{Eqn. 5D:}$$

$$f_n(t) = G_L[(1+\alpha)^2 x_i^2(t) + (1-\alpha)^2 x_q^2(t) - 2(1+\alpha)(1-\alpha)x_i(t)x_q(t)\sin(2\varphi)]^{1/2} \quad \text{Eqn. 6D:}$$

$$f_{\Delta p}(t) = [f_p^2(t) + |\tilde{z}(t)|^2 - \tilde{y}_p(t)\tilde{z}(t) - \tilde{y}_p^*(t)\tilde{z}(t)]^{1/2} \quad \text{Eqn. 7D:}$$

$$f_{\Delta n}(t) = [f_n^2(t) + |\tilde{z}(t)|^2 - \tilde{y}_n(t)\tilde{z}^*(t) - \tilde{y}_n^*(t)\tilde{z}(t)]^{1/2} \quad \text{Eqn. 8D:}$$

Note that for Eqn. 5D, $f_p(t) = |\tilde{y}_p(t)|$, and for Eqn. 6D, $f_n(t) = |\tilde{y}_n(t)|$.

In an aspect, the transmitter design 1800 as shown in FIG. 18 may implement the same algorithms as those discussed above with reference to the transmitter designs described in conjunction with FIGS. 13-16. In other words, because the transmitter design 1800 implements the same envelope feedback paths as the transmitter designs 1300, 1400, 1500 to identify and correct modulator stage non-idealities (e.g., I/Q imbalances), transmitter design 1800 may implement the same (or a similar) algorithm as discussed above with respect to (1)-(9) and the condition $$f_P(t) \stackrel{?}{\Leftrightarrow} f_n(t).$$

In an aspect, this algorithm may also be implemented via the transmitter design 1800 (assuming digital time alignment of the quadrature baseband inputs (i.e., $x_i[n]$ and $x_q[n]$) and the digitized envelopes feedbacks (i.e., $f_n[n]$ and $f_p[n]$)).

In an aspect, the transmitter design 1800 (e.g., DSP block 1710) may implement the aforementioned algorithm implemented via transmitter designs 1300, 1400, 1500, but using the mathematical CLE representation defined above in Eqns. 1D-8D in a periodic or continuous manner. In doing so, the I/Q imbalances in the transmitter design 1800 may be continuously identified and compensated for until satisfactory results are achieved (e.g., the residual I/Q imbalance is below some lower bound, as discussed in flow 300). Once a satisfactory I/Q imbalance compensation is achieved in this manner, aspects include transmitter design 1800 (e.g., via DSP block 1710) implementing the following example algorithm for transmitter output reference regeneration in CLE representation, with continued reference to FIG. 19.

The following example algorithm further assumes that the up-conversion gain $\hat{G}_L$ has been identified. As shown in FIG. 19, the signals $\hat{\tilde{y}}_n$ (1902.1) and $\hat{\tilde{y}}_p(t)$ (1902.2) may be predicted based upon knowledge of the analog baseband real component samples $x_i(t)$, the analog baseband imaginary component samples $x_q(t)$, and the up-conversion gain $\hat{G}_L$. Moreover, the signals shown in the box 1904 are those for which a magnitude is known. Finally, the target signal that is to be estimated (the TX output signal $\tilde{z}(t)$, or $$\frac{z(t)}{G_{PA}}$$

is depicted as the vector 1906.

As shown in FIG. 19, available information is analogous to knowing the center-points of two circles and their corresponding radii, therefore the target signal $\tilde{z}(t)$ is in one of the (maximum of two) crossing points between the two circles. The mathematical CLE representation model (assuming IQ-imbalance is being continuously compensated as discussed above) is as follows:

$$\tilde{y}_i(t) = G_L e^{(j\theta)} x_i(t) \quad \text{Eqn. 1E:}$$

$$\tilde{y}_q(t) = -j\, G_L e^{(j\theta)} x_q(t) \quad \text{Eqn. 2E:}$$

$$\tilde{y}_n(t) = \tilde{y}_i(t) - \tilde{y}_q(t) = G_L e^{(j\theta)}[x_i(t) + jx_q(t)] \quad \text{Eqn. 3E:}$$

$$\tilde{y}_p(t) = \tilde{y}_i(t) + \tilde{y}_q(t) = G_L e^{(j\theta)}[x_i(t) - jx_q(t)] \quad \text{Eqn. 4E:}$$

$$f_p(t) = G_L|\tilde{x}(t)| \quad \text{Eqn. 5E:}$$

$$f_n(t) = G_L|\tilde{x}(t)| \quad \text{Eqn. 6E:}$$

$$f^2_{\Delta p}(t) = f_p^2(t) + |\tilde{z}(t)|^2 - \tilde{y}_p(t)\tilde{z}^*(t) - \tilde{y}_p^*(t)\tilde{z}(t) \quad \text{Eqn. 7E:}$$

$$f^2_{\Delta n}(t) = f_n^2(t) + |\tilde{z}(t)|^2 - \tilde{y}_n(t)\tilde{z}^*(t) - \tilde{y}_n^*(t)\tilde{z}(t) \quad \text{Eqn. 8E:}$$

Assuming time-alignment (of digitized signals), the transmitter output reference reconstruction algorithm may be executed based on the transmitter design architecture described above with reference to FIG. 18 (e.g., by the DSP block 1710), using the following equations:

$$f^2_{\Delta p} - f_p^2(t) = |\tilde{z}(t)|^2 - 2G_L[x_i(t)z_i(t)x_q(t)z_q(t)]\cos(\theta) \quad \text{Eqn. 9E:}$$

$$f^2_{\Delta n} - f_n^2(t) = |\tilde{z}(t)|^2 - 2G_L[x_i(t)z_i(t) + x_q(t)z_q(t)]\cos(\theta) \quad \text{Eqn. 10E:}$$

Referencing the above model and equations 1E-10E, aspects include DSP block 1710 executing an example algorithm to find the number and position of the line crossings as follows:

1. Predict the up-converted branches:

$$\hat{\tilde{y}}_n(t) = \hat{G}_L[xi(t) + jxq(t)] = fn(t)\exp(+j\arg(\tilde{x}(t))) \quad (1A)$$

$$\hat{\tilde{y}}_p(t) = \hat{G}_L[xi(t) - jxq(t)] = fp(t)\exp(-j\arg(\tilde{x}(t))) \quad (1B)$$

2. Define the distance between the two circles:

$$D(t) \triangleq |\tilde{y}n(t) - \tilde{y}p(t)|, \text{ where:}$$

$$|f_n(t) - f_p(t)| \leq D(t) \leq f_n(t) + f_p(t)$$

If $(t) >_n(t) + f_p(t)$, then the circles don't cross. This cannot happen as both $f_p(t)$ and $f_n(t)$ measure distances to the same point in the complex plane (i.e., there is at least one crossing). If (t)<|f$_n$(t)+f(t)|, then the circles are concentric. This cannot happen as the center of the circles associated with ỹ$_n$(t) and ỹ$_p$(t) are always distinct.

If (t)=0 and f$_n$(t)=f$_p$(t), then both the circles are the same. This cannot happen as the center of the circles associated with ỹ$_n$(t) and ỹ$_p$(t) are always distinct.

3. Decompose distance D(t) into the bases (b$_n$ and b$_p$) of two right-triangles with the same height (h) constrained by:

$$D(t) \equiv b_n(t) + b_p(t) \quad (3A)$$

$$b_n(t)^2 + h(t)^2 = f^2_{\Delta n}(t) \quad (3B)$$

$$b_p(t)^2 + h(t)^2 = f^2_{\Delta p}(t) \quad (3C)$$

Extract the bases of the two right triangles:

$$b_n(t) = \frac{f^2_{\Delta n}(t) - f^2_{\Delta p}(t) + D(t)^2}{2D(t)} \quad (3D)$$

$$b_p(t) = D(t) - b_n(t) \quad (3E)$$

Extract the height of both right triangles according to the following logic flow:

If $b_n(t)=f_{\Delta n}(t)$ and $b_p(t)=f_{\Delta p}(t)$, then h(t)=0; circles intersect once. (3F)

Otherwise, then $h(t)^2 = f_{\Delta n}^2(t) - b_n(t)^2$; circles interest twice. (3G)

4. The algorithm continues by generating the estimates of the transmitter output signal accordingly by utilizing $\hat{ỹ}_n$(t) as a reference to generate the transmitter output. However, aspects also include modifying the example algorithm to alternatively utilize $\hat{ỹ}_p$(t) as a reference.

Define a reference point: $r(t)=ỹ_n+b_n(t)[ỹ_n(t)-ỹ_p(t)]/D(t)$ (4A)

(4B) If circles intersect once (a single value for h(t)), then:

$$\hat{z}_i(t) = \text{Re}\{r(t)\} + \frac{h(t)[\text{Im}\{\hat{ỹ}_p(t)\} - \text{Im}\{\hat{ỹ}_n(t)\}]}{D(t)}$$

$$\hat{z}_q(t) = \text{Im}\{r(t)\} + \frac{h(t)[\text{Re}\{\hat{ỹ}_p(t)\} - \text{Re}\{\hat{ỹ}_n(t)\}]}{D(t)}$$

If circles intersect twice (positive and negative values for h(t)), then: (4C)

$$\hat{z}_i(t) = \text{Re}\{r(t)\} \pm \frac{\sqrt{h(t)^2}\,[\text{Im}\{\hat{ỹ}_p(t)\} - \text{Im}\{\hat{ỹ}_n(t)\}]}{D(t)}$$

$$\hat{z}_q(t) = \text{Im}\{r(t)\} \pm \frac{\sqrt{h(t)^2}\,[\text{Re}\{\hat{ỹ}_p(t)\} - \text{Re}\{\hat{ỹ}_n(t)\}]}{D(t)}$$

5. For the case of two circle intersections, there are four potential results for transmitter output signal estimate ($\hat{z}_i$(t) and $\hat{z}_q$(t)). To select one of these options as the final estimate, aspects include testing each candidate against the following criteria such that the candidate with the smallest error is chosen as the "correct" estimate:

$$f^2_{\Delta p}(t) - f_P^2(t) - |\tilde{z}(t)|^2 + 2G_L[x_i(t)z_i(t) + x_q(t)z_q]\cos(\theta) = 0 \quad (5A)$$

$$f^2_{\Delta n}(t) - f_n^2(t) - |\tilde{z}(t)|^2 + 2G_L[x_i(t)z_i(t) + x_q(t)z_q(t)]\cos(\theta) = 0 \quad (5B)$$

In this way, the transmitter designs 1700, 1800 may achieve joint and simultaneously online closed-loop pre-compensation of transmitter I/Q imbalances and nonlinearities, as well as online reconstruction of the transmitter output CLE representation. Moreover, such implementations facilitate continuous tracking/compensation of non-idealities on the field (e.g., while the transmitter front-end is being used by the communications link), making the transmitter design robust to on-the-field variations.

Furthermore, the simultaneous online closed-loop aspects described with reference to FIGS. 17 and 18 may be particularly well-suited to applications in which a transmitter output reference is continuously required (e.g. for self-interference cancellation), which requires a solution to simultaneously address I/Q imbalances, amplifier stage non-linearities, and transmitter output reconstruction.

The aspects described herein with reference to FIGS. 17-18 may also be implemented, for instance, in an offline manner to perform, for example, off-line identification and calibration based on pre-defined training stimuli (e.g. during power-up sequences or communications link idle times).

EXAMPLES

The following examples pertain to further aspects.

Example 1 is a transmitter for compensating for I/Q imbalance, comprising: an I branch and a Q branch configured to provide an in-phase signal component and a quadrature signal component, respectively; an I/Q combiner configured to combine the in-phase signal component and the quadrature signal component to provide an I/Q signal; a first, second, and third envelope detector configured to generate an I-branch envelope feedback signal, a Q-branch envelope feedback signal, and an I/Q envelope feedback signal based upon the in-phase signal component, the quadrature signal component, and the I/Q signal, respectively; and a pre-compensator configured to compensate for I/Q imbalance between the I branch and the Q branch using the I-branch envelope feedback signal, the Q-branch envelope feedback signal, and the I/Q envelope feedback signal.

In Example 2, the subject matter of Example 1, wherein the I/Q imbalance includes one or more of phase imbalance, gain imbalance, and common gain.

In Example 3, the subject matter of one or more of Examples 1 and 2, further comprising: a baseband processor configured to generate digital baseband real (I) component samples and digital baseband imaginary (Q) component samples, the I and Q digital baseband component samples being provided to the I branch and the Q branch, respectively, wherein the pre-compensator is coupled to the baseband processor, the I branch, and the Q branch, the pre-compensator being configured to compensate for the I/Q imbalance by pre-distorting the I and Q digital baseband component samples, respectively, to minimize the I/Q imbalance.

In Example 4, the subject matter of one or more of Examples 1-3, further comprising: one or more processors configured to periodically accumulate one or more estimated measurements of the I/Q imbalance in a memory conditioned upon a stability of measured I/Q imbalance, and to selectively provide the accumulated estimated measurements to the pre-compensator, and wherein the pre-compensator is further configured to calculate the pre-distortion of the I and Q digital baseband component samples based upon the accumulated estimated measurements.

In Example 5, the subject matter of one or more of Examples 1-4, wherein the one or more processors are configured to periodically accumulate the estimated measurements of the I/Q imbalances further conditioned upon a residual I/Q imbalance between the I branch and the Q branch being greater than a threshold value.

In Example 6, the subject matter of one or more of Examples 1-5, wherein the one or more processors are configured to continuously tune the pre-compensator in accordance with an optimization function that indirectly measures an amount of residual I/Q imbalance utilizing the I-branch envelope feedback signal, the Q-branch envelope feedback signal, and the combined I/Q envelope feedback signal.

Example 7 is a transmitter, comprising: an I branch and a Q branch configured to provide an in-phase signal component and a quadrature signal component, respectively, wherein an output signal transmitted by the transmitter is based upon a combination of the in-phase signal component and the quadrature signal component; one or more amplification stages configured to generate a transmitter output signal from the combination of the in-phase signal component and the quadrature signal component, the one or more amplification stages having one or more nonlinear memory distortions; a first envelope detector configured to generate an I-branch envelope feedback signal based upon a difference between the in-phase signal component and a probed transmitter output signal; a second envelope detector configured to generate a Q-branch envelope feedback signal based upon a difference between the quadrature signal component and the probed transmitter output signal; a third envelope detector configured to generate a transmitter output envelope feedback signal based upon the probed transmitter output signal; and one or more processors configured to generate an estimated complex lowpass equivalent (CLE) representation of the transmitted output signal based upon the I-branch envelope feedback signal, the Q-branch envelope feedback signal, and the transmitter output envelope feedback signal, and to utilize the CLE representation of the transmitted output signal as a reference signal to perform one or more of online identification, online calibration, and online self-interference cancellation.

In Example 8, the subject matter of Example 7, further comprising: a linearization pre-compensator configured to compensate for the nonlinear memory distortions based upon the I-branch envelope feedback signal, the Q-branch envelope feedback signal, and the transmitter output envelope feedback signal.

In Example 9, the subject matter of one or more of Examples 7 and 8, further comprising: a baseband processor configured to generate digital baseband real (I) component samples and digital baseband imaginary (Q) component samples, the I and Q digital baseband component samples being provided to the I branch and the Q branch, respectively, wherein the linearization pre-compensator is coupled to the baseband processor, the I branch, and the Q branch, the linearization pre-compensator being configured to pre-distort the I and Q digital baseband component samples to compensate for the nonlinear memory distortions within one or more amplification stages of the transmitter.

In Example 10, the subject matter of one or more of Examples 7-9, wherein the linearization pre-compensator is further configured to repeatedly pre-distort the I and Q digital baseband component samples based upon digital pre-distortion (DPD) parameters, and wherein the one or more processors are configured to utilize the pre-distorted I and Q digital baseband component samples and the CLE representation of the transmitted output signal as feedback to repeatedly generate the DPD parameters in a closed-loop manner.

In Example 11, the subject matter of one or more of Examples 7-10, wherein the linearization pre-compensator is further configured to repeatedly pre-distort the I and Q digital baseband component samples based upon digital pre-distortion (DPD) parameters, and wherein the one or more processors are configured to utilize the pre-distorted I and Q digital baseband component samples, the I-branch envelope feedback signal, the Q-branch envelope feedback signal, and the transmitter output envelope feedback signal to repeatedly generate the DPD parameters in a closed-loop manner.

In Example 12, the subject matter of one or more of Examples 7-11, wherein the one or more processors are configured to tune the linearization pre-compensator in accordance with an optimization function that indirectly measures an amount of nonlinear memory distortions within the one or more amplifier stages of the transmitter utilizing the I-branch envelope feedback signal, the Q-branch envelope feedback signal, and the transmitter output envelope feedback signal.

Example 13 is a transmitter, comprising: an I branch and a Q branch configured to provide an in-phase signal component and a quadrature signal component, respectively, the I branch and the Q branch having one or more I/Q imbalances; a first I/Q combiner configured to combine the quadrature signal component and the in-phase signal component to provide a first I/Q signal; a second I/Q combiner configured to combine the quadrature signal component and the in-phase signal component to provide a second I/Q signal; one or more amplification stages configured to generate a transmitted output signal based upon the first I/Q signal, the one or more amplification stages having one or more nonlinear memory distortions; a first set of envelope detectors configured to generate one or more first envelope feedback signals based upon the first and the second I/Q signal; a second set of envelope detectors configured to generate one or more second envelope feedback signals based upon a probed transmitted output signal; and one or more processors configured to calculate an estimated complex lowpass equivalent (CLE) representation of the transmitted output signal based upon at least one of (i) the one or more first envelope feedback signals, and (ii) the one or more second envelope feedback signals.

In Example 14, the subject matter of Example 13, wherein the I/Q imbalances include one or more of phase imbalance, gain imbalance, and common gain.

In Example 15, the subject matter of one or more of Examples 13 and 14, wherein the one or more processors are configured to simultaneously compensate for the I/Q imbalance and the nonlinear memory distortions utilizing the one or more first envelope feedback signals and the one or more second envelope feedback signals.

In Example 16, the subject matter of one or more of Examples 13-15, wherein the one or more first envelope feedback signals include a first I/Q-branch envelope feedback signal and a second I/Q-branch envelope feedback signal, and wherein the first set of envelope detectors includes (i) a first envelope detector configured to generate the first I/Q-branch envelope feedback signal based upon the first I/Q signal, and (ii) a second envelope detector configured to generate the second I/Q-branch envelope feedback signal based upon the second I/Q signal.

In Example 17, the subject matter of one or more of Examples 13-16, further comprising: a baseband processor configured to generate digital baseband real (I) component samples and digital baseband imaginary (Q) component samples, the I and Q digital baseband component samples being provided to the I branch and the Q branch, respectively, and wherein the one or more processors include a pre-compensator coupled to the baseband processor, the I branch, and the Q branch, the pre-compensator being configured to compensate for the I/Q imbalance by pre-distorting the I and Q digital baseband component samples using the one or more first envelope feedback signals.

In Example 18, the subject matter of one or more of Examples 13-17, wherein the one or more second envelope feedback signals include (i) an I-branch envelope feedback signal that is based upon a difference between the in-phase signal component and the probed transmitted output signal, (ii) a Q-branch envelope feedback signal that is based upon a difference between the quadrature signal component and the probed transmitted output signal, and (iii) a transmitter output envelope feedback signal that is based the probed transmitted output signal.

In Example 19, the subject matter of one or more of Examples 13-18, wherein the one or more processors are configured to calculate the estimated CLE representation of the transmitted output signal based upon the I-branch envelope feedback signal, the Q-branch envelope feedback signal, and the transmitter output envelope feedback signal.

In Example 20, the subject matter of one or more of Examples 13-19, further comprising: a baseband processor configured to generate digital baseband real (I) component samples and digital baseband imaginary (Q) component samples, the I and Q digital baseband component samples being provided to the I branch and the Q branch, respectively, and wherein the one or more processors include a linearization pre-compensator coupled to the baseband processor, the I branch, and the Q branch, the linearization pre-compensator being configured to pre-distort the I and Q digital baseband component samples to compensate for the nonlinear memory distortions based upon at least one of (i) the one or more first envelope feedback signals, and (ii) the one or more second envelope feedback signals.

In Example 21, the subject matter of one or more of Examples 13-20, wherein the one or more second envelope feedback signals include (i) a first envelope feedback signal that is based upon a difference between the first I/Q signal and the probed transmitted output signal, and (ii) a second envelope feedback signal that is based upon a difference between the second I/Q signal and the probed transmitted output signal.

In Example 22, the subject matter of one or more of Examples 13-21, further comprising: a baseband processor configured to generate digital baseband real (I) component samples and digital baseband imaginary (Q) component samples, the I and Q digital baseband component samples being provided to the I branch and the Q branch, respectively, wherein the one or more processors are configured to calculate the estimated CLE representation of the transmitted output signal based upon the first envelope feedback signal and the second envelope feedback signal.

In Example 23, the subject matter of one or more of Examples 13-22, wherein the one or more processors are configured to utilize the CLE representation of the transmitted output signal as a reference signal to perform one or more of online identification, online calibration, and online self-interference cancellation.

Example 24 is a transmitter configured to operate in a first mode and second mode, the transmitter comprising: an I branch and a Q branch configured to provide an in-phase signal component and a quadrature signal component, respectively, the I branch and the Q branch having one or more I/Q imbalances; one or more amplification stages configured to generate a transmitted output signal based upon an I/Q signal that is a combination of the in-phase signal component and the quadrature signal component, the one or more amplification stages having one or more nonlinear memory distortions; a first envelope detector branch configured to generate an I-branch envelope feedback signal that is based upon (i) the in-phase signal component in the first mode, or (ii) a difference between the in-phase signal component and a probed transmitted output signal in the second mode; a second envelope detector branch configured to generate a Q-branch envelope feedback signal that is based upon (i) the quadrature signal component in the first mode, or (ii) a difference between the quadrature signal component and a probed transmitted output signal in the second mode; a third envelope detector branch configured to generate an output envelope feedback signal that is based upon (i) the I/Q signal in the first mode, or (ii) the probed transmitted output signal in the second mode; and one or more processors configured to calculate, in the second mode, an estimated complex lowpass equivalent (CLE) representation of the transmitted output signal based upon the I-branch envelope feedback signal, the Q-branch envelope feedback signal, and the output envelope feedback signal.

In Example 25, the subject matter of Example 24, wherein the I/Q imbalances include one or more of phase imbalance, gain imbalance, and common gain.

In Example 26, the subject matter of one or more of Examples 24 and 25, further comprising: a baseband processor configured to generate digital baseband real (I) component samples and digital baseband imaginary (Q) component samples, the I and Q digital baseband component samples being provided to the I branch and the Q branch, respectively, and wherein the one or more processors include a pre-compensator coupled to the baseband processor, the I branch, and the Q branch, the pre-compensator being configured to compensate for the I/Q imbalance in the first mode by pre-distorting the I and Q digital baseband component samples to minimize the I/Q imbalance.

In Example 27, the subject matter of one or more of Examples 24-26, wherein the one or more processors are configured to, in the first mode, periodically accumulate one or more estimated measurements of the I/Q imbalances in a memory conditioned upon a stability of measured I/Q imbalances, and to selectively provide the accumulated estimated measurements to the pre-compensator, and wherein the pre-compensator is further configured to calculate, in the first mode, the pre-distortion of the I and Q digital baseband component samples based upon the accumulated estimated measurements.

In Example 28, the subject matter of one or more of Examples 24-27, wherein the one or more processors are configured to, in the first mode, periodically accumulate the estimated measurements of the I/Q imbalance further conditioned upon a residual I/Q imbalance between the I branch and the Q branch being greater than a threshold value.

In Example 29, the subject matter of one or more of Examples 24-28, wherein the one or more processors are configured to, in the first mode, continuously tune the pre-compensator in accordance with an optimization function that indirectly measures an amount of residual I/Q imbalance utilizing the I-branch envelope feedback signal, the Q-branch envelope feedback signal, and the output envelope feedback signal.

In Example 30, the subject matter of one or more of Examples 24-29, wherein the one or more processors are configured to selectively compensate for, using the I-branch envelope feedback signal, the Q-branch envelope feedback signal, and the output envelope feedback signal, (i) the I/Q imbalance in the first mode and (ii) the nonlinear memory distortions in the second mode.

In Example 31, the subject matter of one or more of Examples 24-30, wherein the one or more processors are configured to utilize the CLE representation of the transmitted output signal as a reference signal to perform one or more of online identification, online calibration, and online self-interference cancellation.

In Example 32, the subject matter of one or more of Examples 24-31, further comprising: a baseband processor configured to generate digital baseband real (I) component samples and digital baseband imaginary (Q) component samples, the I and Q digital baseband component samples being provided to the I branch and the Q branch, respectively, wherein the one or more processors include a linearization pre-compensator coupled to the baseband processor, the I branch, and the Q branch, the linearization pre-compensator being configured to, in the second mode, pre-distort the I and Q digital baseband component samples to compensate for the nonlinear memory distortions.

In Example 33, the subject matter of one or more of Examples 24-32, wherein the linearization pre-compensator is further configured to, in the second mode, repeatedly pre-distort the I and Q digital baseband component samples based upon digital pre-distortion (DPD) parameters, and wherein the one or more processors are further configured to utilize the pre-distorted I and Q digital baseband component samples and the CLE representation of the transmitted output signal as feedback to repeatedly generate the DPD parameters in a closed-loop manner.

In Example 34, the subject matter of one or more of Examples 24-33, wherein the linearization pre-compensator is further configured to, in the second mode, repeatedly pre-distort the I and Q digital baseband component samples based upon digital pre-distortion (DPD) parameters, and wherein the one or more processors are further configured to, in the second mode, utilize the pre-distorted I and Q digital baseband component samples, the I-branch envelope feedback signal, the Q-branch envelope feedback signal, and the output envelope feedback signal to repeatedly generate the DPD parameters in a closed-loop manner.

In Example 35, the subject matter of one or more of Examples 24-34, wherein the one or more processors are configured to, in the second mode, tune the linearization pre-compensator in accordance with an optimization function that indirectly measures an amount of nonlinear memory distortions within the one or more amplifier stages of the transmitter utilizing the I-branch envelope feedback signal, the Q-branch envelope feedback signal, and the output envelope feedback signal.

Example 36 is a transmitter for compensating for I/Q imbalance, comprising: an I branch and a Q branch configured to provide an in-phase signal component and a quadrature signal component, respectively; a first I/Q combiner configured to combine the quadrature signal component and the in-phase signal component to provide a first I/Q signal; a second I/Q combiner configured to combine the quadrature signal component and the in-phase signal component to provide a second I/Q signal; a first envelope detector configured to generate a first I/Q-branch envelope feedback signal based upon the first I/Q signal; a second envelope detector configured to generate a second I/Q-branch envelope feedback signal based upon the second I/Q signal; and a pre-compensator configured to compensate for I/Q imbalance between the I branch and the Q branch using the first I/Q-branch envelope feedback signal and the second I/Q-branch envelope feedback signal.

In Example 37, the subject matter of Example 36, wherein the first I/Q combiner is configured to provide the first I/Q signal by subtracting the quadrature signal component from the in-phase signal component.

In Example 38, the subject matter of one or more of Examples 36 and 37, wherein the second I/Q combiner is configured to provide the second I/Q signal by adding the quadrature signal component to the in-phase signal component.

In Example 39, the subject matter of one or more of Examples 36-38, wherein the I/Q imbalance includes one or more of phase imbalance, gain imbalance, and common gain.

In Example 40, the subject matter of one or more of Examples 36-39, further comprising: a baseband processor configured to generate digital baseband real (I) component samples and digital baseband imaginary (Q) component samples, the I and Q digital baseband component samples being provided to the I branch and the Q branch, respectively, and wherein the pre-compensator is coupled to the baseband processor, the I branch, and the Q branch, the pre-compensator being configured to compensate for the I/Q imbalance by pre-distorting the I and Q digital baseband component samples, respectively, to minimize the I/Q imbalance.

In Example 41, the subject matter of one or more of Examples 36-40, further comprising: one or more processors configured to periodically accumulate one or more estimated measurements of the I/Q imbalance in a memory conditioned upon a stability of measured I/Q imbalance, and to selectively provide the accumulated estimated measurements to the pre-compensator, and wherein the pre-compensator is further configured to calculate the pre-distortion of the I and Q digital baseband component samples based upon the accumulated estimated measurements.

In Example 42, the subject matter of one or more of Examples 36-41, wherein the one or more processors are configured to periodically accumulate the estimated measurements of the I/Q imbalances further conditioned upon a residual I/Q imbalance between the I branch and the Q branch being greater than a threshold value.

In Example 43, the subject matter of one or more of Examples 36-42, wherein the one or more processors are configured to continuously tune the pre-compensator in accordance with an optimization function that indirectly measures an amount of residual I/Q imbalance utilizing the first I/Q-branch envelope feedback signal and the second I/Q-branch envelope feedback signal.

Example 44 is a transmitting means for compensating for I/Q imbalance, comprising: an I branch means and a Q branch means for providing an in-phase signal component and a quadrature signal component, respectively; an I/Q combiner means for combining the in-phase signal component and the quadrature signal component to provide an I/Q signal; a first, second, and third envelope detector means configured to generate an I-branch envelope feedback signal, a Q-branch envelope feedback signal, and an I/Q envelope feedback signal based upon the in-phase signal component, the quadrature signal component, and the I/Q signal, respectively; and a pre-compensator means for compensating for I/Q imbalance between the I branch and the Q branch using the I-branch envelope feedback signal, the Q-branch envelope feedback signal, and the I/Q envelope feedback signal.

In Example 45, the subject matter of Example 44, wherein the I/Q imbalance includes one or more of phase imbalance, gain imbalance, and common gain.

In Example 46, the subject matter of one or more of Examples 44 and 45, further comprising: a baseband processor means for generating digital baseband real (I) component samples and digital baseband imaginary (Q) component samples, the I and Q digital baseband component samples being provided to the I branch and the Q branch means, respectively, wherein the pre-compensator is coupled to the baseband processor means, the I branch means, and the Q branch means, the pre-compensator means compensating for the I/Q imbalance by pre-distorting the I and Q digital baseband component samples, respectively, to minimize the I/Q imbalance.

In Example 47, the subject matter of one or more of Examples 44-46, further comprising: one or more processor means for periodically accumulating one or more estimated measurements of the I/Q imbalance in a memory conditioned upon a stability of measured I/Q imbalance, and to selectively provide the accumulated estimated measurements to the pre-compensator means, and wherein the pre-compensator means is further configured to calculate the pre-distortion of the I and Q digital baseband component samples based upon the accumulated estimated measurements.

In Example 48, the subject matter of one or more of Examples 44-47, wherein the one or more processor means periodically accumulate the estimated measurements of the I/Q imbalances further conditioned upon a residual I/Q imbalance between the I branch means and the Q branch means being greater than a threshold value.

In Example 49, the subject matter of one or more of Examples 44-48, wherein the one or more processor means continuously tune the pre-compensator means in accordance with an optimization function that indirectly measures an amount of residual I/Q imbalance utilizing the I-branch envelope feedback signal, the Q-branch envelope feedback signal, and the combined I/Q envelope feedback signal.

Example 50 is a transmitter means, comprising: an I branch means and a Q branch means for providing an in-phase signal component and a quadrature signal component, respectively, wherein an output signal transmitted by the transmitter means is based upon a combination of the in-phase signal component and the quadrature signal component; one or more amplification stage means for generating a transmitter output signal from the combination of the in-phase signal component and the quadrature signal component, the one or more amplification stage means having one or more nonlinear memory distortions; a first envelope detector means for generating an I-branch envelope feedback signal based upon a difference between the in-phase signal component and a probed transmitter output signal; a second envelope detector means for generating a Q-branch envelope feedback signal based upon a difference between the quadrature signal component and the probed transmitter output signal; a third envelope detector means for generating a transmitter output envelope feedback signal based upon the probed transmitter output signal; and one or more processor means for generating an estimated complex low-pass equivalent (CLE) representation of the transmitted output signal based upon the I-branch envelope feedback signal, the Q-branch envelope feedback signal, and the transmitter output envelope feedback signal, and to utilize the CLE representation of the transmitted output signal as a reference signal to perform one or more of online identification, online calibration, and online self-interference cancellation.

In Example 51, the subject matter of Example 50, further comprising: a linearization pre-compensator means for compensating for the nonlinear memory distortions based upon the I-branch envelope feedback signal, the Q-branch envelope feedback signal, and the transmitter output envelope feedback signal.

In Example 52, the subject matter of one or more of Examples 50 and 51, further comprising: a baseband processor means for generating digital baseband real (I) component samples and digital baseband imaginary (Q) component samples, the I and Q digital baseband component samples being provided to the I branch and the Q branch, respectively, wherein the linearization pre-compensator is coupled to the baseband processor, the I branch, and the Q branch, the linearization pre-compensator means pre-distorting the I and Q digital baseband component samples to compensate for the nonlinear memory distortions within one or more amplification stages of the transmitter.

In Example 53, the subject matter of one or more of Examples 50-52, wherein the linearization pre-compensator means repeatedly pre-distorts the I and Q digital baseband component samples based upon digital pre-distortion (DPD) parameters, and wherein the one or more processor means utilize the pre-distorted I and Q digital baseband component samples and the CLE representation of the transmitted output signal as feedback to repeatedly generate the DPD parameters in a closed-loop manner.

In Example 54, the subject matter of one or more of Examples 50-53, wherein the linearization pre-compensator means repeatedly pre-distorts the I and Q digital baseband component samples based upon digital pre-distortion (DPD) parameters, and wherein the one or more processor means utilize the pre-distorted I and Q digital baseband component samples, the I-branch envelope feedback signal, the Q-branch envelope feedback signal, and the transmitter output envelope feedback signal to repeatedly generate the DPD parameters in a closed-loop manner.

In Example 55, the subject matter of one or more of Examples 50-54, wherein the one or more processor means tune the linearization pre-compensator in accordance with an optimization function that indirectly measures an amount of nonlinear memory distortions within the one or more amplifier stages of the transmitter utilizing the I-branch envelope feedback signal, the Q-branch envelope feedback signal, and the transmitter output envelope feedback signal.

Example 56 is a transmitter means, comprising: an I branch means and a Q branch means configured to provide an in-phase signal component and a quadrature signal component, respectively, the I branch means and the Q branch means having one or more I/Q imbalances; a first I/Q combiner means for combining the quadrature signal component and the in-phase signal component to provide a first I/Q signal; a second I/Q combiner means for combining the quadrature signal component and the in-phase signal component to provide a second I/Q signal; one or more amplification stage means for generating a transmitted output signal based upon the first I/Q signal, the one or more amplification stage means having one or more nonlinear memory distortions; a first set of envelope detector means for generating one or more first envelope feedback signals based upon the first and the second I/Q signal; a second set of envelope detector means for generating one or more second envelope feedback signals based upon a probed transmitted output signal; and one or more processor means for calculating an estimated complex lowpass equivalent (CLE) representation of the transmitted output signal based upon at least one of (i) the one or more first envelope feedback signals, and (ii) the one or more second envelope feedback signals.

In Example 57, the subject matter of Example 56, wherein the I/Q imbalances include one or more of phase imbalance, gain imbalance, and common gain.

In Example 58, the subject matter of one or more of Examples 56 and 57, wherein the one or more processor means simultaneously compensate for the I/Q imbalance and the nonlinear memory distortions utilizing the one or more first envelope feedback signals and the one or more second envelope feedback signals.

In Example 59, the subject matter of one or more of Examples 56-58, wherein the one or more first envelope feedback signals include a first I/Q-branch envelope feedback signal and a second I/Q-branch envelope feedback signal, and wherein the first set of envelope detector means include (i) a first envelope detector configured to generate the first I/Q-branch envelope feedback signal based upon the first I/Q signal, and (ii) a second envelope detector configured to generate the second I/Q-branch envelope feedback signal based upon the second I/Q signal.

In Example 60, the subject matter of one or more of Examples 56-59, further comprising: a baseband processor means for generating digital baseband real (I) component samples and digital baseband imaginary (Q) component samples, the I and Q digital baseband component samples being provided to the I branch means and the Q branch means, respectively, and wherein the one or more processor means include a pre-compensator means coupled to the baseband processor, the I branch, and the Q branch, the pre-compensator means compensating for the I/Q imbalance by pre-distorting the I and Q digital baseband component samples using the one or more first envelope feedback signals.

In Example 61, the subject matter of one or more of Examples 56-60, wherein the one or more second envelope feedback signals include (i) an I-branch envelope feedback signal that is based upon a difference between the in-phase signal component and the probed transmitted output signal, (ii) a Q-branch envelope feedback signal that is based upon a difference between the quadrature signal component and the probed transmitted output signal, and (iii) a transmitter output envelope feedback signal that is based the probed transmitted output signal.

In Example 62, the subject matter of one or more of Examples 56-61, further comprising: a baseband processor means for generating digital baseband real (I) component samples and digital baseband imaginary (Q) component samples, the I and Q digital baseband component samples being provided to the I branch means and the Q branch means, respectively, wherein the one or more processors means calculate the estimated CLE representation of the transmitted output signal based upon the I-branch envelope feedback signal, the Q-branch envelope feedback signal, and the transmitter output envelope feedback signal.

In Example 63, the subject matter of one or more of Examples 56-62, wherein the one or more processor means include a linearization pre-compensator means coupled to the baseband processor, the I branch means, and the Q branch means, the linearization pre-compensator means pre-distorting the I and Q digital baseband component samples to compensate for the nonlinear memory distortions based upon at least one of (i) the one or more first envelope feedback signals, and (ii) the one or more second envelope feedback signals.

In Example 64, the subject matter of one or more of Examples 56-63, wherein the one or more second envelope feedback signals include (i) a first envelope feedback signal that is based upon a difference between the first I/Q signal and the probed transmitted output signal, and (ii) a second envelope feedback signal that is based upon a difference between the second I/Q signal and the probed transmitted output signal.

In Example 65, the subject matter of one or more of Examples 56-64, further comprising: a baseband processor means for generating digital baseband real (I) component samples and digital baseband imaginary (Q) component samples, the I and Q digital baseband component samples being provided to the I branch means and the Q branch means, respectively, wherein the one or more processor means are configured to calculate the estimated CLE representation of the transmitted output signal based upon the first envelope feedback signal and the second envelope feedback signal.

In Example 66, the subject matter of one or more of Examples 56-65, wherein the one or more processor means utilize the CLE representation of the transmitted output signal as a reference signal to perform one or more of online identification, online calibration, and online self-interference cancellation.

Example 67 is a transmitter means for operating in a first mode and second mode, the transmitter means comprising: an I branch means and a Q branch means for providing an in-phase signal component and a quadrature signal component, respectively, the I branch means and the Q branch means having one or more I/Q imbalances; one or more amplification stage means for generating a transmitted output signal based upon an I/Q signal that is a combination of the in-phase signal component and the quadrature signal component, the one or more amplification stages having one or more nonlinear memory distortions; a first envelope detector branch means for generating an I-branch envelope feedback signal that is based upon (i) the in-phase signal component in the first mode, or (ii) a difference between the in-phase signal component and a probed transmitted output signal in the second mode; a second envelope detector branch means for generating a Q-branch envelope feedback signal that is based upon (i) the quadrature signal component in the first mode, or (ii) a difference between the quadrature signal component and a probed transmitted output signal in the second mode; a third envelope detector branch means for generating an output envelope feedback signal that is based upon (i) the I/Q signal in the first mode, or (ii) the probed transmitted output signal in the second mode; and one or more processors configured to calculate, in the second mode, an estimated complex lowpass equivalent (CLE) representation of the transmitted output signal based upon the I-branch envelope feedback signal, the Q-branch envelope feedback signal, and the output envelope feedback signal.

In Example 68, the subject matter of Example 67, wherein the I/Q imbalances include one or more of phase imbalance, gain imbalance, and common gain.

In Example 69, the subject matter of one or more of Examples 67 and 68, further comprising: a baseband processor means for generating digital baseband real (I) component samples and digital baseband imaginary (Q) component samples, the I and Q digital baseband component samples being provided to the I branch means and the Q branch means, respectively, and wherein the one or more processor means include a pre-compensator means coupled to the baseband processor means, the I branch means, and the Q branch means, the pre-compensator means compensating for the I/Q imbalance in the first mode by pre-distorting the I and Q digital baseband component samples to minimize the I/Q imbalance.

In Example 70, the subject matter of one or more of Examples 67-69, wherein the one or more processor means, in the first mode, periodically accumulate one or more estimated measurements of the I/Q imbalances in a memory conditioned upon a stability of measured I/Q imbalances, and selectively provide the accumulated estimated measurements to the pre-compensator, and wherein the pre-compensator means calculates, in the first mode, the pre-distortion of the I and Q digital baseband component samples based upon the accumulated estimated measurements.

In Example 71, the subject matter of one or more of Examples 67-70, wherein the one or more processor means, in the first mode, periodically accumulate the estimated measurements of the I/Q imbalance further conditioned upon a residual I/Q imbalance between the I branch and the Q branch being greater than a threshold value.

In Example 72, the subject matter of one or more of Examples 67-71, wherein the one or more processor means, in the first mode, continuously tune the pre-compensator in accordance with an optimization function that indirectly measures an amount of residual I/Q imbalance utilizing the I-branch envelope feedback signal, the Q-branch envelope feedback signal, and the output envelope feedback signal.

In Example 73, the subject matter of one or more of Examples 67-72, wherein the one or more processor means selectively compensate for, using the I-branch envelope feedback signal, the Q-branch envelope feedback signal, and the output envelope feedback signal, (i) the I/Q imbalance in the first mode, and (ii) the nonlinear memory distortions in the second mode.

In Example 74, the subject matter of one or more of Examples 67-73, wherein the one or more processor means utilize the CLE representation of the transmitted output signal as a reference signal to perform one or more of online identification, online calibration, and online self-interference cancellation.

In Example 75, the subject matter of one or more of Examples 67-74, further comprising: a baseband processor means for generating digital baseband real (I) component samples and digital baseband imaginary (Q) component samples, the I and Q digital baseband component samples being provided to the I branch means and the Q branch means, respectively, wherein the one or more processor means include a linearization pre-compensator means coupled to the baseband processor means, the I branch means, and the Q branch means, the linearization pre-compensator means, in the second mode, pre-distorting the I and Q digital baseband component samples to compensate for the nonlinear memory distortions.

In Example 76, the subject matter of one or more of Examples 67-75, wherein the linearization pre-compensator means, in the second mode, repeatedly pre-distorts the I and Q digital baseband component samples based upon digital pre-distortion (DPD) parameters, and wherein the one or more processor means utilize the pre-distorted I and Q digital baseband component samples and the CLE representation of the transmitted output signal as feedback to repeatedly generate the DPD parameters in a closed-loop manner.

In Example 77, the subject matter of one or more of Examples 67-76, wherein the linearization pre-compensator means, in the second mode, repeatedly pre-distorts the I and Q digital baseband component samples based upon digital pre-distortion (DPD) parameters, and wherein the one or more processor means, in the second mode, utilize the pre-distorted I and Q digital baseband component samples, the I-branch envelope feedback signal, the Q-branch envelope feedback signal, and the output envelope feedback signal to repeatedly generate the DPD parameters in a closed-loop manner.

In Example 78, the subject matter of one or more of Examples 67-77, wherein the one or more processor means, in the second mode, tune the linearization pre-compensator in accordance with an optimization function that indirectly measures an amount of nonlinear memory distortions within the one or more amplifier stages of the transmitter utilizing the I-branch envelope feedback signal, the Q-branch envelope feedback signal, and the output envelope feedback signal.

Example 79 is a transmitter means for compensating for I/Q imbalance, comprising: an I branch means and a Q branch means configured to provide an in-phase signal component and a quadrature signal component, respectively; a first I/Q combiner means for combining the quadrature signal component and the in-phase signal component to provide a first I/Q signal; a second I/Q combiner means for combining the quadrature signal component and the in-phase signal component to provide a second I/Q signal; a first envelope detector means for generating a first I/Q-branch envelope feedback signal based upon the first I/Q signal; a second envelope detector means for generating a second I/Q-branch envelope feedback signal based upon the second I/Q signal; and a pre-compensator means for compensating for I/Q imbalance between the I branch means and the Q branch means using the first I/Q-branch envelope feedback signal and the second I/Q-branch envelope feedback signal.

In Example 80, the subject matter of Example 79, wherein the first I/Q combiner means provides the first I/Q signal by subtracting the quadrature signal component from the in-phase signal component.

In Example 81, the subject matter of one or more of Examples 79 and 80, wherein the second I/Q combiner means provides the second I/Q signal by adding the quadrature signal component to the in-phase signal component.

In Example 82, the subject matter of one or more of Examples 79-81, wherein the I/Q imbalance includes one or more of phase imbalance, gain imbalance, and common gain.

In Example 83, the subject matter of one or more of Examples 79-82, further comprising: a baseband processor means for generating digital baseband real (I) component samples and digital baseband imaginary (Q) component samples, the I and Q digital baseband component samples being provided to the I branch means and the Q branch means, respectively, and wherein the pre-compensator means is coupled to the baseband processor means, the I branch means, and the Q branch means, the pre-compensator means compensating for the I/Q imbalance by pre-distorting the I and Q digital baseband component samples, respectively, to minimize the I/Q imbalance.

In Example 84, the subject matter of one or more of Examples 79-83, further comprising: one or more processor means for periodically accumulating one or more estimated measurements of the I/Q imbalance in a memory conditioned upon a stability of measured I/Q imbalance, and to selectively provide the accumulated estimated measurements to the pre-compensator means, and wherein the pre-compensator means calculates the pre-distortion of the I and Q digital baseband component samples based upon the accumulated estimated measurements.

In Example 85, the subject matter of one or more of Examples 79-84, wherein the one or more processor means periodically accumulate the estimated measurements of the I/Q imbalances further conditioned upon a residual I/Q imbalance between the I branch and the Q branch being greater than a threshold value.

In Example 86, the subject matter of one or more of Examples 79-85, wherein the one or more processor means continuously tune the pre-compensator means in accordance with an optimization function that indirectly measures an amount of residual I/Q imbalance utilizing the first I/Q-branch envelope feedback signal and the second I/Q-branch envelope feedback signal.

An apparatus as shown and described
A method as shown and described.

CONCLUSION

The various transmitter design aspects as described herein describe the use of envelope feedback signals to identify and compensate for certain transmitter non-idealities, such as I/Q imbalances and transmitter nonlinearities, for example. Furthermore, the transmitter design aspects as described herein also generate a CLE representation of the transmitted output signal, which may be used as a reference signal to perform one or more of online identification, online calibration, and online self-interference cancellation. Although the performance of each of these tasks may be discussed herein for ease of explanation, aspects include any of the transmitter design aspects described herein performing any one of these tasks (when appropriate) independent of the others. For example, in some aspects a transmitter design as discussed herein may calculate a CLE representation of the transmitted output signal without necessarily compensating for transmitter non-idealities. Such aspects may be particularly relevant, for example, when the nonlinearities are not severe (e.g., within regulatory limitations), but a CLE representation of the transmitted output signal is still desired for other purposes (e.g., the use of a reference signal for self-interference cancellation).

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

As will be apparent to a person of ordinary skill in the art based on the teachings herein, exemplary aspects are not limited to the 802.11 protocols (e.g., Wi-Fi and WiGig), and can be applied to other wireless protocols, including (but not limited to) Bluetooth, Near-field Communication (NFC) (ISO/IEC 18092), ZigBee (IEEE 802.15.4), Radio-frequency identification (RFID), and/or other wireless protocols as would be understood by one of ordinary skill in the relevant arts. Further, exemplary aspects are not limited to the above wireless protocols and can be used or implemented in one or more wired networks using one or more well-known wired specifications and/or protocols.

What is claimed is:

1. A transmitter for compensating for in-phase/quadrature-phase (I/Q) imbalance, comprising:
    an I branch and a Q branch configured to provide an in-phase signal component and a quadrature signal component, respectively;
    an I/Q combiner configured to combine the in-phase signal component and the quadrature signal component to provide an I/Q signal;
    a first, second, and third envelope detector configured to generate an I-branch envelope feedback signal, a Q-branch envelope feedback signal, and an I/Q envelope feedback signal based upon the in-phase signal component, the quadrature signal component, and the I/Q signal, respectively; and
    a pre-compensator configured to compensate for I/Q imbalance between the I branch and the Q branch using the I-branch envelope feedback signal, the Q-branch envelope feedback signal, and the I/Q envelope feedback signal.

2. The transmitter of claim 1, wherein the I/Q imbalance includes one or more of phase imbalance, gain imbalance, and common gain.

3. The transmitter of claim 1, further comprising:
    a baseband processor configured to generate digital baseband real (I) component samples and digital baseband imaginary (Q) component samples, the I and Q digital baseband component samples being provided to the I branch and the Q branch, respectively,
    wherein the pre-compensator is coupled to the baseband processor, the I branch, and the Q branch, the pre-compensator being configured to compensate for the I/Q imbalance by pre-distorting the I and Q digital baseband component samples, respectively, to minimize the I/Q imbalance.

4. The transmitter of claim 3, further comprising:
    one or more processors configured to periodically accumulate one or more estimated measurements of the I/Q imbalance in a memory conditioned upon a stability of measured I/Q imbalance, and to selectively provide the accumulated estimated measurements to the pre-compensator, and
    wherein the pre-compensator is further configured to calculate the pre-distortion of the I and Q digital baseband component samples based upon the accumulated estimated measurements.

5. The transmitter of claim 4, wherein the one or more processors are configured to periodically accumulate the estimated measurements of the I/Q imbalances further conditioned upon a residual I/Q imbalance between the I branch and the Q branch being greater than a threshold value.

6. The transmitter of claim 3, wherein the one or more processors are configured to continuously tune the pre-compensator in accordance with an optimization function that indirectly measures an amount of residual I/Q imbalance utilizing the I-branch envelope feedback signal, the Q-branch envelope feedback signal, and the combined I/Q envelope feedback signal.

7. A transmitter, comprising:
    an in-phase (I) branch and a quadrature-phase (Q) branch configured to provide an in-phase signal component and a quadrature signal component, respectively, wherein an output signal transmitted by the transmitter is based upon a combination of the in-phase signal component and the quadrature signal component;
    one or more amplifier stages configured to generate a transmitter output signal from the combination of the in-phase signal component and the quadrature signal component, the one or more amplifier stages having one or more nonlinear memory distortions;
    a first envelope detector configured to generate an I-branch envelope feedback signal based upon a difference between the in-phase signal component and a probed transmitter output signal;
    a second envelope detector configured to generate a Q-branch envelope feedback signal based upon a difference between the quadrature signal component and the probed transmitter output signal;
    a third envelope detector configured to generate a transmitter output envelope feedback signal based upon the probed transmitter output signal; and
    one or more processors configured to generate an estimated complex lowpass equivalent (CLE) representation of the transmitted output signal based upon the I-branch envelope feedback signal, the Q-branch envelope feedback signal, and the transmitter output envelope feedback signal, and to utilize the CLE representation of the transmitted output signal as a reference signal to perform one or more of online identification, online calibration, and online self-interference cancellation.

8. The transmitter of claim 7, further comprising:
    a linearization pre-compensator configured to compensate for the nonlinear memory distortions based upon the I-branch envelope feedback signal, the Q-branch envelope feedback signal, and the transmitter output envelope feedback signal.

9. The transmitter of claim 8, further comprising:
    a baseband processor configured to generate digital baseband real (I) component samples and digital baseband imaginary (Q) component samples, the I and Q digital baseband component samples being provided to the I branch and the Q branch, respectively,
    wherein the linearization pre-compensator is coupled to the baseband processor, the I branch, and the Q branch, the linearization pre-compensator being configured to pre-distort the I and Q digital baseband component samples to compensate for the nonlinear memory distortions within one or more amplifier stages of the transmitter.

10. The transmitter of claim 9, wherein the linearization pre-compensator is further configured to repeatedly pre-distort the I and Q digital baseband component samples based upon digital pre-distortion (DPD) parameters, and
    wherein the one or more processors are configured to utilize the pre-distorted I and Q digital baseband component samples and the CLE representation of the transmitted output signal as feedback to repeatedly generate the DPD parameters in a closed-loop manner.

11. The transmitter of claim 9, wherein the linearization pre-compensator is further configured to repeatedly pre-distort the I and Q digital baseband component samples based upon digital pre-distortion (DPD) parameters, and
    wherein the one or more processors are configured to utilize the pre-distorted I and Q digital baseband component samples, the I-branch envelope feedback signal, the Q-branch envelope feedback signal, and the transmitter output envelope feedback signal to repeatedly generate the DPD parameters in a closed-loop manner.

12. The transmitter of claim 8, wherein the one or more processors are configured to tune the linearization pre-compensator in accordance with an optimization function that indirectly measures an amount of nonlinear memory distortions within the one or more amplifier stages of the transmitter utilizing the I-branch envelope feedback signal, the Q-branch envelope feedback signal, and the transmitter output envelope feedback signal.

13. A transmitter, comprising:
an in-phase (I) branch and a quadrature-phase (Q) branch configured to provide an in-phase signal component and a quadrature signal component, respectively, the I branch and the Q branch having one or more I/Q imbalances;
a first I/Q combiner configured to combine the quadrature signal component and the in-phase signal component to provide a first I/Q signal;
a second I/Q combiner configured to combine the quadrature signal component and the in-phase signal component to provide a second I/Q signal;
one or more amplifier stages configured to generate a transmitted output signal based upon the first I/Q signal, the one or more amplifier stages having one or more nonlinear memory distortions;
a first set of envelope detectors configured to generate one or more first envelope feedback signals based upon the first and the second I/Q signal;
a second set of envelope detectors configured to generate one or more second envelope feedback signals based upon a probed transmitted output signal; and
one or more processors configured to calculate an estimated complex lowpass equivalent (CLE) representation of the transmitted output signal based upon at least one of (i) the one or more first envelope feedback signals, and (ii) the one or more second envelope feedback signals,
wherein the one or more processors are configured to utilize the CLE representation of the transmitted output signal as a reference signal to perform one or more of online identification, online calibration, and online self-interference cancellation.

14. The transmitter of claim 13, wherein the I/Q imbalances include one or more of phase imbalance, gain imbalance, and common gain.

15. The transmitter of claim 13, wherein the one or more processors are configured to simultaneously compensate for the I/Q imbalance and the nonlinear memory distortions utilizing the one or more first envelope feedback signals and the one or more second envelope feedback signals.

16. The transmitter of claim 13, wherein the one or more first envelope feedback signals include a first I/Q-branch envelope feedback signal and a second I/Q-branch envelope feedback signal, and
wherein the first set of envelope detectors includes (i) a first envelope detector configured to generate the first I/Q-branch envelope feedback signal based upon the first I/Q signal, and (ii) a second envelope detector configured to generate the second I/Q-branch envelope feedback signal based upon the second I/Q signal.

17. The transmitter of claim 15, further comprising:
a baseband processor configured to generate digital baseband real (I) component samples and digital baseband imaginary (Q) component samples, the I and Q digital baseband component samples being provided to the I branch and the Q branch, respectively, and
wherein the one or more processors include a pre-compensator coupled to the baseband processor, the I branch, and the Q branch, the pre-compensator being configured to compensate for the I/Q imbalance by pre-distorting the I and Q digital baseband component samples using the one or more first envelope feedback signals.

18. The transmitter of claim 13, wherein the one or more second envelope feedback signals include (i) an I-branch envelope feedback signal that is based upon a difference between the in-phase signal component and the probed transmitted output signal, (ii) a Q-branch envelope feedback signal that is based upon a difference between the quadrature signal component and the probed transmitted output signal, and (iii) a transmitter output envelope feedback signal that is based the probed transmitted output signal.

19. The transmitter of claim 18, wherein the one or more processors are configured to calculate the estimated CLE representation of the transmitted output signal based upon the I-branch envelope feedback signal, the Q-branch envelope feedback signal, and the transmitter output envelope feedback signal.

20. The transmitter of claim 13, further comprising:
a baseband processor configured to generate digital baseband real (I) component samples and digital baseband imaginary (Q) component samples, the I and Q digital baseband component samples being provided to the I branch and the Q branch, respectively, and
wherein the one or more processors include a linearization pre-compensator coupled to the baseband processor, the I branch, and the Q branch, the linearization pre-compensator being configured to pre-distort the I and Q digital baseband component samples to compensate for the nonlinear memory distortions based upon at least one of (i) the one or more first envelope feedback signals, and (ii) the one or more second envelope feedback signals.

21. The transmitter of claim 13, wherein the one or more second envelope feedback signals include (i) a first envelope feedback signal that is based upon a difference between the first I/Q signal and the probed transmitted output signal, and (ii) a second envelope feedback signal that is based upon a difference between the second I/Q signal and the probed transmitted output signal.

22. The transmitter of claim 21, further comprising:
a baseband processor configured to generate digital baseband real (I) component samples and digital baseband imaginary (Q) component samples, the I and Q digital baseband component samples being provided to the I branch and the Q branch, respectively,
wherein the one or more processors are configured to calculate the estimated CLE representation of the transmitted output signal based upon the first envelope feedback signal and the second envelope feedback signal.

* * * * *